United States Patent [19]
Fujita et al.

[11] Patent Number: 6,131,178
[45] Date of Patent: Oct. 10, 2000

[54] ERROR CORRECTING DECODING APPARATUS OF EXTENDED REED-SOLOMON CODE, AND ERROR CORRECTING APPARATUS OF SINGLY OR DOUBLY EXTENDED REED-SOLOMON CODES

[75] Inventors: Hachiro Fujita; Takahiko Nakamura; Hideo Yoshida, all of Tokyo, Japan

[73] Assignee: Mitsubishi Denki Kabushiki Kaisha, Tokyo, Japan

[21] Appl. No.: 09/034,340

[22] Filed: Mar. 4, 1998

[30] Foreign Application Priority Data

| Apr. 15, 1997 | [JP] | Japan | 9-097798 |
| Aug. 5, 1997 | [JP] | Japan | 9-211069 |

[51] Int. Cl.$^7$ ................................................. H03M 13/00
[52] U.S. Cl. .................................. 714/784; 714/785
[58] Field of Search ................................ 714/752, 784, 714/785

[56] References Cited

U.S. PATENT DOCUMENTS

| 4,162,480 | 7/1979 | Berlekamp | 714/784 |
| 4,897,839 | 1/1990 | Yamagishi et al. | . |
| 4,937,829 | 6/1990 | Kadokawa | 714/757 |
| 5,233,629 | 8/1993 | Paik et al. | 375/362 |
| 5,297,153 | 3/1994 | Baggen et al. | 714/782 |
| 5,323,402 | 6/1994 | Vaccaro et al. | 714/782 |
| 5,517,509 | 5/1996 | Yoneda | 714/785 |
| 5,642,367 | 6/1997 | Kao | 714/784 |
| 5,712,861 | 1/1998 | Inoue et al. | 714/755 |
| 5,715,262 | 2/1998 | Gupta | 714/784 |
| 5,889,792 | 3/1999 | Zhang et al. | 714/784 |
| 5,905,740 | 5/1999 | Williamson | 714/784 |

FOREIGN PATENT DOCUMENTS

| 41 40018 A1 | 6/1993 | Germany . |
| 43 16813 A1 | 11/1994 | Germany . |
| 95 12850 A1 | 5/1995 | WIPO . |

OTHER PUBLICATIONS

R.E. Blahut, "Theory and Practice of Error Control Codes"; Addison–Wesley Publishing Company, Inc.; 1983; pp. 260–263.

Jensen, J.O., "On decoding doubly extended Reed–Solomon codes", Information Theory, 1995. Proceedings., 1995 IEEE International Symposium On, p. 280, Sep. 1995.

Joiner, L.L.; Komo, J.J., "Time Domain Decoding of Extended Reed–Solomon Codes", Southeastcon '96. Bringing Together Education, Science, and Technology, Proceedings of the IEEE, pp. 238–241, 1996.

*Primary Examiner*—Albert De Cady
*Assistant Examiner*—Guy Lamarre

[57] ABSTRACT

An error correcting decoding apparatus of an extended RS code capable of solving a problem of a conventional method in that Euclidean algorithm or Berlekamp-Massey algorithms must be performed twice in the worst case because of complicated algorithm, and this results in a delay of decoding. The present apparatus generates a syndrome from a received word, estimates the number of errors having occurred in the received word, computes error-locator polynomials and error-value polynomials while changing the initial values and ending condition of the Euclidean algorithm computation in accordance with the number of errors estimated, computes error locations and error values by performing Chien's search on these polynomials, and carries out the error correction on the basis of the error locations and error values. This makes it possible to achieve decoding by performing the Euclidean algorithm computation only once.

5 Claims, 29 Drawing Sheets

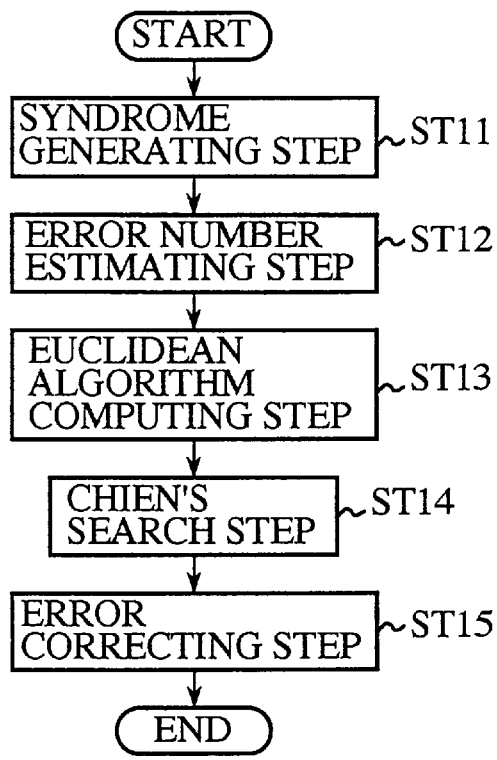
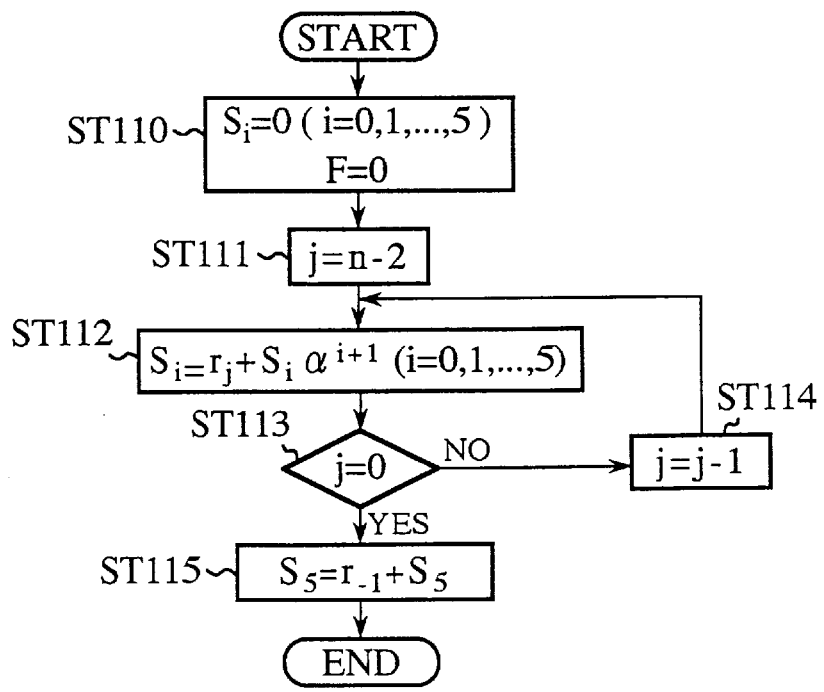

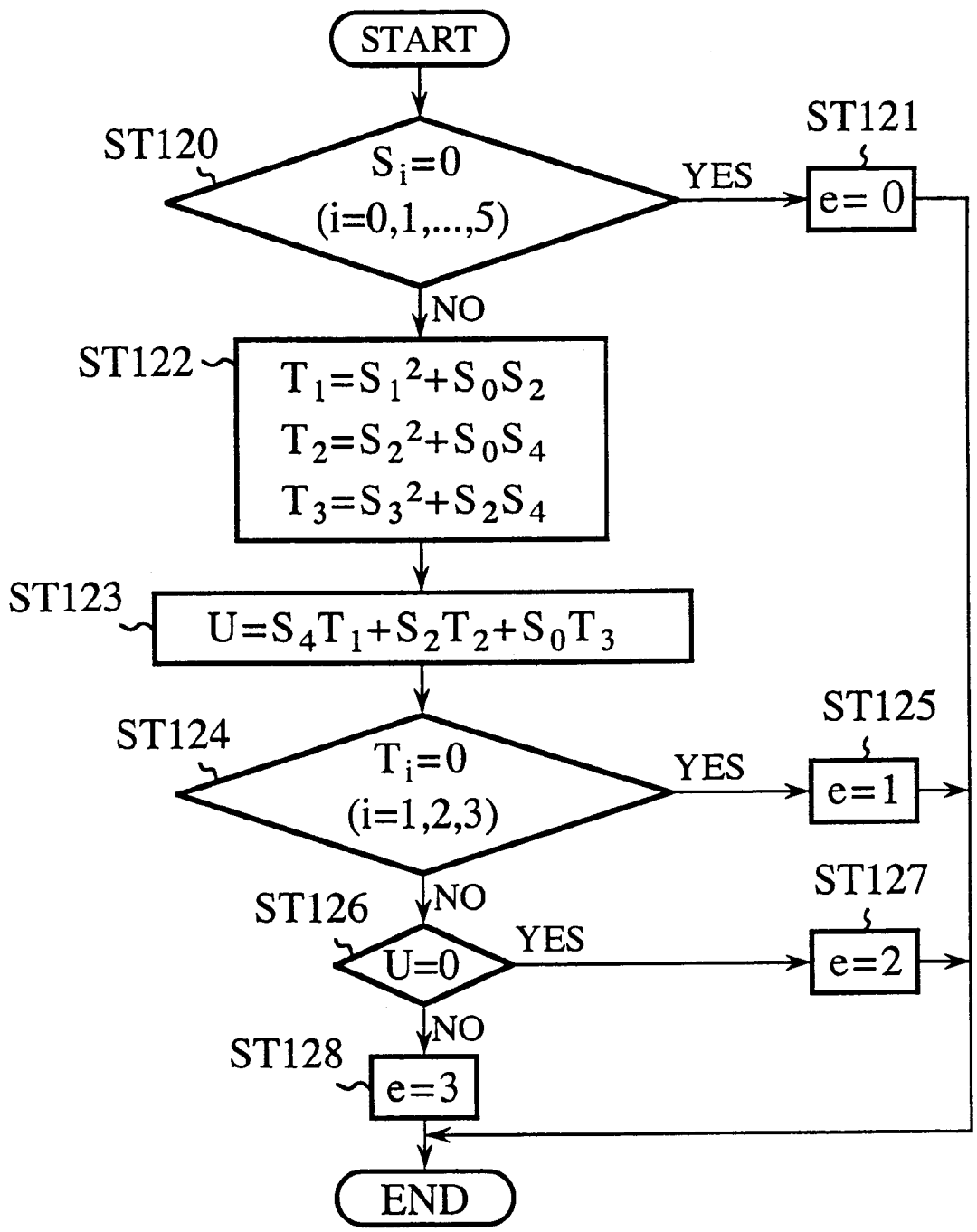

ERROR CORRECTING DECODING APPARATUS OF EXTENDED REED-SOLOMON CODE, AND ERROR CORRECTING APPARATUS OF SINGLY OR DOUBLY EXTENDED REED-SOLOMON CODES

BACKGROUND OF THE INVENTION

1. Field of the Invention

The present invention relates to an error correcting decoding apparatus for an extended Reed-Solomon code for decoding extended Reed-Solomon codes (abbreviated to extended RS codes from now on) which are used as a code capable of correcting errors occurring in digital radio communications and digital magnetic recording, and to an error correcting apparatus for a singly or doubly extended RS code for correcting errors occurring in the digital radio communications and digital recording.

2. Description of Related Art

First, the structure of a singly extended RS code will be described which is subjected to error correcting decoding in the present invention. For the purpose of simplicity, we assume that the characteristic of the Galois field is two.

A singly extended RS code with a code length of n and an information symbol number of k can be formed as follows. First, an information polynomial with the following expression (1) is formed for information symbols $(c_{n-2}, c_{n-3}, \ldots, c_{n-k-1})$ consisting of the elements of the Galois field.

$$c_{n-2}x^{n-2} + c_{n-3}x^{n-3} + \ldots + c_{n-k-1}x^{n-k-1} \quad (1)$$

Then, the information polynomial is divided by a generator polynomial given by the following expression (2).

$$g(x) = (x-\alpha^b)(x-\alpha^{b+1}) \ldots (x-\alpha^{b+n-k-2}) \quad (2)$$

where b is a predetermined integer, and a is a root of a primitive polynomial forming the Galois field.

Thus, when the remainder polynomial obtained by the division by the foregoing expression (2) is given by the following expression (3), $(c_{n-2}, C_{n-3}, \ldots, c_1, c_0)$ is generated by adding coefficient information of (n−k−1) symbols as check symbols.

$$c_{n-k-2}x^{n-k-2} + c_{n-k-3}x^{n-k-3} + \ldots + c_1x + c_0 \quad (3)$$

Furthermore, a code word $c = (c_{n-2}, c_{n-3}, \ldots, c_1, c_0, c_{-1})$ of a singly extended RS code is formed by adding as a final symbol a value $c_{-1}$ generated by the following equation (4).

$$c_{-1} = c_{n-2}\alpha^{(b+n-k-1)(n-2)} + c_{n-3}\alpha^{(b+n-k-1)(n-3)} + \ldots + c_1\alpha^{b+n-k-1} + c_0 \quad (4)$$

It is known that the thus formed extended RS code has a minimum distance of (n−k+1). Incidentally, the code before the extension $(c_{n-2}, C_{n-3}, \ldots, c_1, c_0)$ is called an interior code, and the symbol $c_{-1}$, attached to the final place is called an extended component.

Here, the code word $(c_{n-2}, c_{n-3}, \ldots, c_1, c_0, c_{-1})$ of the singly extended RS code formed by adding to the final position the value $c_{-1}$ generated by the foregoing expression (4) satisfies $H^tC = O$, where H is a parity matrix given by the following expression (5), and $^tC$ represents the transpose of C.

$$H = \begin{bmatrix} \alpha^{b(n-2)} & \alpha^{b(n-3)} & \ldots & \alpha^b & 1 & 0 \\ \alpha^{(b+1)(n-2)} & \alpha^{(b+1)(n-3)} & \ldots & \alpha^{b+1} & 1 & 0 \\ \ldots & \ldots & \ldots & \ldots & \ldots & \ldots \\ \alpha^{(b+n-k-2)(n-2)} & \alpha^{(b+n-k-2)(n-3)} & \ldots & \alpha^{b+n-k-2} & 1 & 0 \\ \alpha^{(b+n-k-1)(n-2)} & \alpha^{(b+n-k-1)(n-3)} & \ldots & \alpha^{b+n-k-1} & 1 & 1 \end{bmatrix} \quad (5)$$

It is known that the thus formed extended RS code has a minimum distance d=n−k+1. Considering that the interior code has the minimum distance n−k, it is increased by one. When the minimum distance n−k equals 2t, where t is a positive integer, the interior code can correct only (t−1) errors. The singly extended RS code, however, can correct t errors because its minimum distance is 2t+1. In addition, when the interior code has the minimum distance n−k=2t+1, the minimum distance of the singly extended RS code is 2t+2, which can correct t errors and detect (t+1) errors (in which case, the total of t+l errors, t errors occurring in the interior code and one error in the extended component, can be corrected). Thus, the singly extended RS code improves correcting and detecting capability with one additional check symbol added to the normal RS code.

FIG. 30 is a flowchart illustrating the processing procedure of a conventional error correcting method of the singly extended RS code with a code length of n, information symbol number of k, and minimum distance of d=n−k+1= 2t+1, where t is a positive integer. In FIG. 30, step ST60 is a syndrome generating step, ST61 is a Euclidean algorithm computing step, ST62 is a truth decision step, ST63 is a Euclidian algorithm computing step, ST64 is a truth decision step, ST65 is a Chien's search. step, and ST66 is an error correcting/detecting step.

Next, the operation will be described.

In the following description, it is assumed that $R = (r_{n-2}, r_{n-3}, \ldots, r_0, r_{-1})$ is received as a received word R. First, in the syndrome generating step ST60, the syndrome $S = (S_0, S_1, S_{2t-2}, S_{2t-1})$ is computed by the following expression (6)

$$S = H^tR \quad (6)$$

where H is a parity matrix given by the foregoing expression (5).

Next, in the Euclidean algorithm computing step ST61, error-locator polynomials $\sigma(x)$ and error value polynomials $\omega(x)$ are computed by the Euclidean algorithm using polynomials given by the following expressions (7) and (8) as initial values.

$$i\, R_{-1}(x) = x^{2t-1} \quad (7)$$

$$R_0(x) = S_0 + S_1 x + \ldots + S_{2t-2} x^{2t-2} \quad (8)$$

The ending condition of the Euclidean algorithm computing step ST61 is given by the following expression (9).

$$deg\, R_i(x) < t-1 \quad (9)$$

The computation of the error-locator polynomial and error-value polynomial in the Euclidean algorithm computing step ST61 is carried out in accordance with the procedure as shown in the flowchart of FIG. 31.

In the Euclidean algorithm computation, first, $B_{-1}(x)$ and $B_0(x)$ are set to zero and one, respectively, at step ST610, the initial values of $R_{-1}(x)$ and $R_0(x)$ are set as shown by the foregoing expressions (7) and (8), respectively, at step ST611, and the initial value of a variable i is set at one at step ST612. Next, quotient polynomial $Q_i(x)$ is obtained by dividing $R_{i-2}(x)$ by $R_{i-1}(x)$ at step ST613, and $R_i(x)$ and $B_i(x)$ are computed by the following equations (10) and (11) using the quotient polynomial $Q_i(x)$ at step ST614.

$$R_i(x)=Q_i(x)R_{i-1}(x)+R_{i-2}(x) \tag{10}$$

$$B_i(x)=Q_i(x)B_{i-1}(x)+B_{i-2}(x) \tag{11}$$

Subsequently, a decision is made whether the degree of the $R_i(x)$ thus obtained satisfies the ending condition or not at step ST615. If the ending condition is not satisfied, the variable i is incremented at step ST616, and the processings from step ST613 onward are iterated. On the other hand, if the ending condition is satisfied, the error-locator polynomial $\sigma(x)$ and error-value polynomial $\omega(x)$ are computed by the following equations (12) and (13) at step ST617, thus completing the Euclidean algorithm computation.

$$\sigma(x)=B_i(x) \tag{12}$$

$$\omega(x)=R_i(x) \tag{13}$$

Subsequently, the candidates of the error-locator polynomial and error-value polynomial computed in Euclidean algorithm computing step ST61 are checked in the truth decision step ST62 whether they are true error-locator polynomial and error-value polynomial using the following expression (14).

$$deg\,\omega < deg\,\sigma \leq t-1 \tag{14}$$

If the condition is satisfied, the Chien's search is performed in Chien's search step ST65 on the error-locator polynomial $\sigma(x)$ and error-value polynomial $\omega(x)$ computed in the Euclidean algorithm computing step ST61 to obtain the error locations and error values. Subsequently, in the error correcting/detecting step ST66, the error correcting operation is carried out if the errors are decided as correctable, thus completing the series of the processings.

On the other hand, if it is found in the truth decision step ST62 that the condition is not satisfied, the error-locator polynomial $\sigma(x)$ and error-value polynomial $\omega(x)$ are computed by the Euclidean algorithm by repeating the processings of FIG. 31 again using the polynomials given by the following equations (15) and (16) as the initial values.

$$R_{-1}(x)=x^{2t} \tag{15}$$

$$R_0(x)=S_0+S_1x+\ldots+S_{2t-2}x^{2t-2}+S_{2t-1}x^{2t-1} \tag{16}$$

As the ending condition of the Euclidean algorithm computing step ST63, the following expression (17) is used.

$$deg\,R_i(x) < t \tag{17}$$

Subsequently, the candidates of the error-locator polynomial and error-value polynomial computed in the Euclidean algorithm computing step ST63 are checked in the truth decision step ST64 whether they are true error-locator polynomial and error-value polynomial using the following expression (18).

$$deg\,\omega < deg\,\sigma \tag{18}$$

If the condition is satisfied, the Chien's search is performed in Chien's search step ST65 on the error-locator polynomial $\sigma(x)$ and error-value polynomial $\omega(x)$ to obtain the error locations and error values. If the errors are correctable, the error correcting operation is carried out in the error correcting/detecting step ST66, thus completing the series of the processings. On the other hand, if it is found that the condition is unsatisfied as a result of the check in the truth decision step ST64, the processings in the error correcting/detecting step ST66 is stopped at the error detection, thus completing the series of the processings.

Next, a doubly extended RS code will be described. Here, for the purpose of simplicity, it is assumed that the characteristic of the Galois field is two.

A doubly extended RS code with a code length of n and an information symbol number of k can be formed as follows. First, an information polynomial with the following expression (19) is formed for information symbols ($c_{n-3}$, $c_{n-4}$, ..., $C_{n-k-2}$) consisting of the elements of the Galois field.

$$c_{n-3}x^{n-3}+c_{n-4}x^{n-4}+\ldots+c_{n-k-2}x^{n-k-2} \tag{19}$$

Then, the information polynomial is divided by a generator polynomial given by the following expression (20).

$$g(x)=(x-\alpha^b)(x-\alpha^{b+1})\ldots(x-\alpha^{n-k-2}) \tag{20}$$

where b is a predetermined integer, and a is a root of a primitive polynomial forming the Galois field.

When the remainder polynomial obtained by the division by the foregoing expression (20) is given by the following expression (21), ($c_{n-3}$, $c_{n-4}$, ..., $c_1$, $c_0$) is formed by adding coefficients of (n–k–2) symbols as check symbols.

$$c_{n-k-3}x^{n-k-3}+c_{n-k-4}x^{n-k-4}+\ldots+c_1x+c_0 \tag{21}$$

Furthermore, a code word $c=(c_{n-2}, c_{n-3}, \ldots, c_1, c_0, c_{-1})$ of a doubly extended RS code is formed by adding $c_{-1}$ and $c_{n-2}$ generated by the following equations (22) and (23).

$$c_{-1}=c_{n-3}+c_{n-4}+\ldots+c_1+c_0 \tag{22}$$

$$c_{n-2}=c_{n-3}\alpha^{(n-k-1)(n-3)}+c_{n-4}\alpha^{(n-k-1)(n-4)}+\ldots+c_1\alpha^{n-k-1}+c_0 \tag{23}$$

Here, the code word $(c_{n-2}, C_{n-3}, \ldots, c_1, c_0, c_{-1})$ of the doubly extended RS code formed by adding to the edge symbols the value $c_{-1}$ and $c_{n-2}$ generated by the foregoing expressions (22) and (23) satisfies $H_2{}^tC=0$, where $H_2$ is a parity matrix given by the following expression (24), and $^tC$ represents the transpose of C.

$$H_2 = \begin{bmatrix} 0 & 1 & 1 & \ldots & 1 & 1 & 1 \\ 0 & \alpha^{n-3} & \alpha^{n-2} & \ldots & \alpha & 1 & 0 \\ \ldots & \ldots & \ldots & \ldots & \ldots & \ldots & \ldots \\ 0 & \alpha^{(n-k-2)(n-3)} & \alpha^{(n-k-2)(n-2)} & \ldots & \alpha^{n-k-2} & 1 & 0 \\ 1 & \alpha^{(n-k-1)(n-3)} & \alpha^{(n-k-1)(n-2)} & \ldots & \alpha^{n-k-1} & 1 & 0 \end{bmatrix} \tag{24}$$

In this case also, the code before the extension ($c_{n-3}$, $c_{n-4}$, ..., $c_1$, $c_0$) is called an interior code, and the symbol $c_{-1}$ attached to the final position is called a first extended component, and the symbol $c_{n-2}$ added to the initial position is called a second extended component.

It is known that the thus formed doubly extended RS code has a minimum distance of d=n–k+1. Considering that the interior code has the minimum distance of n–k–1, it is increased by two. Accordingly, one more error can be corrected in addition to the correcting capability of the interior code.

As a conventional error correcting method of the doubly extended RS code, the algorithm is known which is described, for example, in chapter 9, verse 3 of R. E. Blahut, "Theory and Practice of Error Control Codes", Addison-Wesley Publishing Company, 1984. FIG. 32 is a flowchart illustrating the processing procedure of the conventional error correcting method of the doubly extended RS code with a code length of n, information symbol number of k, and minimum distance of d=n-k+1=2t+1, where t is a positive integer.

In FIG. 32, step ST70 is a syndrome generating step, ST71 is a Berlekamp-Massey algorithm computing step, ST72 is a test step of an error-locator polynomial, ST73 is a Berlekamp-Massey algorithm computing step, ST74 is a test step of an error-locator polynomial, ST75 is a Berlekamp-Massey algorithm computing step, ST76 is a test step of an error-locator polynomial, ST77 is a Berlekamp-Massey algorithm computing step, ST78 is a test step of an error-locator polynomial, ST79 is a Chien's search step, ST80 is a test step of the number of roots, and step ST81 is an error correcting step.

Next, the operation will be described.

In the following description, it is assumed that a received word $R=(r_{n-2}, r_{n-3}, \ldots, r_0, r_{-1})$ has been received. First, in the syndrome generating step ST70, the syndrome $S=(S_0, S_1, S_{2t-2}, S_{2t-1})$ is computed by the following expression (25).

$$S = H_2^t R \tag{25}$$

where the error information on the first extended component is included in $S_0$, and the error information on the second extended component is included in $S_{2t-1}$.

Next, in the Berlekamp-Massey algorithm computing step ST71, the Berlekamp-Massey algorithm (BM1) is carried out using 2t-2 syndromes $S_1, \ldots, S_{2t-2}$ including only error information occurred in the interior code. FIG. 33 is a flowchart illustrating the computation procedures of the Berlekamp-Massey algorithm for obtaining the error-locator polynomials.

The Berlekamp-Massey algorithm (BM1) will now be described with reference to FIG. 33.

First, the initial values are set at step ST710 as follows: the initial value of the error-locator polynomial, $\sigma^0(x)=1$; a formal shift register length L=0; a supplementary polynomial for updating the error-locator polynomial, $\tau^0(x)=1$; and a variable for counting the number of steps, r=1.

Let us assume that the error-locator polynomials are sequentially computed, and after having completed an (r-1)-th step, the error-locator polynomial $\sigma^{(r-1)}(x)$ and supplementary polynomial $\tau^{(r-1)}(x)$ are computed. At the r-th step, a discrepancy $\Delta_r$ given by the following expression (26) is computed using the coefficients of $\sigma^{(r-1)}(x)$ at step ST711.

$$\Delta r = \sum_{j=0}^{L} \sigma_j^{(r-1)} S_{r-j} \tag{26}$$

Next, the computation result is checked at step ST712, and if the discrepancy $\Delta_r$ is zero, the error-locator polynomial is not updated, but $\sigma^{(r-1)}(x)$ obtained at the (r-1)-th computation is adopted as the r-th error-locator polynomial at step ST713. On the other hand, if the discrepancy $\Delta_r$ is nonzero, connection polynomial $\eta(x)$ is formed by the following expression (27) using the supplementary polynomial $\tau^{(r-1)}(x)$ at step ST714.

$$\eta(x) \leftarrow \sigma^{(r-1)}(x) + \Delta_r x \tau^{(r-1)}(x) \tag{27}$$

Next, a decision is made whether formal shift register length L satisfies 2L<r at step ST715, and if it satisfies, the supplementary polynomial $\tau^{(r)}(x)$, the error-locator polynomial $\sigma^{(r)}(x)$, and the formal shift register length L are updated as the following expressions (28)–(30) at step ST716.

$$\tau^{(r)}(x) \leftarrow \Delta_r^{-1} \tau^{(r-1)}(x) \tag{28}$$

$$\sigma^{(r)}(x) \leftarrow \eta(x) \tag{29}$$

$$L \leftarrow r - L \tag{30}$$

On the other hand, if the inequality is unsatisfied, the formal shift register length L is not updated, but the error-locator polynomial $\sigma^{(r)}(x)$ is updated as the following expression (31) at step ST717, and the supplementary polynomial $\tau^{(r)}(x)$ is updated as the following expression (32) at step ST713.

$$\sigma^{(r)}(x) \leftarrow \eta(x) \tag{31}$$

$$\tau^{(r)}(x) \leftarrow x \tau^{(r-1)}(x) \tag{32}$$

Then, the processings from step ST711 onward are iterated with incrementing the variable r for counting the step number at step ST719 until it is found that the variable r reaches 2t-2 at step ST718.

When the Berlekamp-Massey algorithm (BM1) in the Berlekamp-Massey algorithm computing step ST71 has completed, the error-locator polynomial $\sigma(x)$ is tested whether it is appropriate or not in the test step ST72. Here, if at most t=2 errors have occurred in the interior code, the (2t-3)-th and (2t-2)-th discrepancy are zero, and after the Berlekamp-Massey algorithm (BM1) has been completed, the formal shift register length L is equal to or less than t-2, and the degree of the error-locator polynomial $\sigma^{(2t-2)}(x)$ equals the formal shift register length L. Thus, if the error-locator polynomial $\sigma^{(2t-2)}(x)$ satisfies the following conditions (33), the processing makes a decision that the error-locator-polynomial $\sigma^{(2t-2)}(x)$ is appropriate and proceeds to Chien's search step ST79 to perform the Chien's search after substituting $\sigma(x) = \sigma^{(2t-2)}(x)$.

$$\Delta_{2t-3}=0, \Delta_{2t-2}=0, \Delta L \leq t-2, d e g \sigma^{(2t-2)}=L \tag{33}$$

On the other hand, if the foregoing conditions (33) do not hold, it is assumed that at least t-1 errors have occurred in the interior code and one more step of Berlekamp-Massey algorithm (BM1') is carried out using $S_{2t-1}$ in Berlekamp-Massey algorithm computing step ST73. Then, in test step ST74, error-locator polynomial $\sigma(x)$ is tested whether it is appropriate or not. If t-1 errors have occurred in the interior code with no error occurring in the second extended component, the discrepancy $\Delta_{2t-1}$ becomes zero. In addition, the degree of the error-locator polynomial $\sigma^{(2t-1)}(x)(=\sigma^{(2t-2)}(x))$ equals the formal shift register length L. Thus, if the error-locator polynomial $\sigma^{(2t-1)}(x)$ satisfies the following conditions (34), the processing makes a decision that the error-locator polynomial $\sigma^{(2t-1)}(x)$ is appropriate and proceeds to Chien's search step ST79 to perform the Chien's search after substituting $\sigma(x) = \sigma^{(2t-1)}(x)$.

$$\Delta_{2t-1}=0, d e g \sigma^{(2t-1)}=L \tag{34}$$

On the other hand, if the conditions given by the foregoing expression (34) do not hold, it is assumed that at least t errors have occurred in the interior code and Berlekamp-Massey algorithm (BM2) is performed again using syndromes $S_0, S_1, \ldots, S_{2t-2}$, and $S_{2t-1}$ in the Berlekamp-Massey algorithm computing step ST75. The Berlekamp-Massey algorithm (BM2) is basically the same as the Berlekamp-Massey algorithm (BM1), but the computation of the discrepancy is carried out using the following equation (35).

$$\Delta r = \sum_{j=0}^{L} \sigma_j^{(r-1)} S_{r-j-1} \quad (35)$$

Then, in the test step ST74, error-locator polynomial σ(x) is tested whether it is appropriate or not. If t−1 errors have occurred in the interior code with no error occurring in the first extended component, the discrepancy $\Delta_{2t-1}$ becomes zero. In addition, the degree of the error-locator polynomial $\sigma^{(2t-1)}(x)$ (=$\sigma^{2t-2}(x)$)) equals the formal shift register length L after the completion of the Berlekamp-Massey algorithm (BM2). Thus, if the error-locator polynomial $\sigma^{(2t-1)}(x)$ satisfies the conditions of expression (34), the processing makes a decision that the error-locator polynomial $\sigma^{(2t-1)}(x)$ is appropriate and proceeds to the Chien's search step ST79 to perform the Chien's search after substituting $\sigma(x)=\sigma^{(2t-2)}(x)$.

On the other hand, if the conditions of expression (34) do not hold, it is assumed that at least t errors have occurred in the interior code, and one more step of Berlekamp-Massey algorithm (BM2') is carried out using $S_{2t-1}$ in Berlekamp-Massey algorithm computing step. ST77. If no errors have occurred in both the extended components, the degree of the error-locator polynomial $\sigma^{(2t)}(x)$ and the formal shift register length L are equal to t after the completion of the Berlekamp-Massey algorithm (BM2'). Thus, if the conditions of the following expression (36) hold, the processing makes a decision that the error-locator polynomial $\sigma^{(2t)}(x)$ is appropriate and proceeds to the Chien's search step ST79 to perform the Chien's search after substituting $\sigma(x)=\sigma^{(2t)}(x)$.

$$deg\ \sigma^{(2t)}=L=t \quad (36)$$

On the other hand, if the conditions of expression (36) do not hold, it is assumed that at least t+1 errors have occurred, and the received word R is output without correction along with the error detection flags, indicative of uncorrectable errors.

If the error-locator polynomial can be detected in any of the Berlekamp-Massey algorithm computing steps ST71, ST73, ST75 and ST77, the Chien's search is carried out in the Chien's search step ST79 to computed the roots (error locations) of the error-locator polynomial σ(x). Subsequently, in the test step ST80, a decision is made whether the number of the obtained roots of the error-locator polynomial σ(x) equals the degree of the error-locator polynomial σ(x), and if they agree with each other, the error values are computed in the error-correcting step ST81, and the errors are corrected by subtracting the error values from the symbols at the error locations of the received word R.

If the number of the obtained roots of the error-locator polynomial σ(x) does not agree with the degree of the error-locator polynomial σ(x), the received word R is output without correction along with the error detection flag, indicating that the errors are uncorrectable.

The conventional error correction of the singly extended RS code thus performed is complicated in algorithm, in which the Euclidean algorithm computation must be performed twice in the worst case. This presents a problem of prolonging the time needed for decoding. Furthermore, there are no known documents about the erasure and error correction of the singly extended RS code, which presents a problem in that it is necessary to develop an effective erasure and error correcting method and apparatus.

Besides, since the conventional error correction of the doubly extended RS code is thus performed, it is complicated in algorithm and requires two steps of the Berlekamp-Massey algorithm computations in the worst case. This presents a problem of prolonging the time needed for decoding. Furthermore, there are no known documents about the erasure and error correction of the doubly extended RS code, which presents a problem in that it is necessary to develop an effective erasure and error correcting method and apparatus.

SUMMARY OF THE INVENTION

The present invention is implemented to solve the foregoing problems. It is therefore an object of the present invention to provide an error correcting decoding apparatus capable of obtaining the error-locator polynomial and error-value polynomial by performing the Euclidean algorithm computation only once.

Another object of the present invention is to provide an error correcting decoding apparatus capable of computing an error value even if an error has occurred in the extended component or components.

Still another object of the present invention is to provide an error correcting decoding apparatus capable of reducing the number of steps required for the decoding.

An object of the present invention is to provide an error correcting decoding apparatus of a singly extended RS code capable of obtaining the error-locator polynomial and error-value polynomial by performing the Euclidean algorithm computation only once.

Another object of the present invention is to provide an error correcting decoding apparatus of a singly extended RS code capable of achieving effective correction of the erasure and error of the singly extended RS code.

An object of the present invention is to provide an error correcting decoding apparatus of a doubly extended RS code capable of obtaining the error-locator polynomial by performing the Berlekamp-Massey algorithm computation only once.

Another object of the present invention is to provide an error correcting decoding apparatus of a doubly extended RS code capable of achieving effective correction of the erasure and error of the doubly extended RS code.

Still another object of the present invention is to provide an error correcting decoding apparatus of a doubly extended RS code capable of obtaining the error-locator polynomial and error-value polynomial by performing the Euclidean algorithm computation only once.

According to a first aspect of the present invention, there is provided an error correcting decoding apparatus of an extended Reed-Solomon code comprising: syndrome generating means for computing from an incoming received word its syndrome; received word memory means for storing the received word; error number estimating means for estimating a number of errors having occurred in the received word from the syndrome computed by the syndrome generating means; Euclidean algorithm computing means for computing an error-locator polynomial and an error-value polynomial by Euclidean algorithm after setting initial values and an ending condition for computing the error-locator polynomial and the error-value polynomial in accordance with the number of errors estimated by the error number estimating means; Chien's search means for computing error locations and error values based on the error-locator polynomial and the error-value polynomial computed by the Euclidean algorithm computing means; and error correcting means for correcting errors of the received word stored in the received word memory means in response to a result computed by the Chien's search means.

Here, the error correcting decoding apparatus may comprise a computer including multipliers and adders on a Galois field, and wherein the Chien's search means may comprise syndrome amending means for computing an error value in an extended component by amending values of the syndrome of the received word in accordance with the error locations and error values computed from the error-locator polynomial and the error-value polynomial which are computed by the Euclidean algorithm computing means.

The error number estimating means may comprise a memory, multipliers and adders on a Galois field, and may make a decision, about an extended Reed-Solomon code with a minimum distance of d, from values of the syndrome of the received word, which is computed by the syndrome generating means, whether any error is present or not, and if any error is present, whether a number of the errors is less than $[(d-1)/2]$ or equal to $[(d-1)/2]$, and wherein the Euclidean algorithm computing means may compute the error-locator polynomial and the error-value polynomial by Euclidean algorithm after setting the initial values and the ending condition for computing the error-locator polynomial and the error-value polynomial depending on the number of errors whether it is less than $[(d-1)/2]$ or equal to $[(d-1)/2]$, when the error number estimating means makes a decision that the error is present.

The error number estimating means may make a decision, about an extended Reed-Solomon code with a minimum distance of d, from values of the syndrome of the received word, which is computed by the syndrome generating means, whether any error is presenter not, and if any error is present, whether a number of the errors is less than $[(d-1)/2]$, equal to $[(d-1)/2]$, or greater than $[(d-1l)/2]$, wherein the Euclidean algorithm computing means may skip, if the error number estimating means makes a decision that the number of errors is greater than $[(d-1)/2]$, the computing of the error-locator polynomial and the error-value polynomial by the Euclidean algorithm, wherein the Chien's search means may skip, if the error number estimating means makes a decision that the number of errors is greater than $[(d-1)/2]$, the computing of the error locations and error values the Chien's search, and wherein the error correcting means may output the received word stored in the received word memory means without correction, if the error number estimating means makes a decision that the number of errors is greater than $[(d-1)/2]$.

According to a second aspect of the present invention, there is provide an error correcting apparatus of a singly extended Reed-Solomon code comprising: syndrome generating means for computing from an incoming received word its syndromes; received word memory means for storing the received word; syndrome polynomial generating means for generating a syndrome polynomial including as its constant term a syndrome of the syndromes computed by the syndrome generating means, the syndrome having error information about an extended component; Euclidean algorithm computing means for computing an error-locator polynomial and an error-value polynomial by Euclidean algorithm using as its initial values the syndrome polynomial generated by the syndrome polynomial generating means; Chien's search means for computing error locations and error values based on the error-locator polynomial and the error-value polynomial computed by the Euclidean algorithm computing means; and error correcting means for correcting errors of the received word stored in the received word memory means in response to the error locations and error values computed by the Chien's search means.

Here, the error correcting apparatus of a singly extended Reed-Solomon code may further comprise: an erasure-locator coefficient generating means for generating erasure-locator coefficients from an erasure flag associated with the received word; an erasure-locator polynomial generating means for generating an erasure-locator polynomial from the erasure-locator coefficients generated by the erasure-locator coefficient generating means; and amended syndrome polynomial generating means for generating a modified syndrome polynomial by multiplying the syndrome polynomial generated by the syndrome polynomial generating means and the erasure-locator polynomial generated by the erasure polynomial generating means, wherein the Euclidean algorithm computing means may compute an error-erasure-locator polynomial and an error-erasure-value polynomial Euclidean algorithm using as its initial values the modified syndrome polynomial generated by the modified syndrome polynomial generating means as initial values, and the Chien's search means may compute error locations and error values based on the error-erasure-locator polynomial and the error-erasure-value polynomial computed by the Euclidean algorithm computing means.

According to a third aspect of the present invention, there is provided an error correcting apparatus of a doubly extended Reed-Solomon code comprising: syndrome generating means for computing from an incoming received word its syndromes; received word memory means for storing the received word; Berlekamp-Massey algorithm computing means for sequentially computing an error-locator polynomial by Th performing Berlekamp-Massey algorithm using the syndromes generated by the syndrome generating means while controlling whether to use a syndrome having error information about a doubly extended component in accordance with a length of a formal shift register; Chien's search means for computing error locations by performing Chien's search on the error-locator polynomial computed by the Berlekamp-Massey algorithm computing means; error value generating means for computing, if a number of error locations computed by the Chien's search means is appropriate, error values using the syndrome polynomial generated from the syndromes computed by the syndrome generating means; and error correcting means for correcting errors of the received word stored in the received word memory means in response to the error locations computed by the Chien's search means and the error values computed by the error value generating means.

Here, the error correcting apparatus of a doubly extended Reed-Solomon code may further comprise: an erasure-locator coefficient generating means for generating erasure-locator coefficients from an erasure flag associated with the received word; and an erasure-locator polynomial generating means for generating an erasure-locator polynomial from the erasure-locator coefficients generated by the erasure-locator coefficient generating means, wherein the Berlekamp-Massey algorithm computing means may sequentially compute the error-locator polynomial by performing Berlekamp-Massey algorithm using as its initial values the erasure-locator polynomial computed by the erasure-locator polynomial generating means.

BRIEF DESCRIPTION OF THE DRAWINGS

FIG. 1 is a flowchart illustrating a processing procedure of an embodiment 1 of an error correcting decoding method of an extended RS code in accordance with the present invention;

FIG. 2 is a flowchart illustrating details of a processing procedure of a syndrome generating step in the embodiment 1;

FIG. 3 is a flowchart illustrating details of a processing procedure of an error number estimating step in the embodiment 1;

DETAILED DESCRIPTION OF THE PREFERRED EMBODIMENTS

The invention will now be described with reference to the accompanying drawings.

EMBODIMENT 1

FIG. 1 is a flowchart illustrating a processing procedure of an embodiment 1 of an error correcting decoding method of an extended RS code in accordance with the present invention. In FIG. 1, ST11 designates a syndrome generating step of computing a syndrome from a received word, and ST12 designates an error number estimating step of estimating the number of errors which have occurred in the portion of the received word excluding its extended component. ST13 designates a Euclidean algorithm computing step of computing the error-locator polynomial and error-value polynomial by the Euclidean algorithm on the basis of the initial and ending conditions set in accordance with the number of errors estimated in error number estimating step ST12. ST14 designates a Chien's search step of computing error locations and error values by performing Chien's search on the error-locator polynomial and error-value polynomial obtained in the Euclidean algorithm computing step ST13, and ST15 designates an error correcting step of correcting the errors of the received word on the basis of the error locations and error values computed in the Chien's search step ST14.

Figure 4:
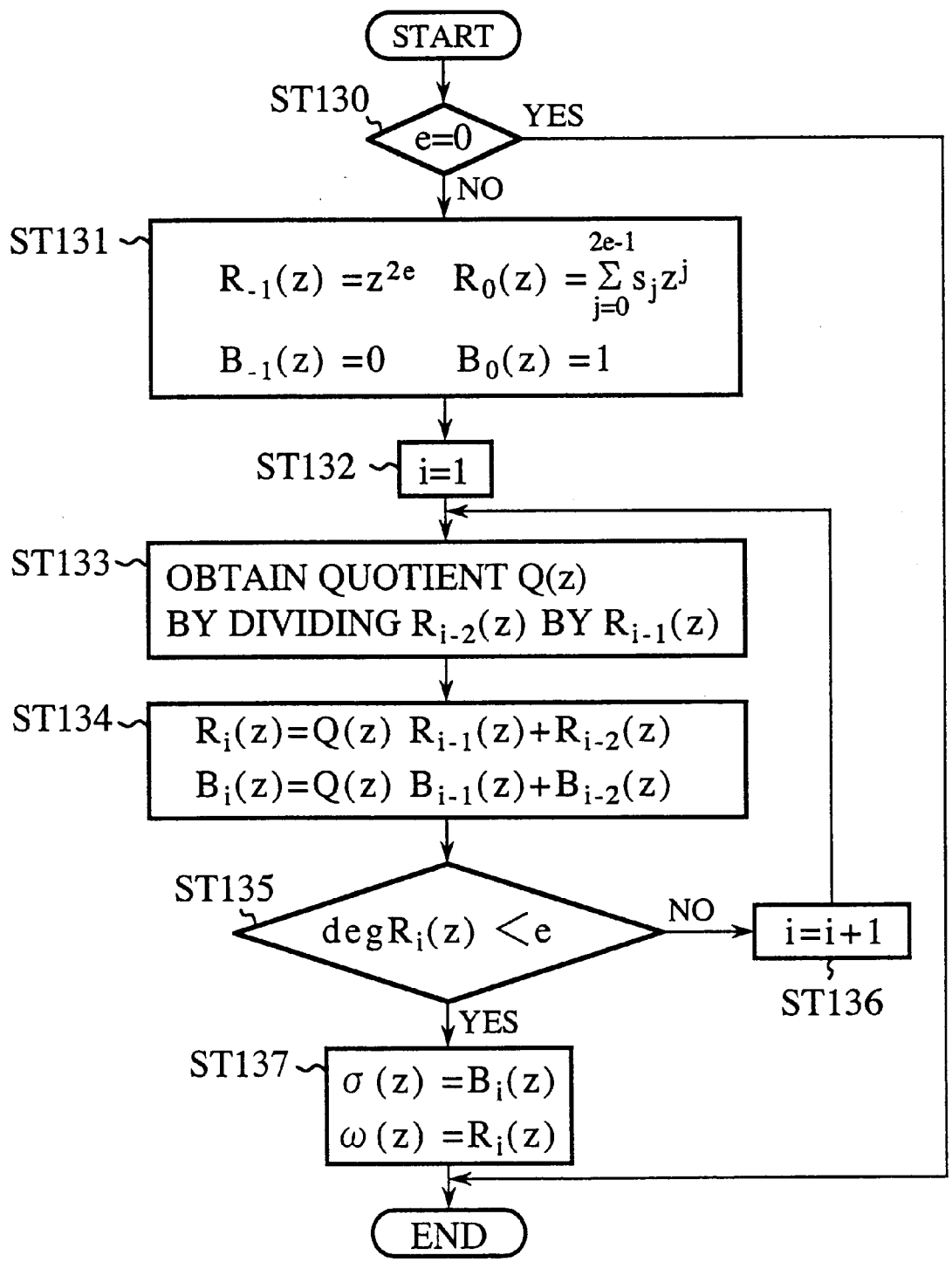
FIG. 4 is a flowchart illustrating details of a processing procedure of a Euclidean algorithm computing step in the embodiment 1.
Figure 5:
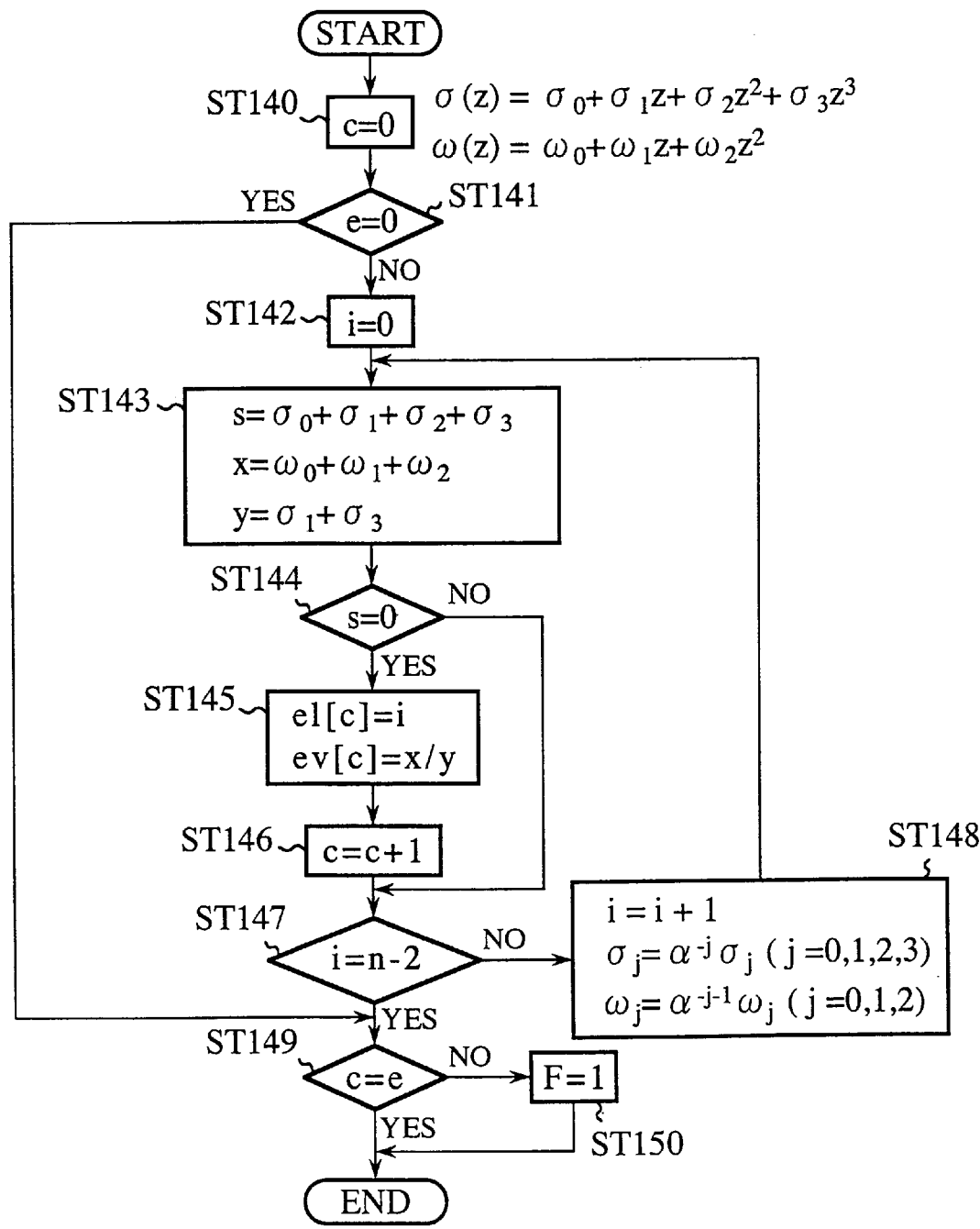
FIG. 5 is a flowchart illustrating details of a processing procedure of a Chien's search step in the embodiment 1.
Figure 6:
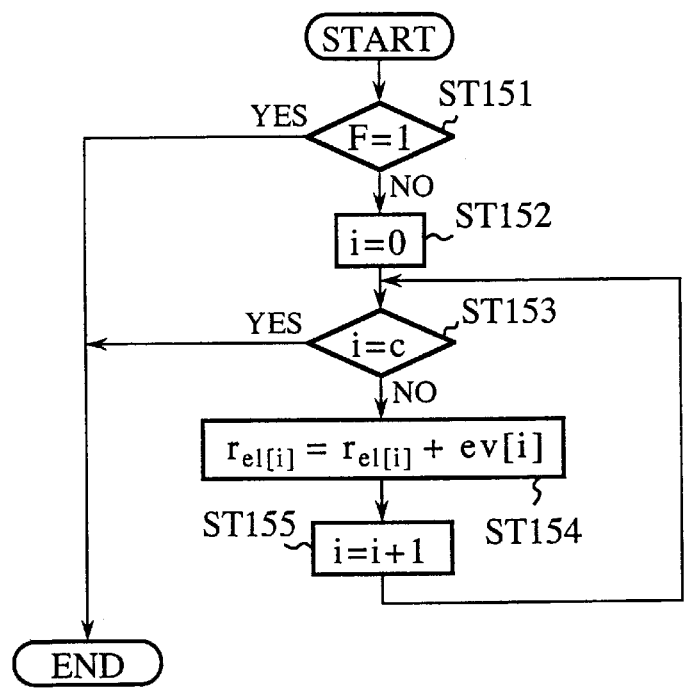
FIG. 6 is a flowchart illustrating details of a processing procedure of an error correcting step in the embodiment 1.

FIGS. 2–6 are flowcharts illustrating details of the processings of the foregoing steps: FIG. 2 illustrates a processing procedure of the syndrome generating step ST11; FIG. 3 illustrates a processing procedure of the error number estimating step ST12; FIG. 4 illustrates a processing procedure of the Euclidean algorithm computing step ST13; FIG. 5 illustrates a processing procedure of the Chien's search step ST14; and FIG. 6 illustrates a processing procedure of the error correcting step ST15.

Next, the operation will be described.

In the following description, it is assumed, in an extended RS code described before in connection with the conventional decoding operation of the extended RS code, that an extended RS code is handled which has a predetermined integer b=1 and a minimum length of seven, that is, a code with a check symbol number of six symbols. First, in the syndrome generating step ST11, the computation of the syndromes $S_i$, where i=0, 1, ... , 5, is carried out from the received word by the following equations (37) and (38).

$$S_i = \sum_{j=0}^{n-2} r_j \alpha^{(i+1)j} \quad (i = 0, 1, \ldots, 4) \quad (37)$$

$$S_s = r_{-1} + \sum_{j=0}^{n-2} r_j \alpha^{sj} \quad (38)$$

More specifically, as illustrated in FIG. 2, the syndromes $S_i$ (i=0, 1, ... , 5) are each initialized to zero at first, and a flag F is turned off (F=0) at step ST110. Then, a variable j is initialized to n−2 at step ST111, and $S_i$(i=0, 1, ... , 5) at that time are computed from the values of $S_i$ up to that time (using initial value 0 at first) by the following equation (39).

$$S_i = r_j + S_i \alpha^{i+1} \quad (39)$$

where a is a root of the primitive polynomial constituting the Galois field.

Subsequently, a decision is made whether the variable j becomes zero or not at step ST113. If it is nonzero, the variable j is decremented by one at step ST114 to iterate the computation of the step ST112 until the variable j becomes zero, thereby updating the syndromes $S_i$ (i=0, 1, ... , 5). If the variable j becomes zero; a new syndrome $S_5$ is obtained at step ST115 by adding the symbol $r_{-1}$ to the value of the syndrome $S_5$ at that time, which is performed only for the syndrome $S_5$. Here, the symbol $r_{-1}$ designates an extended component of the received word. This completes the computation of the syndromes $S_i$ by the foregoing equations (37) and (38) in the syndrome generating step ST11.

Subsequently, the number e of errors having occurred in the portion other than the extended component is decided in the error number estimating step ST12 from the syndrome $S_i$ (i=0, 1, ... , 5) computed in the foregoing syndrome generating step ST11. FIG. 3 is a flowchart illustrating a processing procedure of the error number decision. As illustrated in FIG. 3, a decision is made at the beginning of the error number estimation whether the value of the syndromes $S_i$ computed in the syndrome generating step ST11 are all zero or not at step ST120. If they are all zero, no error estimation (e=0) is made at step ST121, thus completing the error number estimating step ST12. On the other hand, unless a decision of no error has been made, $T_1$–$T_3$ are computed by the following equations (40)–(42) from the syndromes $S_i$ of the received word at step ST122, and a value U is computed by equation (43) at step ST123, thereby estimating the error number e from these values.

$$T_1 = S_1^2 + S_0 S_2 \quad (40)$$

$$T_2 = S_2^2 + S_0 S_4 \quad (41)$$

$$T_3 = S_3^2 + S_2 S_4 \quad (42)$$

$$U = S_4 T_1 S_2 T_2 + S_0 T_3 \quad (43)$$

More specifically, a decision is made whether $T_1 = T_2 = T_3 = 0$ holds or not at step ST124. If it holds, the error number e is estimated to be one at step ST125, thus completing the process. On the contrary, if $T_1 = T_2 = T_3 = 0$ does not hold, a decision is made at step ST126 whether the value U is zero or not. If U=0, the error number e is estimated to be two at step ST127, and otherwise the error number e is estimated to be three at step ST128, thus completing the processing.

Next, the error-locator polynomial $\sigma(z)$ and error-value polynomial $\omega(z)$ are computed using the Euclidean algorithm by altering the initial values and the ending condition on the basis of the error number e estimated in the error number estimating step ST12. FIG. 4 is a flowchart illustrating details of the processing procedure of the Euclidean algorithm computing step ST13. At the beginning of the Euclidean algorithm computing step ST13, a decision is made at step ST130 whether the error number e estimated in the error number estimating step ST12 is zero or not. If the estimated error number e is zero, the Euclidean algorithm computation is completed, and the received word is output without change.

On the other hand, if there is some error (if the error number is estimated to be nonzero), the initial values of the Euclidean algorithm are set at step ST131: the initial values of a polynomial $R_i(z)$ used for computing the error-value polynomial $\omega(z)$ are set in accordance with the error number e by the following equations (44) and (45), and the initial values of a polynomial $B_i(z)$ used for computing the error-locator polynomial $\omega(z)$ are set such that $B_{-1}(z)=0$ and $B_0(z)=1$.

$$R_{-1}(z) = z^{2e} \quad (44)$$

$$R_0(z) = S_{2e-1} z^{2e-1} + S_{2e-2} z^{2e-2} + \ldots + S_1 z + S_0 \quad (45)$$

Then, after initializing the variable i to one at step ST132, a quotient polynomial Q(z) is obtained by dividing the polynomial $R_{i-2}(z)$ by $R_{i-1}(z)$ at step ST133, and the remainder polynomial $R_i(z)$ and $B_i(z)$ are computed at step ST134 using the obtained quotient polynomial Q(z) as in the conventional error correcting decoding of the extended RS code. Afterward, a decision is made whether the degree of the remainder polynomial $R_i(z)$ is smaller than the error number e, that is, whether the ending condition represented by the following expression (46) is satisfied or not at step ST135.

$$deg\, R_i(z) < e \quad (46)$$

If a decision is made that the ending condition given by the foregoing expression (46) is unsatisfied, that is, if the degree of the remainder polynomial $R_i(z)$ is still greater than the error number e, the variable i is incremented at step ST136, and the computations at steps ST133 and ST134 are iterated. On the contrary, if a decision is made at step ST135 that the ending condition has been satisfied, that is, if the degree of the remainder polynomial $R_i(z)$ has become smaller than the error number e, the foregoing computations are completed, and the error-locator polynomial $\sigma(z)$ and error-value polynomial $\omega(z)$ are computed from the obtained remainder polynomial $B_i(z)$ and $R_i(z)$ at step ST137 as in the conventional error correcting decoding of the extended RS code, thereby completing the computations by the Euclidean algorithm.

Subsequently, in the Chien's search step ST14, the Chien's search is performed on the error-locator polynomial σ(z) and error-value polynomial ω(z) computed in the Euclidean algorithm computing step ST13. Thus, error locations and error values are computed for the symbols other than the extended component, and if the number c of the errors detected by the Chien's search does not agree with the estimated error number e, the flag F is set. The processing procedure of the Chien's search is illustrated in FIG. 5.

Here, let us assume that the error-locator polynomial σ(z) and error-value polynomial ω(z) computed in the Euclidean algorithm computing step ST13 are given by the following equations (47) and (48), respectively.

$$\sigma(z) = \sigma_0 + \sigma_1 z + \sigma_2 z^2 + \sigma_3 z^3 \tag{47}$$

$$\omega(z) = \omega_0 + \omega_1 z + \omega_2 z^2 \tag{48}$$

At the beginning of the Chien's search step ST14, the counter for counting the error' number c detected by the Chien's seatch is initialized to zero at step ST140. Then, a decision is made at step ST141 whether the error number e in the symbols other than the extended component equals zero or not, which error number e is estimated in the error number estimating step ST12. Then, after initializing the variable i to zero at step ST142, values s, x and y which are needed for the Chien's search are obtained by the following equations (49)–(51) at step ST143.

$$s = \sigma_0 + \sigma_1 + \sigma_2 + \sigma_3 \tag{49}$$

$$x = \omega_0 + \omega_1 + \omega_2 \tag{50}$$

$$y = \sigma_1 + \sigma_3 \tag{51}$$

Next, a decision is made at step ST144 whether the value s obtained equals zero or not. If the value s is zero, the variable i at that time is substituted into the error location el[c], and the quotient obtained by dividing the value x by the value y is substituted into the error value ev[c] at step ST145, and then the error number c is increased by one at step ST146. Afterward, a decision is made at step ST147 whether the variable i has reached n−2 or not. If it has not yet-reached n−2, the variable i is incremented, and $\sigma_0$–$\sigma_3$ and $\omega_0$–$\omega_3$ are updated by the following equations (52) and (53), respectively, at step ST148. Then, the processing returns to step ST143 to iterate the foregoing processings.

$$\sigma_j = \alpha^{-j} \sigma_j (j=0, 1, 2, 3) \tag{52}$$

$$\omega_j = \alpha^{-j-1} \omega_j (j=0, 1, 2) \tag{53}$$

where a is, a root of the primitive polynomial constituting the Galois field.

If a decision is made at the foregoing step ST144 that the value s is nonzero, steps ST145 and ST146 are skipped, and a decision at step ST147 is made immediately.

If a decision is made at step ST147 that the variable i has reached n−2, the current value of the error number c detected by the Chien's search is compared at step ST149 with the error number e estimated in the error number estimating step ST12. If the two value are equal, the Chien's search is completed, whereas if they are different, the Chien's search is completed after setting the flag F (F=1) at step ST150.

If the error number c detected in the Chien's search step ST14 equals the error number e estimated in advance in the error number estimating step ST12, the errors are corrected in the error correcting step ST15 and the corrected symbols are output. The processing procedure of the error correction is illustrated in the flowchart of FIG. 6. At the beginning of the processing, a decision is made at step ST151 whether the flag F is ON or OFF. If the error number e estimated previously in the error number estimating step ST12 equals the error number c detected in the Chien's search step ST14, the flag F is OFF (F=0).

If the flag F is not ON (F=0), the variable i is initialized to zero at step ST152, and a decision is made at step ST153 whether the variable i has reached the detected error number c. If the variable i has not yet reached the error number c, the symbol $r_{el[i]}$ whose suffix matches the error location el[i] at the symbol $r_i$ of the received word, where i=0, 1, . . . , n−2, is corrected by adding to its value the error corrected value ev[i] in accordance with the following equation.(54).

$$r_{el[i]} = r_{el[i]} + ev[i] \tag{54}$$

Then, after incrementing the variable i at step ST155, the processing is returned to step ST153 to iterate the foregoing processings. If a decision is made at step ST153 that the variable i has reached the detected error number c, a series of the processings is completed after outputting the error corrected received word. If the flag F is ON (F=1) because the error number c detected in the Chien's search step ST14 disagree with the error number e estimated in the error number estimating step ST12, the processing is stopped up to the error detection because the errors are uncorrectable.

As described above, the embodiment 1 has an advantage of implementing the fast decoding operation of the extended RS code because it can obtain the error-locator polynomial and error-value polynomial needed for the error correcting decoding of the extended RS code by performing the Euclidean algorithm computation only once, and in addition it can compute the error locations and error values from the error-locator polynomial and error-value polynomial with only one Chien's search.

EMBODIMENT 2

Figure 7:
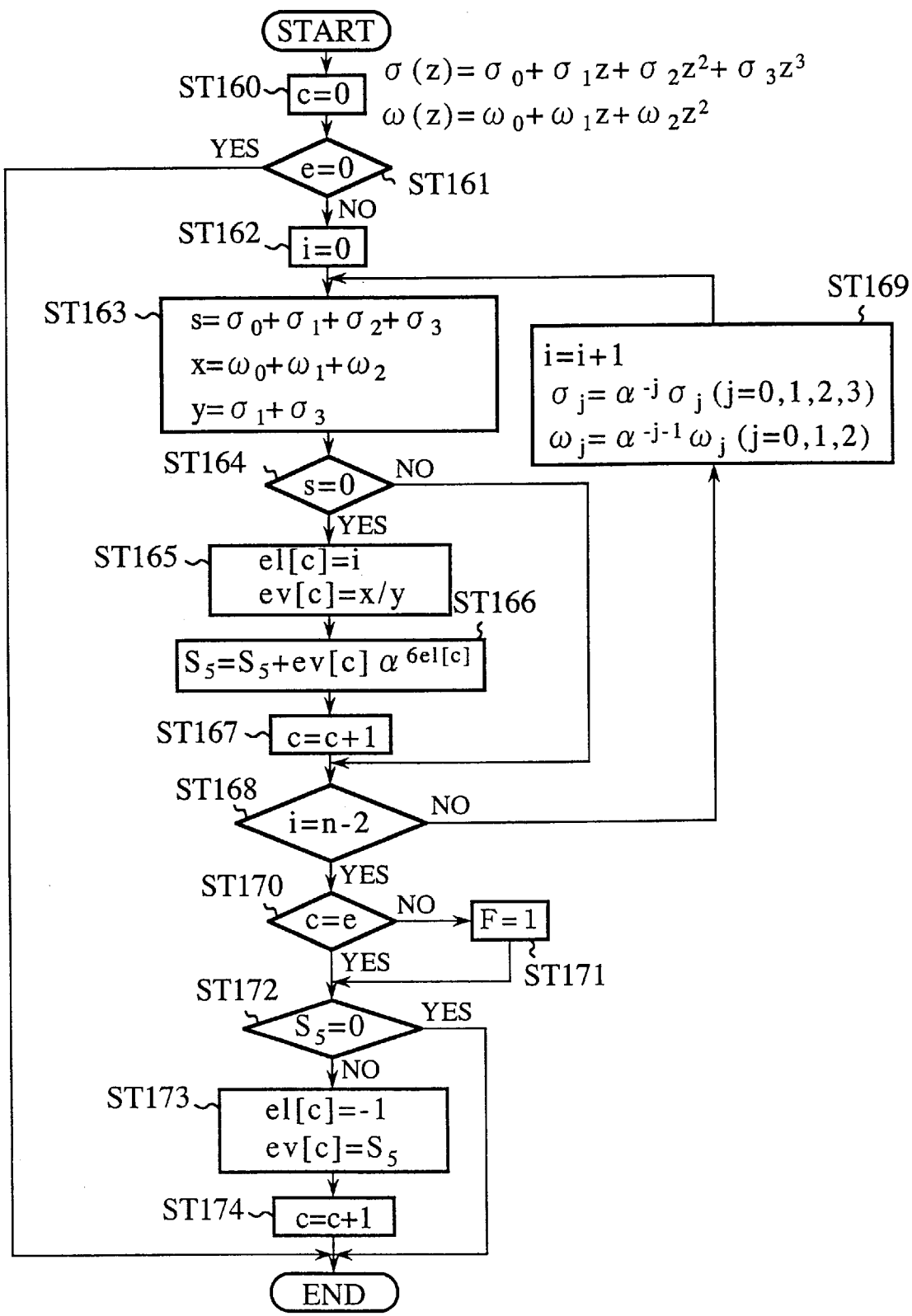
FIG. 7 is a flowchart illustrating details of a processing procedure of a Chien's search step in an embodiment 2 of an error correcting decoding method of an extended RS code in accordance with the present invention.

Although the foregoing embodiment 1 deals with the error value computations about the symbols other than the extended component, the error value computation of the extended component symbol is also possible. FIG. 7 is a flowchart illustrating details of the processing procedure. of a Chien's search step in an embodiment 2 of the error correcting decoding method of the extended RS code in accordance with the present invention.

Next, the operation will be described.

First, the syndromes of the received word are computed in the syndrome generating step ST11, and the error number of the symbols other than the extended component are estimated in the error number estimating step ST12 as shown in FIG. 1 in procedures similar to those described in the embodiment 1. Then, after altering the initial values and ending condition in accordance with the estimated error numbers, the error-locator polynomial and error-value polynomial are computed in the Euclidean algorithm computing step ST13 using the Euclidean algorithm computation.

Subsequently, error locations and error values are computed in the Chien's search step ST14 by carrying out the Chien's search on the error-locator polynomial and error-value polynomial obtained in the Euclidean algorithm computing step ST13. At the beginning of the Chien's search, the counter for counting the error number c is initialized to zero at step ST160 as illustrated in FIG. 7. Then, a decision is made at step ST161 whether the error number e in the symbols other than the extended component equals zero or not. After initializing the variable i to zero at step ST162, values s, x and y are obtained by the foregoing equations (49)–(51) at step ST163. Subsequently, a decision is made at step ST164 whether the value s obtained equals zero or not. If the value s is zero, the variable i is substituted into the error location el[c], and x/y is substituted into the error value ev[c] at step ST165. The procedure so far is the same as that of the Chien's search in the embodiment 1 as illustrated in FIG. 5.

If the result by substituting $\alpha^{-el[c]}$ into the error-locator polynomial $\sigma(z)$ becomes zero, where a is a root of the primitive polynomial constituting the Galois field, the syndrome $S_5$ is corrected by the following equation (55) using the error value ev[c] and error location el[c] at that time. Specifically, the syndrome $S_5$ of the received word $S_5$ is corrected at step ST166 by adding $ev[c]\alpha^{6el[c]}$ to the syndrome $s_5$ at that time.

$$S_5 + ev[c]\alpha^{6el[c]} \tag{55}$$

Then, after increasing the error number c by one at step ST167, a decision is made at step ST168 whether the variable i has reached n−2 or not. If it has not yet reached n−2, the variable i is incremented, and $\sigma_0$–$\sigma_3$ and $\omega_0$–$\omega_2$ are updated by the foregoing equations (52) and (53), respectively, at step ST169. Then, the processing returns to step ST163 to iterate the foregoing processings. If a decision is made that the value s is nonzero, the foregoing steps ST165–ST167 are skipped.

If the variable i has reached n−2, the error number c is compared with the error number e at step ST170. If the two value are different, the flag F is made ON (F=1) at step ST171. The processing procedure of the steps ST167–ST171 is also the same as that of the Chien's search in the embodiment 1 illustrated in FIG. 5.

Here, if the syndrome $S_5$ of nonzero is obtained as a result of performing the foregoing computation on the syndrome $S_5$ with respect to the entire symbols in the received word other than the extended component, an error has occurred in the extended component, and the value of the syndrome $S_5$ becomes the error value of the extended component. Taking account of this, when a decision is made at step ST170 that the values c and e agree with each other, or after the flag F is set at step ST171, a decision is made at step ST172 whether the value of the syndrome $S_5$ is zero or not. If the result indicates that the value of the syndrome $S_5$ is nonzero, the error location el[c] is set at −1, and the error value ev[c] is set at the value of the syndrome $S_5$ at step ST173. Then, the error number c is increased by one at step ST174, and the Chien's search is completed. If a decision is made that e=0 at step ST161, or that $S_5$=0 at step ST172, the Chien's search is completed immediately.

Subsequently, the error correcting operation is completed in the error correcting step ST15 by performing error correction of the portion other than the extended component, and then by adding to the extended component the corrected value of the syndrome $S_5$.

As described above, the embodiment 2 has an advantage of readily computing the error value of the symbol of the extended component because the syndromes of the received word can be corrected using the error locations and error values computed in the Chien's search step.

EMBODIMENT 3

Although the foregoing embodiments describe the case where the initial values and ending condition of the Euclidean algorithm computing operation are set in accordance with the number of errors estimated in the error number estimating step, the initial values and ending condition of the Euclidean algorithm computing operation can be changed on the basis of the result of a decision made in the error number estimating step whether the error number is less than or equal to the maximum error correctable number of the extended RS code.

Figure 8:
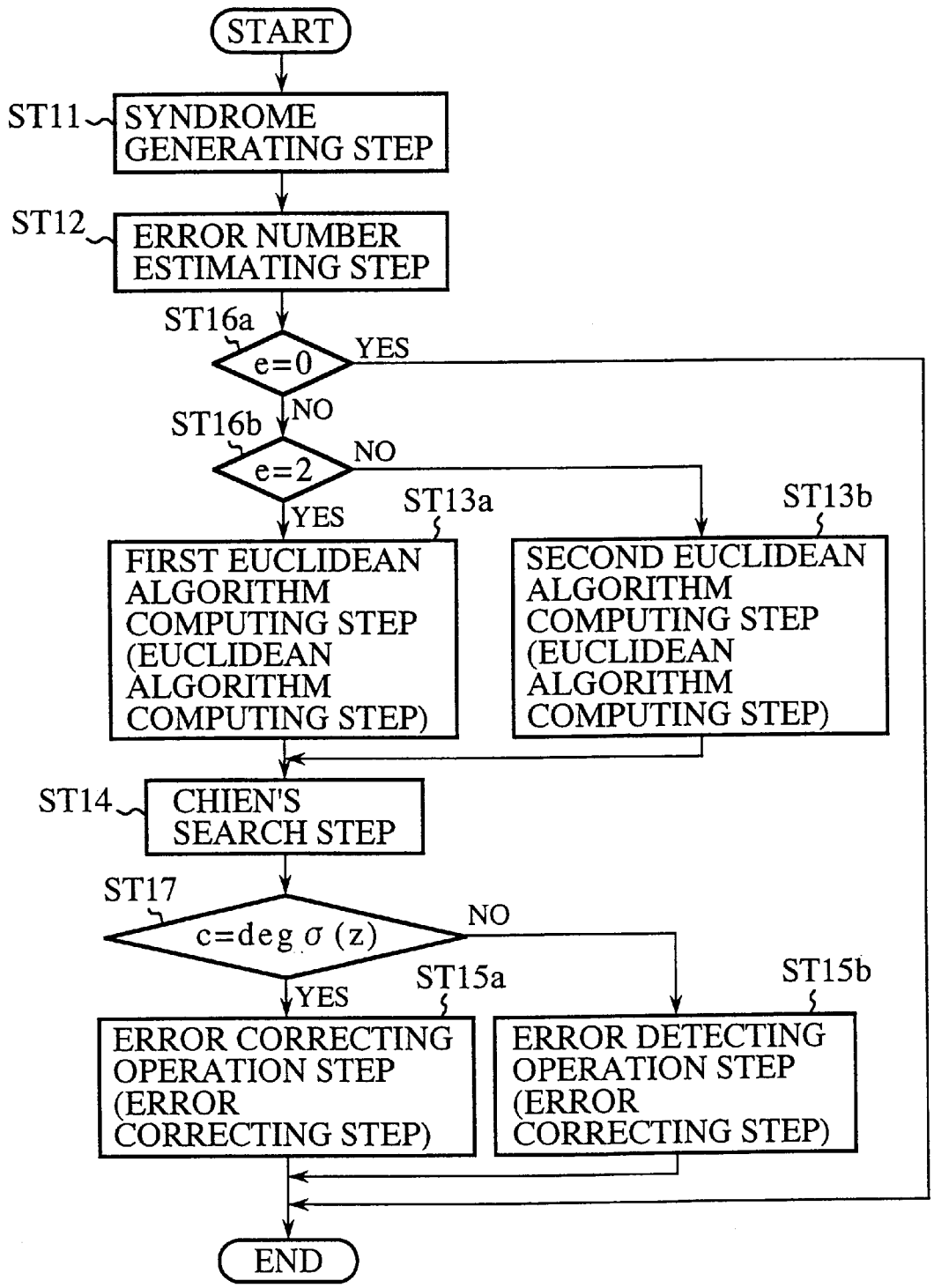
FIG. 8 is a flowchart illustrating details of a processing procedure of an embodiment 3 of an error correcting decoding method of an extended RS code in accordance with the present invention.

FIG. 8 is a flowchart illustrating the processing procedure of a thus schemed embodiment 3 of the error correcting decoding method of the extended RS code in accordance with the present invention. In FIG. 8, ST11 designates a syndrome generating step like that in the embodiment 1 shown in FIG. 1, which computes the syndromes of a received word of the extended RS code with a minimum distance of d. ST12 designates an error number estimating step which differs from its counterpart of the embodiment 1 designated by the same reference character in FIG. 1 in that it makes a decision in estimating the error number from the computed syndromes whether any errors are present or not, and if there are any errors, whether the error number is equal to [(d−1)/2] or less than [(d−1)/2]. ST16a and ST16b are decision steps, each making a decision of a processing to be executed from then on in accordance with. the estimation results in the error number estimating step ST12.

ST13a and ST13b each designate a step corresponding to the Euclidean algorithm computing step ST13 in the embodiment 1 as shown in FIG. 1: The step ST13a is a first Euclidean algorithm computing step of computing the error-locator polynomial and error-value polynomial on the basis of particular initial values and ending condition when a decision is made in the error number estimating step ST12 that the error number is less than [(d−1)/2]; and the step ST13b is a second Euclidean algorithm computing step of computing the error-locator polynomial and error-value polynomial on the basis of initial values and ending condition different from those of the first Euclidean algorithm computing step ST13a when a decision is made in the error number estimating step ST12 that the error number is equal to [(d−1)/2].

ST14 designates a Chien's search step which is the same as its counterpart designated by the same reference character in FIG. 1, and which computes the error locations and error values from the error-locator polynomial and error-value polynomial obtained in the first Euclidean algorithm computing step ST13a or second Euclidean algorithm computing step ST13b. ST17 designates a decision step of deciding the propriety of the error correction from the error number detected in the Chien's search step ST14 and the degree of the error-locator polynomial obtained in the first Euclidean algorithm computing step ST13a or second Euclidean algorithm computing step ST13b. ST15a and ST15b each designate a step corresponding to the error correcting step ST15 of the embodiment 1 as shown in FIG. 1: The step ST15a is an error correcting operation step of correcting error symbols when both the values agree in the decision step ST17; and the step ST15b is an error detecting operation step of outputting the received word without change as error uncorrectable when the values disagree in the decision step ST17, thus completing the processing up to the detection of the error locations.

Next, the operation will be described.

It is assumed here that an extended RS code handled in the following description has a minimum length of seven, that is, it has six check symbols.

Figure 9:
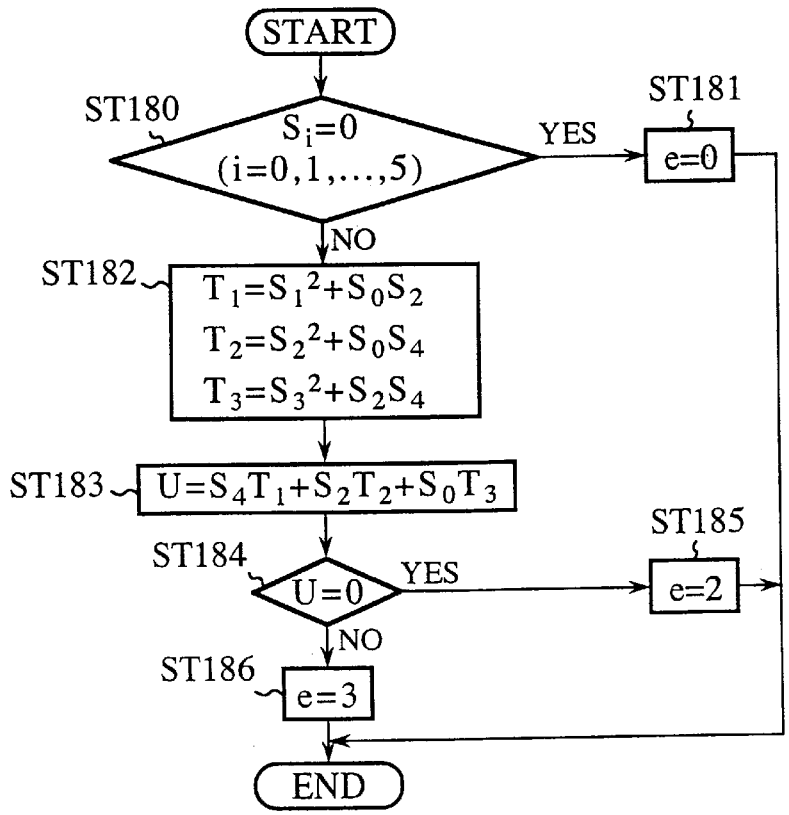
FIG. 9 is a flowchart illustrating details of a processing procedure of an error number estimating step in the embodiment 3.

First, in the syndrome generating step ST11, the syndromes $S_i$ of the received word are computed in the procedure as described in the embodiment 1. Subsequently, a decision is made in the error number estimating step ST12 whether the error number is zero or nonzero, and if nonzero, whether it is less than or equal to three from the syndromes $S_i$ computed in the syndrome generating step ST11. FIG. 9 is a flowchart illustrating details of the processing procedure of the error number estimating step ST12.

At the beginning of the processing of the error number estimating step ST12, a decision is made at step ST180 whether the values of the syndromes $S_i$ (i=0, 1, . . . , 5) computed in the syndrome generating step ST11 are all zero or not. If they are all zero, it is decided that there is no error and the error number is set at zero at step ST181, thus completing the error number estimating step ST12. On the other hand, if it is decided that there is some error, $T_1$–$T_3$ are computed from the syndromes $S_i$ of the received word at step ST182 using the foregoing equations (40)–(42), and a value U is computed for the obtained $T_1$–$T_3$ at step ST183 using equation expression (43).

Subsequently, a decision is made at step ST184 whether the obtained value U is zero or not. If U is zero, the error number e is estimated to be less than three, and is set at two at step ST185, thus completing the error number estimating step ST12. On the other hand, if U is nonzero, the error number e is estimated to be three, and is set at that value at step ST186, thus completing the error number estimating step ST12.

The error number e set by the estimation operation in the error number estimating step ST12 is compared with zero in the decision step ST16a and with two in the decision step ST16b. As a result, if e=0, that is, if it is estimated that there is no error, a series of the processings is completed. If e=2, that is, if it is estimated that the error number is less than three, the processing proceeds to the first Euclidean algorithm computing step ST13a, where the error-locator polynomial and error-value polynomial are computed by the Euclidean algorithm using the values set by the following equations (56) and (57) as the initial values for computing the error-locator polynomial and error-value polynomial, and using the ending condition set by the following expression (58).

$$R_{-1}(z)=z^5 \tag{56}$$

$$R_0(z)=S_4 z^4+S_3 z^3+S_2 z^2+S_1 z+S_0 \tag{57}$$

$$deg\, R_i(z)<2 \tag{58}$$

Furthermore, if e=3, that is, if it is estimated that the error number is three, the processing proceeds to the second Euclidean algorithm computing step ST13b, where the error-locator polynomial and error-value polynomial are computed by the Euclidean algorithm using the values set by the following equations (59) and (60) as the initial values for computing the error-locator polynomial and error-value polynomial, and using the ending condition set by the following expression (61).

$$R_{-1}(z)=z^6 \tag{59}$$

$$R_0(z)=S_5 z^5+S_4 z^4+S_3 z^3+S_2 z^2+S_1 z+S_0 \tag{60}$$

$$deg\, R_i(z)<3 \tag{61}$$

Subsequently, in the Chien's search step ST14, the error locations and error values are computed about the symbols other than the extended component as in the embodiment 1 on the basis of the error-locator polynomial and error-value polynomial computed in the first Euclidean algorithm computing step ST13a or in the second Euclidean algorithm computing step ST13b. Afterward, in the decision step ST17, the degree $deg\sigma(z)$ of the error-locator polynomial computed above is compared with the error number c detected in the Chien's search step ST14. If they agree, the errors of the received word is corrected in the error correcting step ST15a to be output, thus completing the series of the processings. On the other hand, if they disagree, the received word is output without change as uncorrectable in the error correcting step ST15b, with closing the processing at the detection of the errors, thereby completing the series of the processings.

As described above, the present embodiment 3 has an advantage that it can reduce the number of steps required for decoding the received word because it computes the error locations and error values after altering the initial values and the ending condition of the Euclidean algorithm computing operation on the basis of the decision results whether the error number of the portion other than the extended component in the received word is less than or equal to the maximum error correctable number of the extended RS code.

EMBODIMENT 4

Although the decision is made in the error number estimating step in the foregoing embodiment 3 whether the error number is less than or equal to the maximum error correctable number of the extended RS code, it can be modified. For example, a decision can be made whether the error number is less than, equal to, or greater than the maximum error correctable number of the extended RS code, and if it is decided that the error number is greater than that, the Euclidean algorithm computing operation and the Chien's search operation can be skipped.

Figure 10:
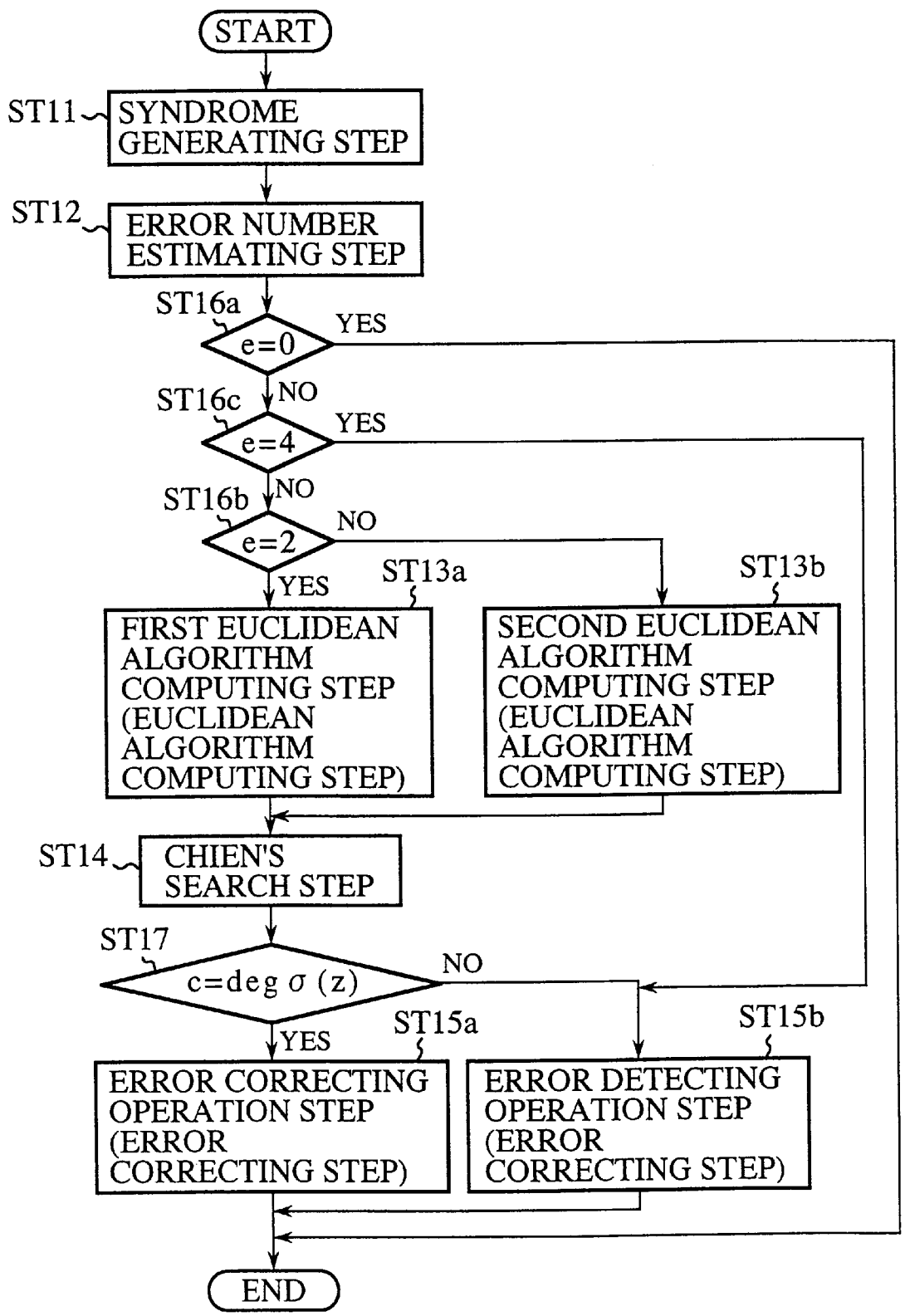
FIG. 10 is a flowchart illustrating details of a processing procedure of an embodiment 4 of an error correcting a decoding method of an extended RS code in accordance with the present invention.

FIG. 10 is a flowchart illustrating the processing procedure of a thus schemed embodiment 4 of the error correcting decoding method of the extended RS code in accordance with the present invention. In FIG. 10, ST11 designates an error number estimating step which differs from its counterpart of the embodiment 3 shown in FIG. 8 by the same reference character in that it makes a decision in estimating the error number from the syndromes computed in the syndrome generating step ST11 whether any errors are present or not, and if there are any errors, whether the error number is less than [(d−1)/2], equal to [(d−1)/2], or greater than [(d−1)/2]. ST16c designates a decision step, as the steps ST16a and ST16b, of making decisions of the processing to be executed from then on in accordance with the estimation results in the error number estimating step ST12. It is provided for skipping the Euclidean algorithm computing operation and the Chien's search operation when the error number is greater than [(d−1)/2]. The other steps are designated by the same reference characters as those in FIG. 8, and the description thereof is omitted here.

Next, the operation will be described.

Figure 11:
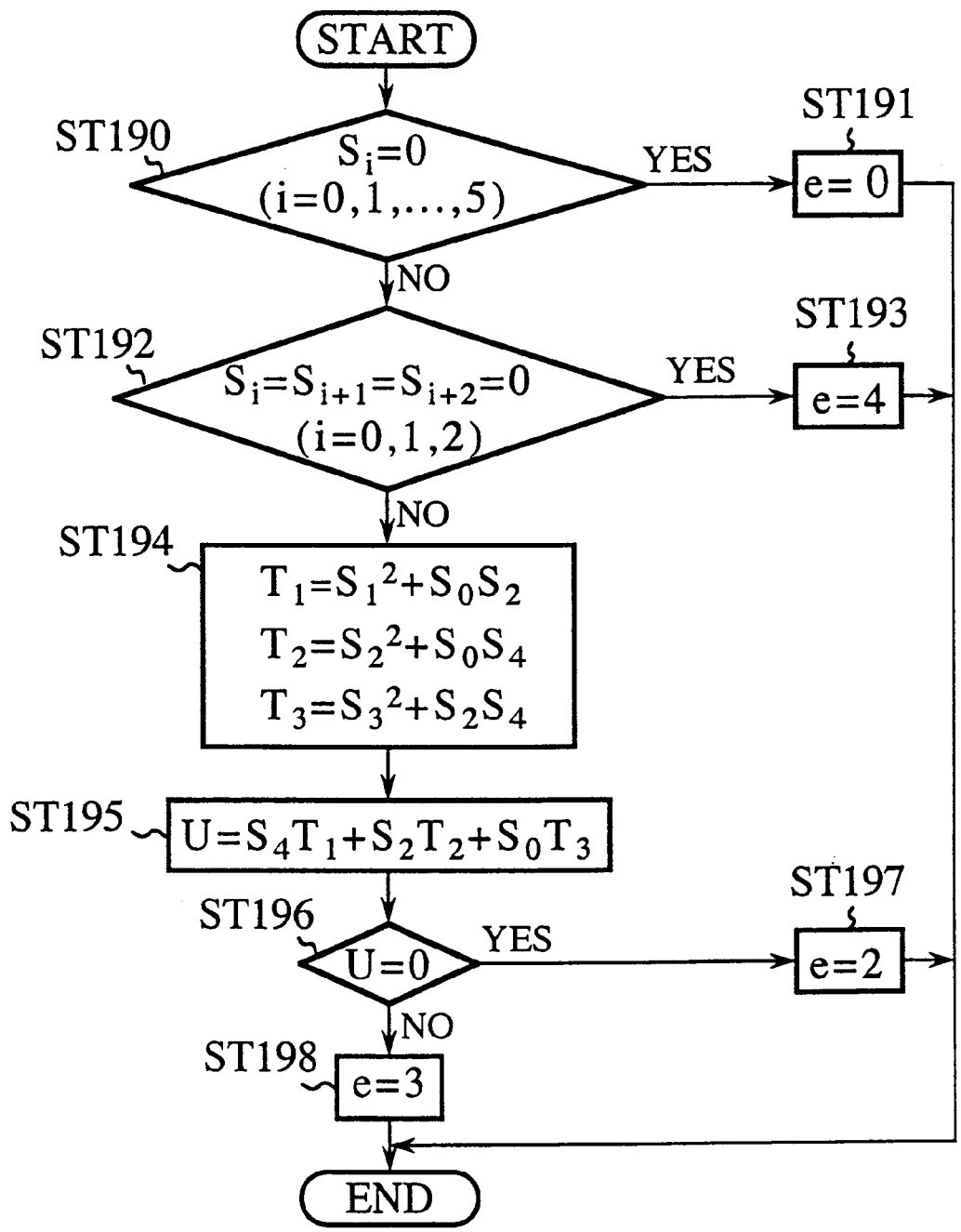
FIG. 11 is a flowchart illustrating details of a processing procedure of an error number estimating step in the embodiment 4.

First, in the syndrome generating step ST11, the syndromes $S_i$ of the received word are computed in the procedure as described in the embodiment 1. Subsequently, a decision is made in the error number estimating step ST12 whether the error number is zero or nonzero, and if nonzero, whether it is less than, equal to, or greater than three from the syndromes $S_i$ computed in the syndrome generating step ST11. FIG. 11 is a flowchart illustrating details of the processing procedure of the error number estimating step ST12.

When the processing of the error number estimating step ST12 is started, the processings proceed as in the foregoing embodiment 3. First, a decision is made at step ST190 whether the values of the syndromes $S_i$ computed in the syndrome generating step ST11 are all zero or not. If they are all zero, it is decided that there is no error and the error number e is set at zero at step ST191, thus completing the error number estimating step ST12. On the other hand, if it is decided that there is some error, a decision is made at step ST192 whether any of the following equations (62)–(64) hold or not.

$$S_0 = S_1 = S_2 = 0 \quad (62)$$

$$S_1 = S_2 = S_3 = 0 \quad (63)$$

$$S_2 = S_3 = S_4 = 0 \quad (64)$$

If any of the foregoing equations (62)–(64) hold as a result of the decision, the error number e is set at four at step ST193 by estimating that the error number is greater than three, thus completing the error number estimating step ST12. On the other hand, if none of the equations (62)–(64) hold, $T_1$–$T_3$ are computed using the foregoing equations (40)–(42) at step ST194, and the value U for the obtained $T_1$–$T_3$ is computed using expression (43) at step ST195. Then, a decision is made at step ST196 whether the obtained value U is zero or not. If U is zero, the error number e is estimated to be less than three, and is set at two at step ST197, thus completing the error number estimating step ST12. On the other hand, if U is nonzero, the error number e is estimated to be three, and is set at that value at step ST198, thus completing the error number estimating step ST12.

The processing procedure in the error number estimating step ST12 is not limited to that as illustrated in FIG. 11. For example, the following procedure can be applied. Specifically, if one or more errors are detected based on the fact that any of the syndromes $S_i$ are nonzero, the error number is estimated to be three if the value U computed by the equation (43) is nonzero.

The error number e which is set by the estimating operation in the error number estimating step ST12 is compared with zero in the decision step ST16a, with four in the decision step ST16c, and with two in the decision step ST16b. As a result, if e=0, that is, if it is estimated that there is no error, a series of the processings is completed. If e=4, that is, if it is estimated that the error number is greater than three, the Euclidean algorithm computing operation and the Chien's search operation are skipped, and the received word is output without change as uncorrectable, thus completing the series of the processings with terminating the processing at the error detection.

The remaining cases are handled as in the embodiment 3: If e=2, that is, if it is estimated that the error number is less than three, the processing proceeds to the first Euclidean algorithm computing step ST13a, where the error-locator polynomial and error-value polynomial are computed using the values set by the foregoing equations (56) and (57) as the initial values, and using the ending condition set by the foregoing expression (58). Furthermore, if e=3, that is, if it is estimated that the error number is three, the processing proceeds to the second Euclidean algorithm computing step ST13b, where the error-locator polynomial and error-value polynomial are computed using the values a set by the foregoing equations (59) and (60) as the initial values, and using the ending condition set by the foregoing expression (61).

Subsequently, in the Chien's search step ST14, the error locations and error values are computed about the symbols other than the extended component on the basis of the error-locator polynomial and error-value polynomial as in the embodiment 3. Afterward, if a decision is made in the decision step ST17 that the degree deg$\sigma$(z) of the error-locator polynomial agrees with the error number c detected in the Chien's search step ST14, the errors of the received word is corrected in the error correcting step ST15a to be output, thus completing the series of the processings. On the other hand, if they disagree, the received word is output without change as uncorrectable in the error correcting step ST15b, with suspending the processing at the detection of the errors, thereby completing the series of the processings.

As described above, the present embodiment 4 has an advantage that it can further reduce the number of steps required for decoding the received word because it can skip the Euclidean algorithm computing operation and Chien's search operation when the error number exceeds the maximum error correctable number as a result of the decision whether the error number of the portion other than the extended component in the received word is less than, equal to, or greater than the maximum error correctable number of the extended RS code.

EMBODIMENT 5

Figure 12:
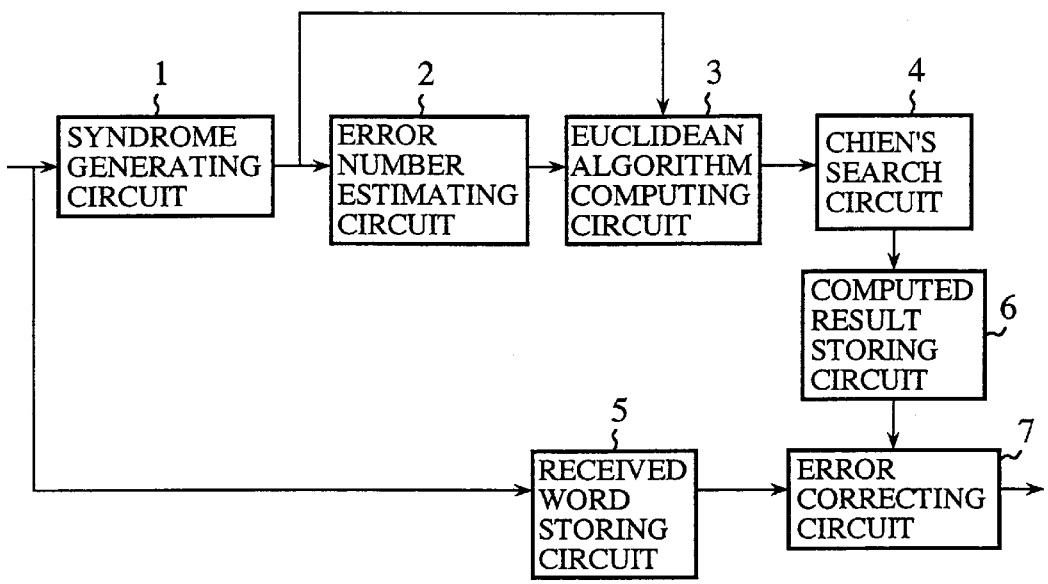
FIG. 12 is a block diagram showing an embodiment 5 of an error correcting decoding apparatus of an extended RS code in accordance with the present invention.

Although the foregoing embodiments describe the error correcting decoding method of the extended RS code, it is possible to implement an error correcting decoding apparatus based on the method. FIG. 12 is a block diagram showing an embodiment 5 of an error correcting decoding apparatus of the extended RS code in accordance with the present invention. In FIG. 12, the reference numeral 1 designates a syndrome generating circuit for generating syndromes from a received word; and 2 designates an error number estimating circuit for estimating from the syndromes computed in the syndrome generating circuit 1 the error number of the portion other than the extended component of the received word.

The reference numeral 3 designates a Euclidean algorithm computing circuit for computing the error-locator polynomial and error-value polynomial using the Euclidean algorithm after setting their initial values and ending condition on the basis of the error number estimated in the error number estimating circuit 2. The reference numeral 4 designates a Chien's search circuit for computing the error locations and error values by performing the Chien's search of the error-locator polynomial and error-value polynomial computed by the Euclidean algorithm computing circuit 3. The reference numeral 5 designates a received word storing circuit for storing the incoming received words; and 6 designates a computed result storing circuit for storing the error locations and error values computed by the Chien's search circuit 4. The reference numeral 7 designates an error correcting circuit for correcting the received words stored in the received word storing circuit 5 on the basis of the error locations and error values stored in the computed result storing circuit 6.

Next, the operation will be described.

An incoming received word is delivered to the syndrome generating circuit 1 and received word storing circuit 5. Receiving the received word, the syndrome generating circuit 1 computes the syndromes $S_i$ of the received word, where i=0, 1, . . . , 5, and delivers them to the error number estimating circuit 2 and Euclidean algorithm computing circuit 3. The received word storing circuit 5 stores the incoming received word.

The error number estimating circuit 2 estimates the error number of the portion other than the extended component from the syndromes which have not undergone the effect of the extended component, that is, syndromes $S_0, S_1, \ldots, S_4$ among the syndromes $S_i$ computed by the syndrome generating circuit 1. The error number estimated by the error number estimating circuit 2 is fed to the Euclidean algorithm computing circuit 3. The Euclidean algorithm computing circuit 3 sets the initial values and ending condition for computing the error-locator polynomial and error-value polynomial on the basis of the estimate of the error number and the syndromes computed by the syndrome generating circuit 1, and computes the error-locator polynomial and error-value polynomial using the Euclidean algorithm.

The Chien's search circuit 4 carries out the Chien's search operation on the basis of the error-locator polynomial and error-value polynomial computed by the Euclidean algorithm computing circuit 3, computes the error is locations and error values at these locations, and has the computed result storing circuit 6 store them. The error correcting circuit 7, having the received word storing circuit 5 sequentially output the contents of the received word stored in the received word storing circuit 5, corrects, by using information on the error locations and error values, the errors of the symbols corresponding to the error locations by adding to them the error values having occurred at the locations.

As described above, the embodiment 5 has an advantage of implementing the fast decoding operation of the extended RS code because it can obtain the error-locator polynomial and error-value polynomial needed for the error correcting decoding of the extended RS code through one-time Euclidean algorithm computation, and in addition it can compute the error locations and error values from the error-locator polynomial and error-value polynomial through one-time Chien's search.

EMBODIMENT 6

Figure 13:
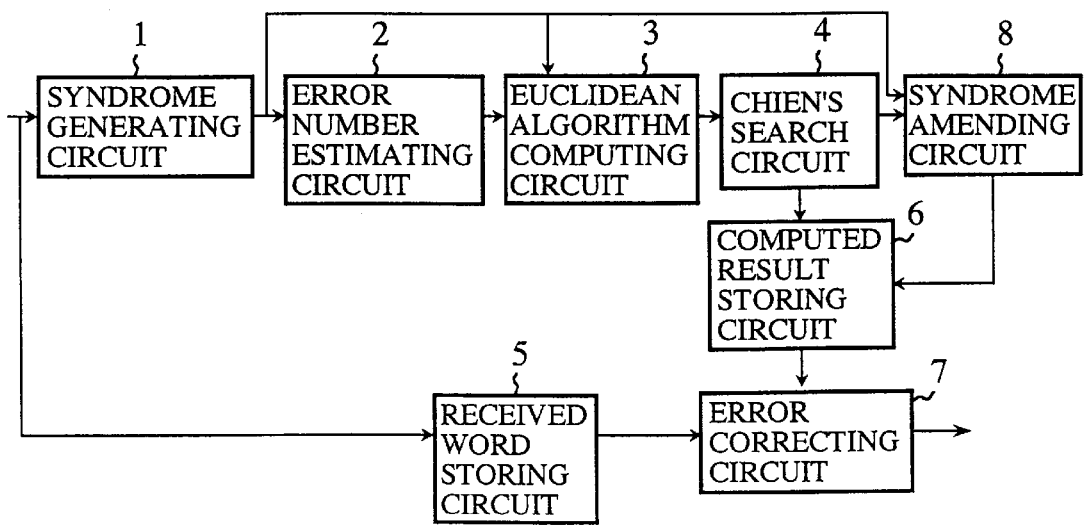
FIG. 13 is a block diagram showing an embodiment 6 of an error correcting decoding apparatus of an extended RS code in accordance with the present invention.

Although the foregoing embodiment 5 deals with the error value computations about the symbols other than the extended component, the error value computation of the extended component symbol is also possible. FIG. 13 is a block diagram showing an embodiment 6 of the error correcting decoding apparatus in accordance with the present invention, in which like portions to those of FIG. 12 are designated by the same reference numerals, and the description thereof is omitted here. In FIG. 13, the reference numeral 8 designates a syndrome amending circuit composed of multipliers and adders on the Galois field for correcting the values of the syndromes of the received word using the error locations and error values computed by the Chien's search circuit 4.

Next, the operation will be described.

First, an incoming received word is input to the syndrome generating circuit 1 and received word storing circuit 5. The syndrome generating circuit 1 computes the syndromes $S_i$, and the received word storing circuit 5 stores the incoming received word. The error number estimating circuit 2 estimates the error number of the portion other than the extended component from the syndromes which have not undergone the effect of the extended component, that is, syndromes $S_0, S_1, \ldots, S_4$ among the syndromes $S_i$ computed by the syndrome generating circuit 1. Then, the Euclidean algorithm computing circuit 3 sets the initial values and ending condition using the estimate of the error number, and computes the error-locator polynomial and error-value polynomial using the Euclidean algorithm. The error-locator polynomial and error-value polynomial are transferred to the Chien's search circuit 4 which computes the error locations and error values at these locations, and has the computed result storing circuit 6 store them. The operation so far is similar to that of the embodiment 5.

The error locations and error values computed by the Chien's search circuit 4 are also delivered to the syndrome amending circuit 8. The syndrome amending circuit 8 performs on the syndrome $S_5$ the product-sum operation on the Galois field on the basis of the error location and error value of the syndrome $S_5$ which is computed by the syndrome generating circuit 1 with the extended component inclusive, and corrects the value of the syndrome $S_5$. If the corrected value of the syndrome $S_5$ is nonzero as a result of computing the error locations and error values about the entire symbols other than the extended component, the location of the extended component is considered to be one of the error locations and the corrected value of the syndrome $S_5$ is considered to be an error value, and they are stored in the computed result storing circuit 6.

As in the foregoing embodiment 5, the error correcting circuit 7, having the received word storing circuit 5 sequentially output the contents of the received word stored in the received word storing circuit 5, corrects, by using information on the error locations and error values stored in the computed result storing circuit 6, the error symbols by adding to their values the error values having occurred at their locations.

As described above, the present embodiment 6 has an advantage of readily computing the error value of the extended component because the syndrome values of the received word can be corrected by the syndrome amending circuit 8 using the product-sum operation on the Galois field based on the error locations and error values computed in the Chien's search.

EMBODIMENT 7

Although the foregoing embodiments 5 and 6 describe the a case where the initial values and ending condition of the Euclidean algorithm computing operation are set in accordance with the number of errors estimated by the error number estimating circuit 2, the error number estimating circuit 2 can make a decision whether the error number is less than or equal to the maximum error correctable number of the extended RS code, and change the initial values and ending condition of the Euclidean algorithm computing operation in accordance with the result of the decision.

Figure 14:
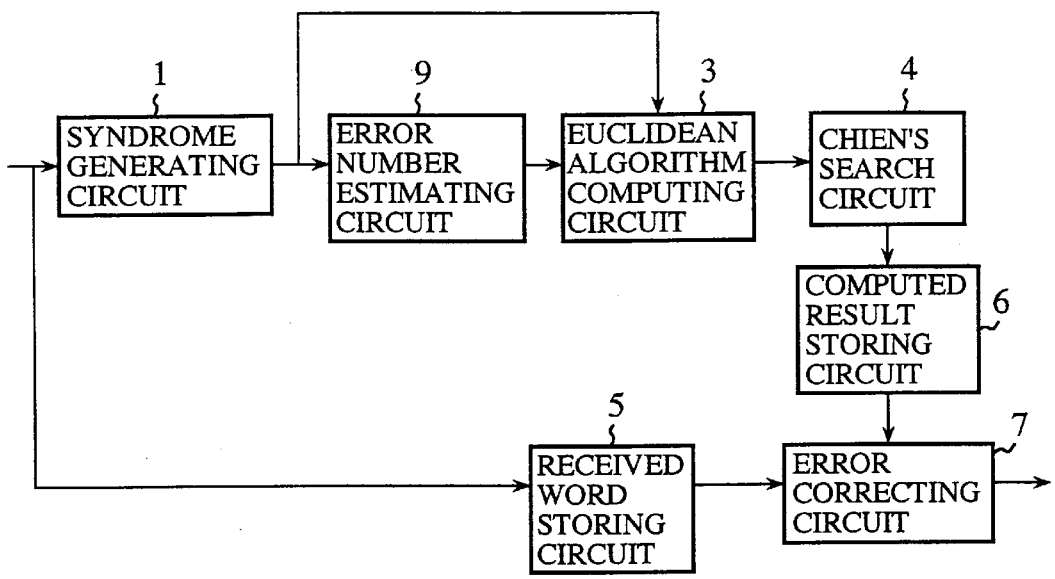
FIG. 14 is a block diagram showing an embodiment 7 of an error correcting decoding apparatus of an extended RS code in accordance with the present invention.

FIG. 14 is a block diagram showing a thus schemed embodiment 7 of the error correcting decoding apparatus of the extended RS code in accordance with the present invention. In FIG. 14, the reference numeral 9 designates an error number estimating circuit for estimating from the syndromes computed by the syndrome generating circuit 1 the error number having occurred in the portion other than the extended component in the received word. The error number estimating circuit 9, composed of multipliers, adders and a memory, differs from its counterpart 2 as shown in FIG. 12 in that it does not make a decision of the error number itself, but makes a decision, if there are any errors, whether the error number is less than or equal to $[(d-1)/2]$. The reference numeral 3 designates a Euclidean algorithm computing circuit for computing the error-locator polynomial and error-value polynomial after setting their initial values and ending condition in accordance with the decision result by the error number estimating circuit 9. Since the remaining portions are the same as those of the foregoing embodiment 5, the description thereof is omitted by designating them by the same reference numerals as those of FIG. 12.

Next, the operation will be described.

First, an incoming received word is input to the syndrome generating circuit 1 and received word storing circuit 5, and the syndrome generating circuit 1 computes the syndromes $S_i$ of the received word, and the received word storing circuit 5 stores the incoming received word, as in the foregoing embodiment 5.

The error number estimating circuit 9 makes a decision, from the syndromes which have not undergone the effect of the extended component, that is, syndromes $S_0, S_1, \ldots, S_4$ among the syndromes $S_i$ computed by the syndrome generating circuit 1, whether the error number having occurred in the portion other than the extended component is zero or nonzero, and if nonzero, whether it is less than or equal to three. In this decision, the algorithm can be applied which is illustrated in FIG. 9 and explained in the description of the embodiment 3, for example. If the decision result indicates that the error number is nonzero, that is, if there is any errors, the Euclidean algorithm computing circuit 3 sets, from the error number condition decided by the error number estimating circuit 9, the initial values and ending condition for computing the error-locator polynomial and error-value polynomial, and computes the error-locator polynomial and error-value polynomial using the Euclidean algorithm.

The error-locator polynomial and error-value polynomial computed are delivered to the Chien's search circuit 4. The Chien's search circuit 4 computes from the error-locator polynomial and error-value polynomial the error locations and error values having occurred at these locations, and has the computed result storing circuit 6 store them. The error correcting circuit 7, having the received word storing circuit 5 sequentially output the contents of the received word stored in the received word storing circuit 5, corrects, by using information on the error locations and error values stored in the computed result storing circuit 6, the errors of the symbols corresponding to the error locations by adding to them the error values having occurred at the locations.

As described above, the present embodiment 7 has an advantage that it can reduce the number of steps required for decoding the received word because it computes the error locations and error values after altering the initial values and the ending condition of the Euclidean algorithm computing operation on the basis of the result of the decision made by the error number estimating circuit 9 whether the error number is less than or equal to the maximum error correctable number of the extended RS code.

EMBODIMENT 8

Although the decision is made in the error number estimating circuit 9 in the foregoing embodiment 7 whether the error number, if there is any, is less than or equal to the maximum error correctable number of the extended RS code, it can be modified. For example, a decision can be made whether the error number is less than, equal to, or greater than the maximum error correctable number of the extended RS code, and if it is decided that the error number is greater than that, the Euclidean algorithm computing operation and the Chien's search operation can be skipped.

Figure 15:
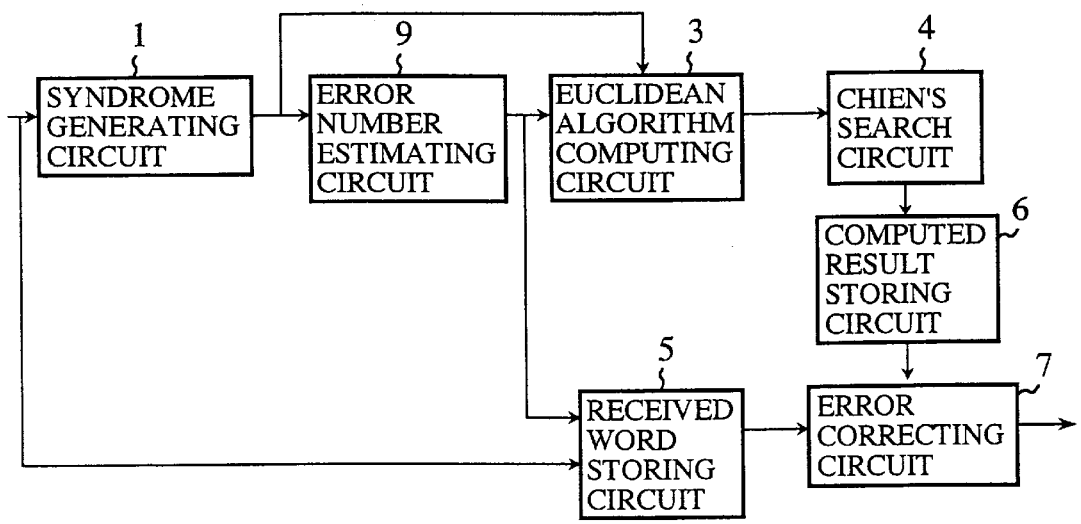
FIG. 15 is a block diagram showing an embodiment 8 of an error correcting decoding apparatus of an extended RS code in accordance with the present invention.

FIG. 15 is a block diagram showing a thus schemed embodiment 8 of the error correcting decoding apparatus of the extended RS code in accordance with the present invention, in which like portions to those in FIG. 14 are designated by the same reference numerals, and the description thereof is omitted here. In FIG. 15. the reference numeral 9 designates an error number estimating circuit which differs from its counterpart 9 as shown in FIG. 14 in connection with embodiment 7 in that it makes a decision, if there are any errors having occurred in the portion other than the extended component, whether the error number is less than, equal to, or greater than $[(d-1)/2]$.

Next, the operation will be described.

First, an incoming received word is input to the syndrome generating circuit 1 and received word storing circuit 5, and the syndrome generating circuit 1 computes the syndromes $S_i$ of the received word, and the received word storing circuit 5 stores the incoming received word, as in the foregoing embodiment 7.

The error number estimating circuit 9 makes a decision, from the syndromes which have not undergone the effect of the extended component, that is, syndromes $S_0, S_1, \ldots, S_4$ among the syndromes $S_i$ computed by the syndrome generating circuit 1, whether the error number having occurred in the portion other than the extended component is zero or nonzero, and if nonzero, whether it is less than, equal to, or greater than three. In this decision, the algorithm can be applied which is illustrated in FIG. 11 and explained in the description of the embodiment 4, for example. As a result of the decision, if the error number is greater than three, the computations are avoided of the error-locator polynomial and error-value polynomial by the Euclidean algorithm computing circuit 3 using the Euclidean algorithm and the operation processings of the error locations, and of the error values through the Chien's search by the Chien's search circuit 4, thus outputting the received word stored in the received word storing circuit 5 from the error correcting circuit 7 without change.

If the decision result indicates that the error number is nonzero and not greater than three, the Euclidean algorithm computing circuit 3 sets, from the error number condition decided by the error number estimating circuit 9, the initial values and ending condition, and computes the error-locator polynomial and error-value polynomial using the initial values and ending condition as in the embodiment 7. Then, the error-locator polynomial and error-value polynomial computed are delivered to the Chien's search circuit 4, which computes the error locations and error values having occurred at these locations, and has the computed result storing circuit 6 store them. The error correcting circuit 7, having the received word storing circuit 5 sequentially output the contents of the received word stored in the received word storing circuit 5, corrects, by using information on the error locations and error values stored in the computed result storing circuit 6, the errors of the symbols corresponding to the error locations by adding to them the error values having occurred at the locations.

As described above, the present embodiment 8 has an advantage that it can further reduce the number of steps required for decoding the received word because it can omit the Euclidean algorithm computing operation and Chien's search operation when the error number exceeds the maximum error correctable number as a result of the decision carried out by the error number estimating circuit 2 whether the error number having occurred in the portion other than the extended component in the received word is less than, equal to, or greater than the maximum error correctable number of the extended RS code.

EMBODIMENT 9

As an embodiment 9 in accordance with the present invention, an error correcting method of a singly extended RS code will be described. First, the principle of the error correction of the singly extended RS code will be described.

In the embodiment 9, it is assumed as in the description of the conventional technique that the singly extended RS code has a code length of n, an information symbol number of k, and a minimum distance of d=n−k+1=2t+1, where t is a positive integer, and that the characteristic of the Galois field is two for simplicity.

It is further assumed that an error word $E=(e_{n-2}, e_{n-3}, \ldots, e_0, e_{-1})$ is added on a channel to a transmitted word $C=(c_{n-2}, c_{n-3}, \ldots, c_0, c_{-1})$ which is a code word of the singly extended RS code, that errors equal to or less than $t=[(d-1)/2]$ symbols have occurred, and that the number of nonzero components of the error word E is equal to or less than t symbols, where an error having occurred in the extended component is not counted as one symbol, but as ½ symbol. In these conditions, the received word $R=(r_{n-2}, r_{n-3}, \ldots, r_0, r_{-1})$ can be computed by the following equation (65).

$$R=C+E=(c_{n-2}+e_{n-2}, c_{n-3}+e_{n-3}, \ldots, c_0+e_0, c_{-1}+e_{-1}) \quad (65)$$

To estimate the transmitted word c from the received word R, a syndrome $S=(S_0, S_1, \ldots, S_{2t-2}, S_{2t-1})$ including error information is computed by the following equation (66).

$$S=H^TR=H\,(^tC+^tE)=H^TE \quad (66)$$

where H is the parity matrix given by the foregoing expression (5).

Thus, the syndromes are given by the following equations (67) and (68).

$$S_j=e_{n-2}\alpha^{(b+j)(n-2)}+e_{n-3}\alpha^{(b+j)(n-3)}+\ldots+e_1\alpha^{b+j}+e_0 (j=0, 1, 2, \ldots, 2t-2) \quad (67)$$

$$S_{2t-1}=e_{n-2}\alpha^{(b+2t-1)(n-2)}+e_{n-3}\alpha^{(b+2t-1)(n-3)}+\ldots+e_1\alpha^{b+2t-1}+e_0+e_{-1} \quad (68)$$

If an error has occurred in the extended component ($e_{-1} \neq 0$), the syndrome affected by that error is $S_{2t-1}$. It is assumed here that the number s of the errors occurred in interior codes is $s \leq t$ (or $s \leq t-1$ when an error has occurred in the extended component), and that the set of the error locations is expressed as $L=\{i|e_i \neq 0, 0 \leq i \leq n-2\}$. In addition, each element of the error-location set L is expressed by 1[k], where $k=0, 1, \ldots, s-1$, and corresponding error values are $e_{1[k]}$. In this case, the foregoing equations (67) and (68) can be reduced as the following equations (69) and (70).

$$S_j=e_{l[0]}\alpha^{(b+j)l[0]}+e_{l[1]}\alpha^{(b+j)l[1]}+\ldots+e_{l[s-1]}\alpha^{(b+j)l[s-1]} (j=0, 1, 2, \ldots, 2t-2) \quad (69)$$

$$S_{2t-1}=e_{-1}+e_{l[0]}\alpha^{(b+2t-1)l[0]}+e_{l[1]}\alpha^{(b+2t-1)l[1]}+\ldots+e_{l[s-1]}\alpha^{(b+2t-1)l[s-1]} \quad (70)$$

A syndrome polynomial is formed as the following equation (71) having $S_{2t-1}$ affected by the extended component as a constant term.

$$S(x)=S_{2t-1}+S_{2t-2}x+\ldots+S_1x^{2t-2}+S_0x^{2t-1} \quad (71)$$

Equation (71) can be reduced as the following equation (72) using the foregoing equations (69) and (70).

$$S(x) = e_{-1} + \sum_{j=0}^{2t-1}\sum_{k=0}^{s-1} e_{l[k]}\alpha^{(b+2t-1-j)l[k]}x^j \quad (72)$$

$$= e_{-1} + \sum_{j=0}^{\infty}\sum_{k=0}^{s-1} e_{l[k]}\alpha^{(b+2t-1-j)l[k]}x^j \mod x^{2t}$$

$$= e_{-1} + \sum_{k=0}^{s-1} e_{l[k]}\alpha^{(b+2t-1)l[k]} \sum_{j=0}^{\infty}\alpha^{-jl[k]}x^j \mod x^{2t}$$

$$= e_{-1} + \sum_{k=0}^{s-1} e_{l[k]}\alpha^{(b+2t-1)l[k]}(1+\alpha^{-1[k]}x)^{-1} \mod x^{2t}$$

The error-locator polynomial σ(x) is formed as the following equation (73).

$$\sigma(x)=(1+\alpha^{-1[0]}x)(1+\alpha^{-1[1]}x) \ldots (1+\alpha^{-1[s-1]}x) \quad (73)$$

Multiplying both sides of equation (72) by equation (73) gives the following equation (74).

$$S(x)\sigma(x)=e_{-1}\sigma(x)+\Sigma_{k=0}^{s-1}e_{1[k]}\alpha^{(b+2t-1)l[k]}\Pi_{j \neq k}(1+\alpha^{-1[k]}x) \mod x^{2t} \quad (74)$$

Representing the right-hand side by ω(x) reduces the foregoing equation (74) to the following equation (75), thus obtaining a so-called fundamental equation.

$$\sigma(x)S(x)\equiv\omega(x) \mod x^{2t} \quad (75)$$

where ω(x) is called an error-value polynomial, which differs from a common one in that the first term $e_{-1}\sigma(x)$ appears if an error has occurred in the extended component (that is, if $e_{-1} \neq 0$). In this case, the degree of the error-locator polynomial σ(x) agrees with the degree of the error-value polynomial ω(x). Both the error-locator polynomial σ(x) and error-value polynomial ω(x) satisfy the foregoing fundamental equation. Extracting another feature of them gives the following condition 1 with respect to the degree because at most t symbol errors are supposed.

[Condition 1]: If errors have occurred in s($\leq$t) symbols, then degσ=[s] and degω$\leq$[s−½] (in particular, although degσ$\geq$degω, if an error has occurred in the extended component, degσ=degω).

In addition, the following condition 2 is obtained from the foregoing equations (73) and (74).

[Condition 2]: σ(x) and ω(x) are prime to each other (that is, have no common root).

Furthermore, the fundamental equation (75) is equivalent to the following expression (76) formed by using a suitable polynomial Φ(x).

$$\Phi(x)x^{2t}+\sigma(x)S(x)=\omega(x) \quad (76)$$

Here, the error-locator polynomial and error-value polynomial which satisfy the fundamental equation are obtained under the assumption that the syndrome polynomial is known, in which case the existence and uniqueness of the in solution can be proved. The following is the constructive proof using the Euclidean algorithm.

Combinations of polynomials $(A_k(x), B_k(x), R_k(x))$, where $k \geq -1$ are defined as the following expressions (77) and (78).

$$A_{-1}(x)=1, B_{-1}(x)=0, R_{-1}(x)=x^{2t} \quad (77)$$

$$A_0(x)=0, B_0(x)=1, R_0(x)=S(x) \quad (78)$$

For $k \geq 1$, they are defined by the following expressions (79)–(81) by designating as $Q_k(x)$ the quotient polynomial obtained by sequentially dividing $R_{k-2}(x)$ by $R_{k-1}(x)$.

$$A_k(x)=A_{k-2}(x)+Q_k(x)A_{k-1}(x) \quad (79)$$

$$B_k(x)=B_{k-2}(x)+Q_k(x)B_{k-1}(x) \quad (80)$$

$$R_k(x)R_{k-2}(x)+Q_k(x)R_{k-1}(x) \quad (81)$$

By definition, the degree of the $B_k(x)$ is monotonically increasing, that is, $\deg B_{k-1} < \deg B_k$, and the degree of the $R_k(x)$ is monotonically decreasing, that is, $\deg R_{k-1} > \deg R_k$. In addition, with regard to the polynomial combinations $(A_k(x), B_k(x), R_k(x))$, the following equations (82)–(84) are proved using the mathematical induction.

$$A_k(x)x^{2t} + B_k(x)S(x) = R_k(x) \quad (k \geq -1) \tag{82}$$

$$B_k(x)R_{k-1}(x) + B_{k-1}(x)R_k(x) = x^{2t}(k \geq -1) \tag{83}$$

$$A_k(x)B_{k-1}(x) + A_{k-1}(x)B_k(x) = 1 (k \geq -1) \tag{84}$$

Here, the foregoing equation (82) will be described as an example. It is obvious from equations (77) and (78) that equation (82) holds when k=−1 and 0. Besides, it is found from the following equation (85) that it holds at k under the assumption that it holds up to k−1. In the following reductions, equations (79)–(81) are used.

$$A_k(x)x^{2t} + B_k(x)S(x)$$
$$= (A_{k-2}(x) + Q_k(x)A_{k-1}(x))x^{2t} + (B_{k-2}(x) + Q_k(x)B_{k-1}(x))S(x)$$
$$= A_{k-2}(x)x^{2t} + B_{k-2}(x)S(x) + Q_k(x)(A_{k-1}(x)x^{2t} + B_{k-1}(x)S(x))$$
$$= R_{k-2}(x) + Q_k(x)R_{k-1}(x)$$
$$= R_k(x) \tag{85}$$

The remaining equations (83) and (84) can also be proved using the mathematical induction. Although it is seen from equation (82) that $(B_k(x), R_k(x))$ are candidates of the error-locator polynomial and error-value polynomial, the following shows that they give true error-locator polynomial and error-value polynomial for a suitable k.

First, note facts that the degree of $B_k(x)$ is monotonically increasing and the degree of $R_k(x)$ is monotonically decreasing, and that the following equation (86) holds from the foregoing equation (83).

$$2t = d\,e\,g\,x^{2t} = d\,e\,g\,(B_k R_{k-1} + B_{k-1} R_k) = d\,e\,g\,B_k R_{k-1} = d\,e\,g\,B_k + d\,e\,g\,R_{k-1} \tag{86}$$

Noting that the $\deg R_k$ is monotonically decreasing, such k exists that satisfies the conditions given by the following expression (87).

$$d\,e\,g\,R_{k-1} \text{ and } d\,e\,g\,R_k < t \tag{87}$$

It is found from equation (86) that the following equation (88) holds with respect to the degree of $B_k$.

$$d\,e\,g\,B_k = 2t - d\,e\,g\,R_{k-1} \leq t \tag{88}$$

Equation (82) holds for this k. Thus, the following equation (89) can be obtained by summing up respective sides of a product obtained by multiplying equation (76) by $B_k$ and of a product obtained by multiplying equation (82) by $\sigma(x)$.

$$(B_k(x)\Phi(x) + \sigma(x)A_k(x))x^{2t} = B_k(x)\omega(x) + \sigma(x)R_k(x) \tag{89}$$

Here, considering that the right-hand side of equation (89) is a polynomial with a degree equal to or less than 2t−1 because of the foregoing condition 1 and equations (87) and (88), and that its left-hand side is a polynomial with a degree equal to or greater than 2t unless the interior of ( ) is zero, it is possible to draw a conclusion that ( )=0. Thus, the following equations (90) and (91) can be obtained.

$$B_k(x)\Phi(x) = \sigma(x)A_k(x) \tag{90}$$

$$B_k(x)\omega(x) = \sigma(x)R_k(x) \tag{91}$$

Noting that $\sigma(x)$ and $\omega(x)$ are prime to each other (having no common root) from the foregoing condition 2, there exists a suitable polynomial $\lambda(x)$, and the following equations (92)–(94) can be obtained.

$$B_k(x) = \lambda(x)\sigma(x) \tag{92}$$

$$R_k(x) = \lambda(x)\omega(x) \tag{93}$$

$$A_k(x) = \lambda(x)\Phi(x) \tag{94}$$

On the other hand, since $A_k(x)$ and $B_k(x)$ are prime to each other from equation (84), it is found that $\lambda(x)$ reduces to a constant. Therefore, it is possible to conclude that $(B_k(x), R_k(x))$ can give desired solutions which differ only in a fixed number multiple. In other words, $(B_k(x)/B_k(O), R_k(x)/B_k(O))$ are true error-locator polynomial $\sigma(x)$ and error-value polynomial $\omega(x)$.

The error-location set L can be obtained by examining the roots of $B_k(x)$. Once the error-location set L has been obtained, error magnitude $e_{l[k]}$ at each l[k] can be obtained by the following equation (95).

$$e_{l[k]} = \frac{\omega(\alpha^{l[k]})}{\sigma'(\alpha^{l[k]})\alpha^{(b+2t)l[k]}} \tag{95}$$

where $\sigma'$ denotes a formal differential of $\sigma$.

Although the agreement between the degree of the error-locator polynomial $\sigma(x)$ and that of the error-value polynomial $\omega(x)$ indicates that an error has occurred in the extended component, the magnitude of the error can be obtained by dividing the highest degree coefficient of the error-value polynomial $\omega(x)$ by that of the error-locator polynomial $\omega(x)$.

Figure 16:
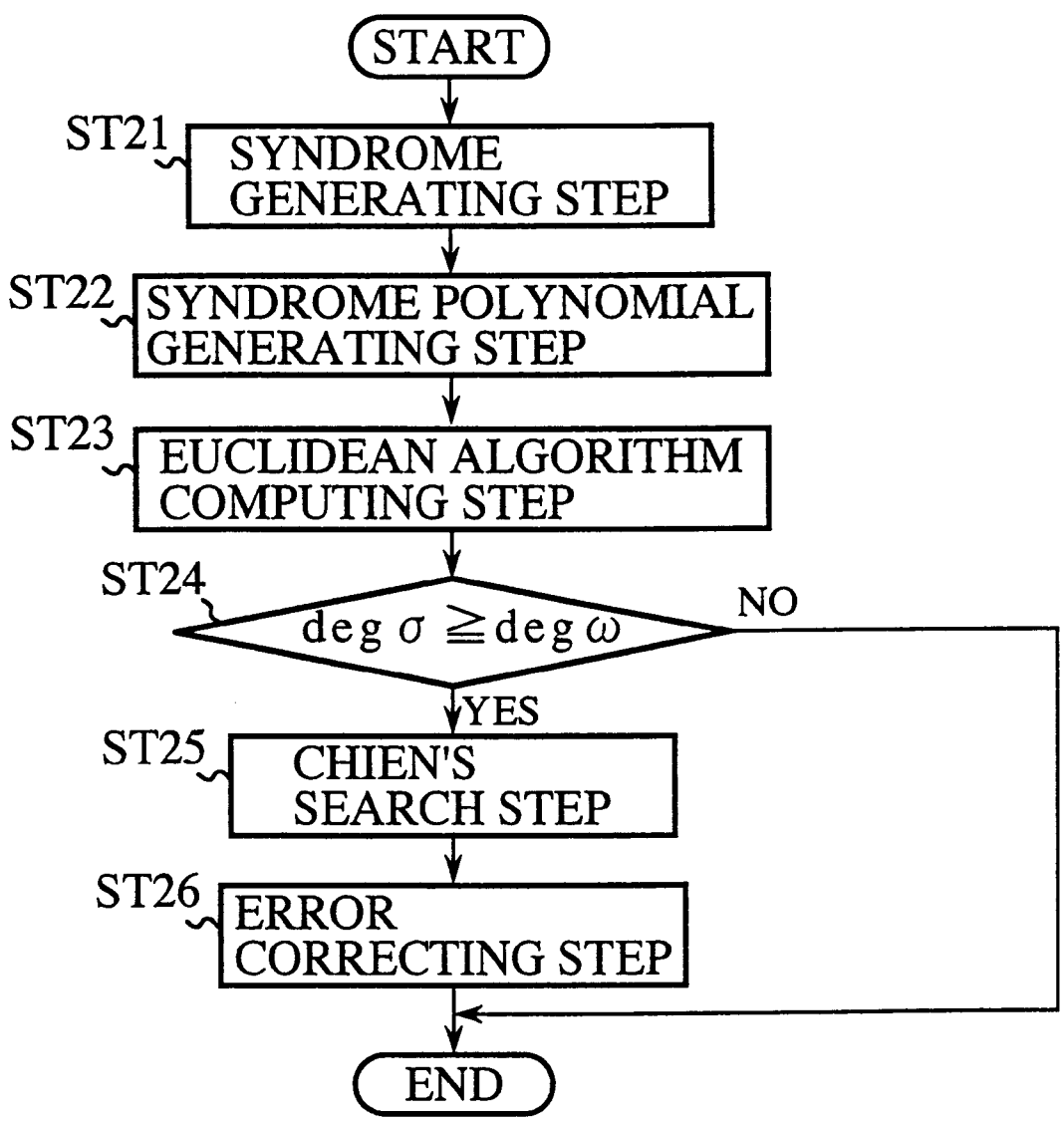
FIG. 16 is a flowchart illustrating a processing procedure of an embodiment 9 of an error correcting method of a singly extended RS code in accordance with the present invention.

FIG. 16 is a flowchart illustrating the processing procedure of the embodiment 9 of the error correcting method of the singly extended RS code, in which the foregoing error correcting method is applied to a (128, 122) singly extended RS code on the Galois field $GF(2^7)$ whose b=1 and minimum distance is seven. In FIG. 16, ST21 designates a syndrome generating step of computing syndromes from a received word, and ST22 designates a syndrome polynomial generating step of generating a syndrome polynomial such that a term including error information about the extended component in the syndromes computed in the syndrome generating step ST21 occupies the position of the constant term.

ST23 designates a Euclidean algorithm computing step of computing the error-locator polynomial and error-value polynomial by the Euclidean algorithm using the syndrome polynomial the syndrome polynomial generating step ST22 has generated as the initial values; and ST24 designates a comparing step of comparing the degree of the error-locator polynomial with that of the error-value polynomial obtained in the Euclidean algorithm computing step ST23. ST25 designates a Chien's search step of computing the error locations and error values by performing Chien's search on the error-locator polynomial and error-value polynomial if a decision has been made in the comparing step ST24 that the degree of the error-value polynomial is less than that of the error-locator polynomial; and ST26 designates an error correcting step of correcting errors of the received word on the basis of the error locations and error values obtained in the Chien's search step ST25.

Next, the operation will be described.

First, syndromes $S_i$, where i=0, 1, . . . , 5, are computed from the received word using expression (6) in the syndrome generating step ST21. Subsequently, in the syndrome polynomial generating step ST22, the syndrome polynomial is set as the following equation (96) by setting as the constant term the syndrome $S_5$ to which the extended component contributes.

$$S(x)=S_5+S_4x+\ldots+S_1x^4+S_0x^5 \quad (96)$$

Figure 17:
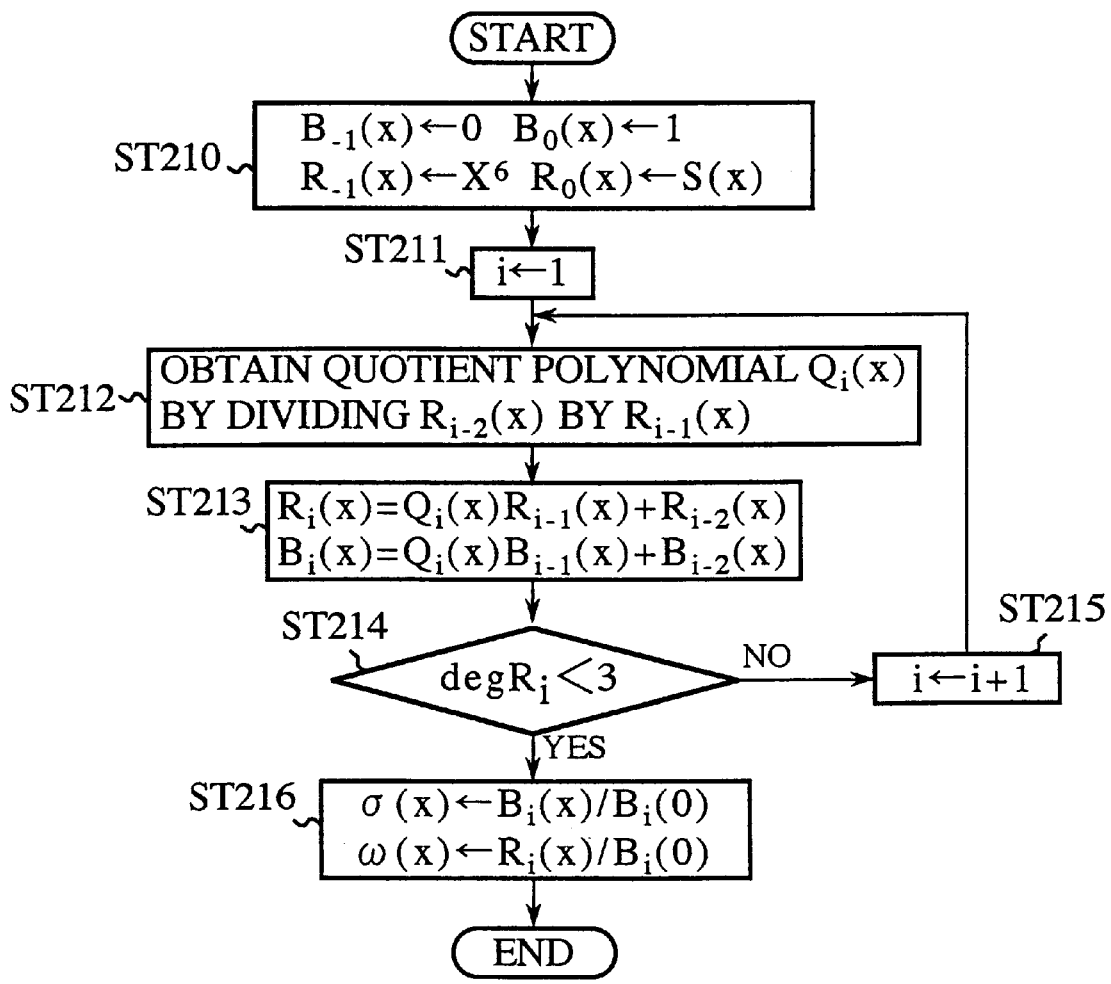
FIG. 17 is a flowchart illustrating details of a processing procedure of a Euclidean algorithm computing step in he embodiment 9.

Afterward, the computation of the Euclidean algorithm is carried out using the syndrome polynomial $S(x)$ in the Euclidean algorithm computing step ST23. FIG. 17 is a flowchart illustrating details of the processing procedure of the Euclidean algorithm computing step ST23. First, as illustrated in FIG. 17, the initial values of the Euclidean algorithm are set by the following equations (97) and (98) at step 210.

$$B_{-1}(x)=0, B_0(x)=1 \quad (97)$$

$$R_{-1}(x)=x^6, R_0(x)=S(x) \quad (98)$$

Then, after initializing the variable i to one at step ST211, a quotient polynomial $Q_i(x)$ is obtained by dividing the polynomial $R_{i-2}(x)$ by $R_{i-1}(x)$ at step ST212, and $R_i(x)$ and $B_i(x)$ are computed at step ST213 using the following equations (99) and (100).

$$R_i(x)=Q_i(x)\,R_{i-1}(x)+R_{i-2}(x) \quad (99)$$

$$B_i(x)Q_i(x)B_{i-1}(x)+B_{i-2}(x) \quad (100)$$

Afterward, a decision is made whether the degree of the $R_i(x)$ has become less than three at step ST214. If it has not yet become less than three, the processings from step ST212 and onward are iterated, with incrementing the variable i at step ST215. On the contrary, if a decision is made at step ST214 that the degree of $R_i(x)$ has become less than three, substitutions are made as $\sigma(x)=B_i(x)/B_i(0)$ and $\omega(x)=R_i(x)/B_i(0)$ at step ST216, thus completing the Euclidean algorithm computing step ST23.

Afterward, in the comparing step ST24, the degree of the error-locator polynomial $\sigma(x)$ is compared with the degree of the error-value polynomial $\omega(x)$. As a result, unless $\deg\sigma \geq \deg\omega$ holds, the received word is output without change as some error is detected. On the contrary, if $\deg\sigma \geq \deg\omega$ holds, the Chien's search is performed on the error-locator polynomial $\sigma(x)$ and error-value polynomial $\omega(x)$ in the Chien's search step ST25 to compute the error locations and error magnitudes. If the equal sign holds, it is estimated that an error has occurred in the extended component.

If the error number agrees with the degree of the error-locator polynomial computed in the Chien's search step ST25, the errors are corrected in the Chien's search step ST25 so that the corrected results are output. On the other hand, if the error number disagrees with the degree of the error-locator polynomial, the processing is stopped at the point of the error detection, and the received word is output without correction.

Thus, in contrast with the conventional error correcting method of a singly extended RS code using the Euclidean algorithm where the Euclidean algorithm computations must be carried out twice in the worst case, which presents a problem of delaying decoding, the present embodiment 9 has an advantage of completing the processings by a single Euclidean algorithm computation, and of facilitating the decision whether an error has occurred in the extended component or not by comparing the degree of the error-locator polynomial with that of the error-value polynomial using the Euclidean algorithm computation.

EMBODIMENT 10

Although the present invention is applied in the foregoing embodiment 9 to the error correcting method of the singly extended RS code which implements the error correction of the singly extended RS code by the Euclidean algorithm, it can also be applied to the error correcting method of the singly extended RS code which implements the erasure and error correction of the singly extended RS code. Such an embodiment 10 in accordance with the present invention will now be described beginning from the principle of the erasure and error correcting method of the singly extended RS code. Here, the present embodiment 10 will be explained using a singly extended RS code with a code length of n, an information symbol number of k, and a minimum distance of d=n−k+1=2t+1, where t is a positive integer. Besides, the characteristic of the Galois field is assumed to be two.

Syndromes $S_0, S_1, \ldots, S_{2t-1}$ are computed from an input received word, and a syndrome polynomial is formed therefrom as the foregoing equation (71). In addition, the elements of a set M are represented by m[k], where k=0, 1, . . . , h−1, and M is a set of interior symbols which are decided as erased according to erasure flags accompanying the received word. Furthermore a set of random errors other than the erasure is denoted by L, and the elements of the set L is represented by l[k], where k=0, 1, . . . , s−1.

The method will now be described of correcting the erasure and random errors under the assumption that $2s+h \leq 2t$ holds. In this case, a random error having occurred in the extended component is counted as ½ instead of one. With generating erasure-locator coefficient $\alpha^{-m[k]}$ from the elements m[k] of the set of the erasure locations, a polynomial of the following expression (101) which is called an erasure-locator polynomial is formed using the erasure-locator coefficients.

$$\Lambda(x)=(1+\alpha^{-m[0]}x)(1+\alpha^{-m[1]}x)\ldots(1+\alpha^{-m[h-1]}x) \quad (101)$$

In addition, an error-locator polynomial $\sigma(x)$ is formed from the random errors other than the extended component as in equation (73). Computing $\sigma(x)\Lambda(x)S(x)$ modulo $x^{2t}$ as in equation (72) of the embodiment 9 gives a polynomial with a degree of less than or equal to [h+s−½]. Denoting the polynomial by $\pi(x)$ gives the following fundamental equation (102) as in the embodiment 9.

$$\sigma(x)\Lambda(x)S(x)=\pi(x)\,mod\,x^{2t} \quad (102)$$

The $\pi(x)$ is a polynomial including information on the magnitude of errors at the error locations and erasure locations. This polynomial will be called error-erasure-value polynomial from now on. Here, a polynomial called an amended-syndrome polynomial is defined by the following expression (103).

$$T(x)=\Lambda(x)S(x)\,mod\,x^{2t} \quad (103)$$

The degree of the polynomial is equal to or less than 2t−1 by the definition. Substituting it into the foregoing fundamental equation (102) results in the following equation (104).

$$\sigma(x)T(x)=\pi(x)\,mod\,x^{2t} \quad (104)$$

The fundamental equation is equivalent to the following equation (105) represented using a suitable polynomial $\psi(x)$.

$$\phi(x)x^{2t}+\sigma(x)T(x)=\pi(x) \tag{105}$$

The error-locator polynomial $\sigma(x)$ and error-erasure-value polynomial $\pi(x)$ satisfy the foregoing fundamental equation. Beside, extracting other features gives the following condition 3 about the degree.

[Condition 3]: If $\deg\sigma=[s]$, then $\deg\pi\leq[h+s-\frac{1}{2}]$ where "deg" represents the degree of the polynomial.

Furthermore, the following condition 4 is obtained corresponding to the condition 2 in the embodiment 9.

[Condition 4]: $\sigma(x)$ and $\pi(x)$ are prime to each other (which means that they have no common root).

The roots of the fundamental equation satisfying the conditions 3 and 4 can be obtained using the Euclidean algorithm as in the embodiment 9.

The outline of the method will be described.

First, the initial values of the Euclidean algorithm are set as the following expressions (106) and (107).

$$A_{-1}(x)=1, B_{-1}(x)=0, R_{-1}(x)=x^{2t} \tag{106}$$

$$A_0(x)=0, B_0(x)=1, R_0(x)=T(x) \tag{107}$$

Here, it is proved that $(A_k(x), B_k(x), R_k(x))$ sequentially generated as in equations (79)–(81) satisfy the following equation (108) by using mathematical induction as with equation (82) in the embodiment 9.

$$A_k(x)x^{2t}+B_k(x)T(x)=R_k(x) \quad (k\geq -1) \tag{108}$$

Equations (83) and (84) hold in a similar manner. Although equation (108) suggests that $(B_k(x), R_k(x))$ are candidates of the error-locator polynomial and error-erasure-value polynomial, the following will show that it gives true error-locator polynomial and error-erasure-value polynomial for suitable k.

First, since the degree of $R_k(x)$ is monotonically decreasing, a certain k exists that satisfy the following inequality (109).

$$\deg R_{k-1}\geq[(2t+h+1)/2],$$

$$\deg R_k<[(2t+h+1)/2] \tag{109}$$

In this case, it is seen from equation (86) that the following expression (110) holds with respect to the degree of $B_k$.

$$\deg B_k=2t-\deg R_{k-1}\leq[(2t-h)/2] \tag{110}$$

Equation (108) holds for this k. The following equation (111) is obtained by summing up equation (105) multiplied by $B_k(x)$ and equation (108) multiplied by $\sigma(x)$ with respect to both sides.

$$(B_k(x)\phi(x)+\sigma(x)A_k(x))x^{2t}=B_k(x)\pi(x)+\sigma(x)R_k(x) \tag{111}$$

From the foregoing condition 3 and equations (109) and (110), a conclusion is drawn that ( )=0 because the right-hand side of equation (111) is a polynomial with a degree of at most 2t−1, whereas the left-hand side thereof is a polynomial with a degree of at least 2t unless the contents in ( ) is zero. Thus, it is proved that $(B_k(x), R_k(x))$ is a constant multiple of $(\sigma(x), \pi(x))$ using the condition 4 and equation (84) as in the embodiment 9. Therefore, desired roots can be obtained by setting as $\sigma(x)=B_k(x)/B_k(0)$ and $\pi(x)=R_k(x)/B_k(0)$.

Besides, the initial values of the Euclidean algorithm are set as the following expressions (112) and (113).

$$B_{-1}(x)=0, R_{-1}(x)=x^{2t} \tag{112}$$

$$B_0(x)=\Lambda(x), R_0(x)=T(x) \tag{113}$$

Here, performing the Euclidean algorithm by sequentially generating $(B_k(x), R_k(x))$ up to the point where the degree of the $R_k(x)$ becomes less than $[(2t+h+1)/2]$, and substituting $\rho(x)=B_k(x)/B_k(0)$ and $\pi(x)=R_k(x)/B_k(0)$ result in that $\rho(x)$ is equal to $\sigma(x)\Lambda(x)$ and that the roots other than the roots corresponding to the erasure locations correspond to the set L of the random error locations. This $\rho(x)$ is called an error-erasure-locator polynomial from now on. The degree of the error-erasure-locator polynomial $\rho(x)$ and that of the error-erasure-value polynomial $\pi(x)$ satisfy the relationship of $\deg\pi\leq\deg\rho$, where the equal sign holds when an error has occurred in the extended component.

The error magnitudes $e_{m[k]}$ at the erasure locations, where k=0, 1, ..., h−1, can be obtained by the following equation (114), and the error magnitudes $e_{l[k]}$ at the random error locations other than the extended component, where k=0, 1, ..., s−1, can be obtained by the following equation (115).

$$e_{m[k]} = \frac{\pi(\alpha^{m[k]})}{\rho'(\alpha^{m[k]})\alpha^{(b+2t)m[k]}} \tag{114}$$

$$e_{l[k]} = \frac{\pi(\alpha^{l[k]})}{\rho'(\alpha^{l[k]})\alpha^{(b+2t)l[k]}} \tag{115}$$

where $\rho'$ represents the formal differential of $\rho$.

If the degree of the error-erasure-locator polynomial $\rho(x)$ agrees with that of the error-erasure-value polynomial $\pi(x)$, it is seen that an error has occurred in the extended component, and its magnitude can be obtained by dividing the highest degree coefficient of the $\pi(x)$ by that of the $\rho(x)$.

Figure 18:
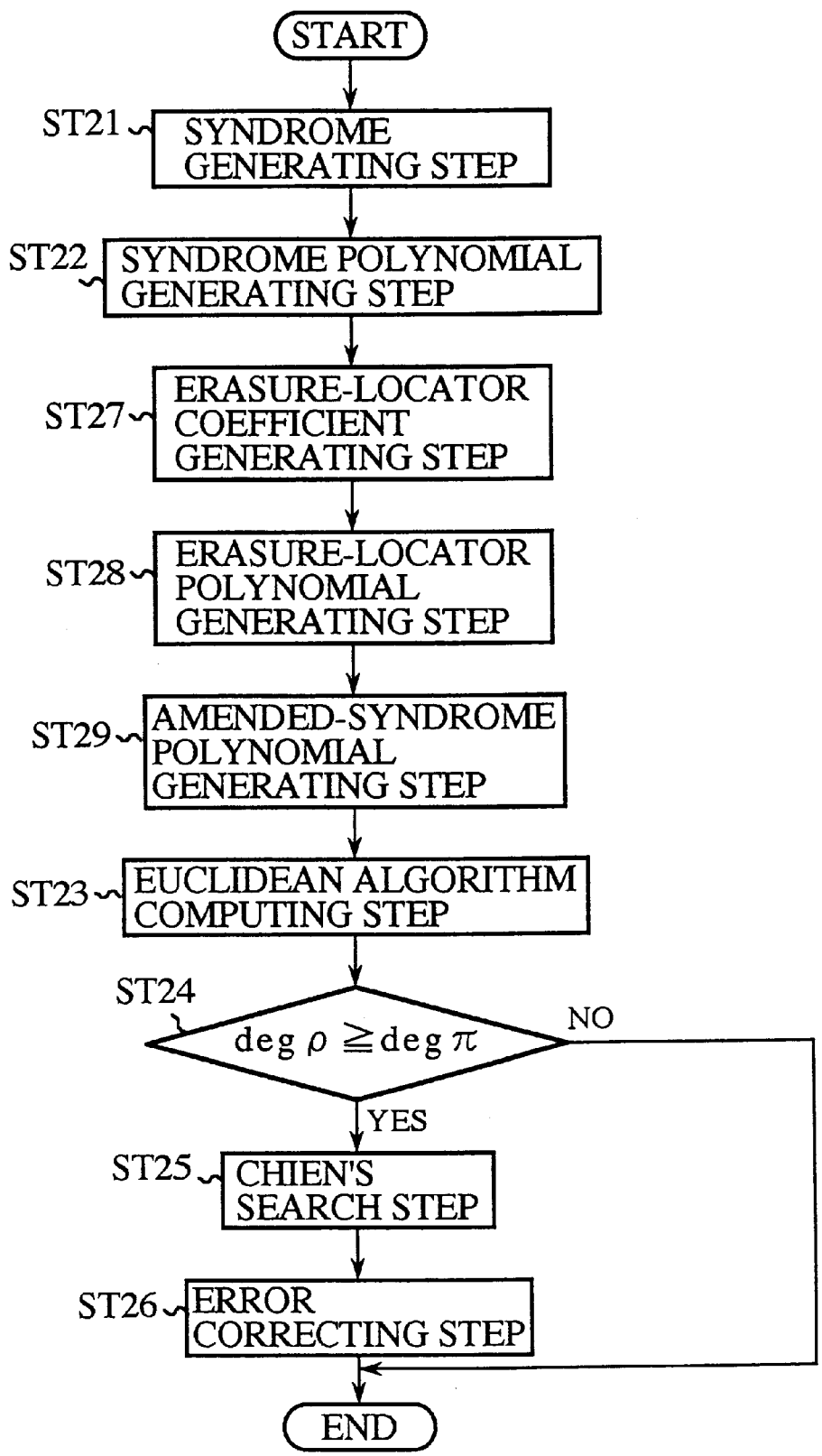
FIG. 18 is a flowchart illustrating a processing procedure of an embodiment 10 of an error correcting method of a singly extended RS code in accordance with the present invention.

FIG. 18 is a flowchart illustrating the processing procedure of an embodiment 10 of the error correcting method of a singly extended RS code in accordance with the present invention, in which the foregoing erasure and error correcting method is applied to a (128, 122) singly extended RS code on the Galois field GF($2^7$) whose b=1 and minimum distance is seven. In FIG. 18, like steps to those of FIG. 16 described in the embodiment 9 are designated by the same reference symbols and the description thereof is omitted here.

In FIG. 18, ST27 designates an erasure-locator coefficient generating step of generating the erasure-locator coefficients from the erasure flags accompanying the received word; and ST28 designates an erasure-locator polynomial generating step of generating the erasure-locator polynomial from the erasure-locator coefficients generated in the erasure-locator coefficient generating step ST27. ST29 designates an amended-syndrome polynomial generating step of generating an amended-syndrome polynomial by multiplying the syndrome polynomial generated in the syndrome polynomial generating step ST22 and the erasure-locator polynomial generated in the erasure-locator polynomial generating step ST28.

The Euclidean algorithm computing step ST23 differs from its counterpart of the embodiment 9 designated by the same reference symbol in FIG. 16 in that it computes the error-erasure-locator polynomial and error-erasure-value polynomial using the amended-syndrome polynomial generated in the amended-syndrome polynomial generating step ST29 as the initial value. Besides, the comparing step ST24 and Chien's search step ST25 differ from their counterparts of the embodiment 9 designated by the same reference characters in FIG. 16 in that the present comparing step ST24 compares the degree of the error-erasure-locator polynomial with that of the error-erasure-value polynomial, and that the present Chien's search step ST25 computes the error locations and error magnitudes from the error-erasure-locator polynomial and error-erasure-value polynomial computed in the Euclidean algorithm computing step ST23.

Next, the operation will be described.

First, syndromes $S_i$, where i=0, 1, . . . , 5, are computed from the received word using expression (6) in the syndrome generating step ST21. Subsequently, in the syndrome polynomial generating step ST22, the syndrome polynomial is generated in accordance with equation (96) by setting as the constant term the syndrome $S_5$ among the syndromes $S_i$, to which the extended component contributes. Subsequently, the erasure-locator coefficients are generated from the erasure flags accompanying the received word in the erasure-locator coefficient generating step ST27. Then, proceeding to the erasure-locator polynomial generating step ST28, the erasure-locator polynomial $\Lambda(x)$ is generated by equation (101) if the erasure number h is equal to or less than six, whereas the erasure correction is not performed if h is equal to or greater than seven. Then, the decoding as described in the embodiment 9 is carried out after setting $\Lambda(x)=1$. In the case where the erasure number h is equal to or less than six, the random errors up to (6−h)/2 can be corrected. For example, if h=3, 3/2 errors, that is, each one error having occurred in the interior code and the extended component can be corrected at the maximum.

Subsequently, the amended-syndrome polynomial T(x) is computed by the following equation (116) in the amended-syndrome polynomial generating step ST29 using the syndrome polynomial S(x) generated in the syndrome polynomial generating step ST22 and the erasure-locator polynomial $\Lambda(x)$ generated in the erasure-locator polynomial generating step ST28.

$$T(x)=\Lambda(x)S(x) \bmod x^6 \qquad (116)$$

Figure 19:
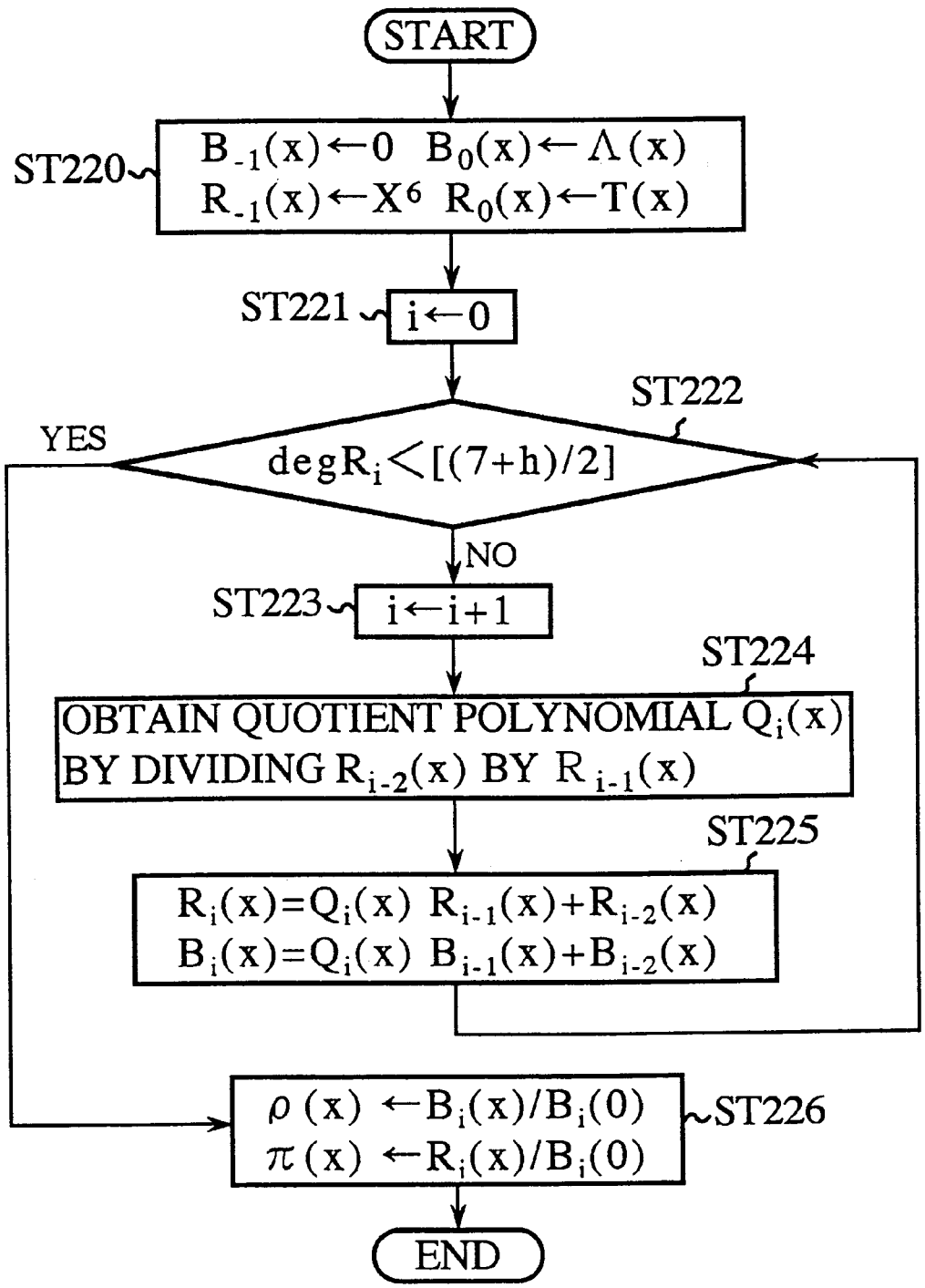
FIG. 19 is a flowchart illustrating details of a processing procedure of a Euclidean algorithm computing. step in the embodiment 10.

Afterward, proceeding to the Euclidean algorithm computing step ST23, the Euclidean algorithm is carried out using the amended-syndrome polynomial T(x). FIG. 19 is a flowchart illustrating details of the processing procedure of the Euclidean algorithm computing step ST23. First, as illustrated in FIG. 19, the initial values of the Euclidean algorithm are set by the following equations (117) and (118) at step 220.

$$B_{-1}(x)=0,\ B_0(x)=\Lambda(x) \qquad (117)$$

$$R_{-1}(x)=x^6,\ R_0(x)=T(x) \qquad (118)$$

Then, after initializing the variable i to zero at step ST221, the degree of $R_i(x)$ is compared with [(7+h)/2] at step ST222. Then, while incrementing the variable i at step ST223, a quotient polynomial $Q_i(x)$ is obtained by dividing the polynomial $R_{i-2}(x)$ by $R_{i-1}(x)$ at step ST224, and ($B_i(x)$, $R_i(x)$) are computed sequentially at step ST225 using equations (99) and (100).

Afterward, at the point where the degree of the $R_i(x)$ has become less than [(7+h)/2], substitutions are made as $\rho(x)=B_i(x)/B_i(0)$ and $\pi(x)=R_i(x)/B_i(0)$ at step ST226, and the Euclidean algorithm computing step ST23 is completed.

Subsequently, in the comparing step ST24, the degree of the error-erasure-locator polynomial $\rho(x)$ is compared with the degree of the error-erasure-value polynomial $\pi(x)$ obtained in the Euclidean algorithm computing step ST23. As a result, unless deg$\rho \geq$ deg$\pi$ holds, the received word is output without change. On the contrary, if deg$\rho \geq$ deg$\pi$ holds, the Chien's search is performed on the error-erasure-locator polynomial $\rho(x)$ and error-erasure-value polynomial $\pi(x)$ in the Chien's search step ST25 to compute the error locations and error magnitudes by equations (114) and (115).

If the error number agrees with the degree of the error-erasure-locator polynomial $\rho(x)$ detected in the Chien's search step ST25, the errors are corrected so that the corrected results are output. On the other hand, if the error number disagrees with the degree of the error-erasure-locator polynomial $\rho(x)$, the processing is terminated at the error detection, and the received word is output without correction.

Thus, the present embodiment 10 has an advantage of completing the erasure and error correction of a singly extended RS code by a single Euclidean algorithm computation, and of facilitating the decision whether an error has occurred in the extended component or not by comparing the degree of the error-erasure-locator polynomial with that of the error-erasure-value polynomial detected by the Euclidean algorithm computation.

EMBODIMENT 11

Figure 20:
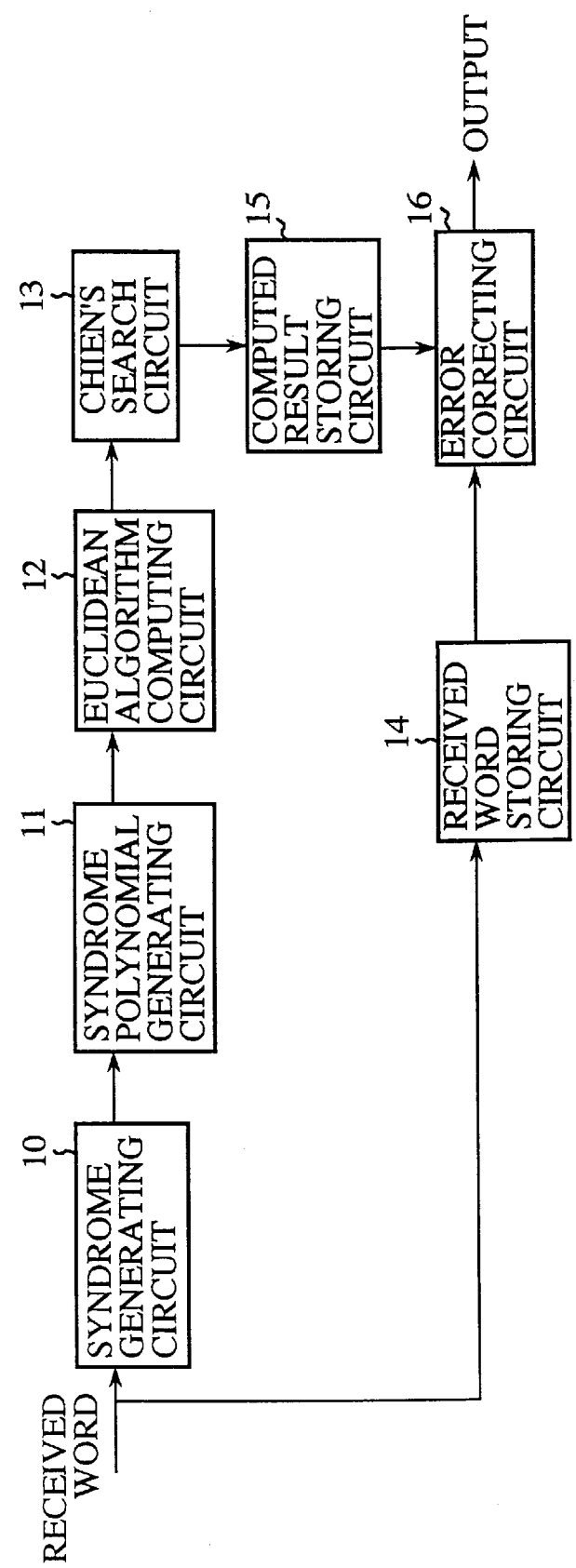
FIG. 20 is a block diagram showing an embodiment 11 of an errors correcting decoding apparatus of a singly extended RS code in accordance with the present invention.

Although the foregoing embodiments 9 and 10 describe the error correcting method of the singly extended RS code, it is possible to implement an error correcting apparatus based on the method. FIG. 20 is a block diagram showing an embodiment 11 of an error correcting apparatus of the singly extended RS code in accordance with the present invention. In FIG. 20, the reference numeral 10 designates a syndrome generating circuit for generating syndromes from a received word; and 11 designates a syndrome polynomial generating circuit for generating from the syndromes computed in the syndrome generating circuit 10 a syndrome polynomial which defines the initial values of the Euclidean algorithm such that the syndrome polynomial includes in its constant term a syndrome having the error information about the extended component of the syndromes.

The reference numeral 12 designates a Euclidean algorithm computing circuit for computing the error-locator polynomial and error-value polynomial using the Euclidean algorithm after setting the syndrome polynomial generated by the syndrome polynomial generating circuit 11 as the initial values. The reference numeral 13 designates a Chien's search circuit for computing the error locations and error values by performing the Chien's search of the error-locator polynomial and error-value polynomial computed by the Euclidean algorithm computing circuit 12. The reference numeral 14 designates a received word storing circuit for storing the incoming received words; and 15 designates a computed result storing circuit for storing the error locations and error values computed by the Chien's search circuit 13. The reference numeral 16 designates an error correcting circuit for correcting the received words stored in the received word storing circuit 14 on the basis of the error locations and error values stored in the computed result storing circuit 15.

Next, the operation will be described.

The following description is provided taking as an example a (128, 122) singly extended RS code on the Galois field $GF(2^7)$ whose b=1 and minimum distance is seven.

An incoming received word is delivered to the syndrome generating circuit 10 and received word storing circuit 14. Receiving the received word, the syndrome generating circuit 10 generates the syndromes $S_i$ of the received word, where i=0, 1, . . . , 5, and delivers them to the syndrome polynomial generating circuit 11. The received word storing circuit 14 stores the incoming received word. The syndrome polynomial generating circuit 11 generates the syndrome polynomial shown by equation (96) by setting as its constant term the syndrome $S_5$ from among the syndromes generated by the syndrome generating circuit 10, the syndrome $S_5$ being affected by the extended component.

The syndrome polynomial generated by the syndrome polynomial generating circuit 11 is fed to the Euclidean algorithm computing circuit 12. The Euclidean algorithm computing circuit 12 computes the error-locator polynomial $\sigma(x)$ and error-value polynomial $\omega(x)$ by performing the Euclidean algorithm computation using the syndrome polynomial. In this case, it compares the degree of the error-locator polynomial $\sigma(x)$ with that of the error-value polynomial $\omega(x)$, and unless $\deg\omega \leq \deg\sigma$ holds, it outputs the received word without correction with an indication of error detection. On the other hand, if the condition holds, it delivers the error-locator polynomial $\sigma(x)$ and error-value polynomial $\omega(x)$ to the Chien's search circuit 13 which computes the error locations and error values. The computed error locations and error values are temporarily stored in the computed result storing circuit 15.

If the error number detected by the Chien's search circuit 13 equals the degree of the error-locator polynomial $\sigma(x)$, the error correcting circuit 16, reading the error locations and error values which have been computed by the Chien's search circuit 13 and stored in the computed result storing circuit 15, corrects the errors of the symbols of the received word stored in the received word storing circuit 14 by subtracting from the symbols at the error locations the error values corresponding to the error locations, and outputs the corrected received word. On the other hand, unless the detected error number equals the degree of the error-locator polynomial $\sigma(x)$, the received word stored in the received word storing circuit 14 is output without correction with an indication of the error detection.

Thus, in contrast with the conventional error correcting apparatus of a singly extended RS code using the Euclidean algorithm where the Euclidean algorithm computations must be carried out twice in the worst case, which presents a problem of delaying decoding, the present embodiment 11 has an advantage of completing the processings by a single Euclidean algorithm computation, and of reducing the cost because the error correcting apparatus of the singly extended RS code in accordance with the present invention can be constructed by a minor improvement of the conventional error correcting apparatus of the RS code.

EMBODIMENT 12

Figure 21:
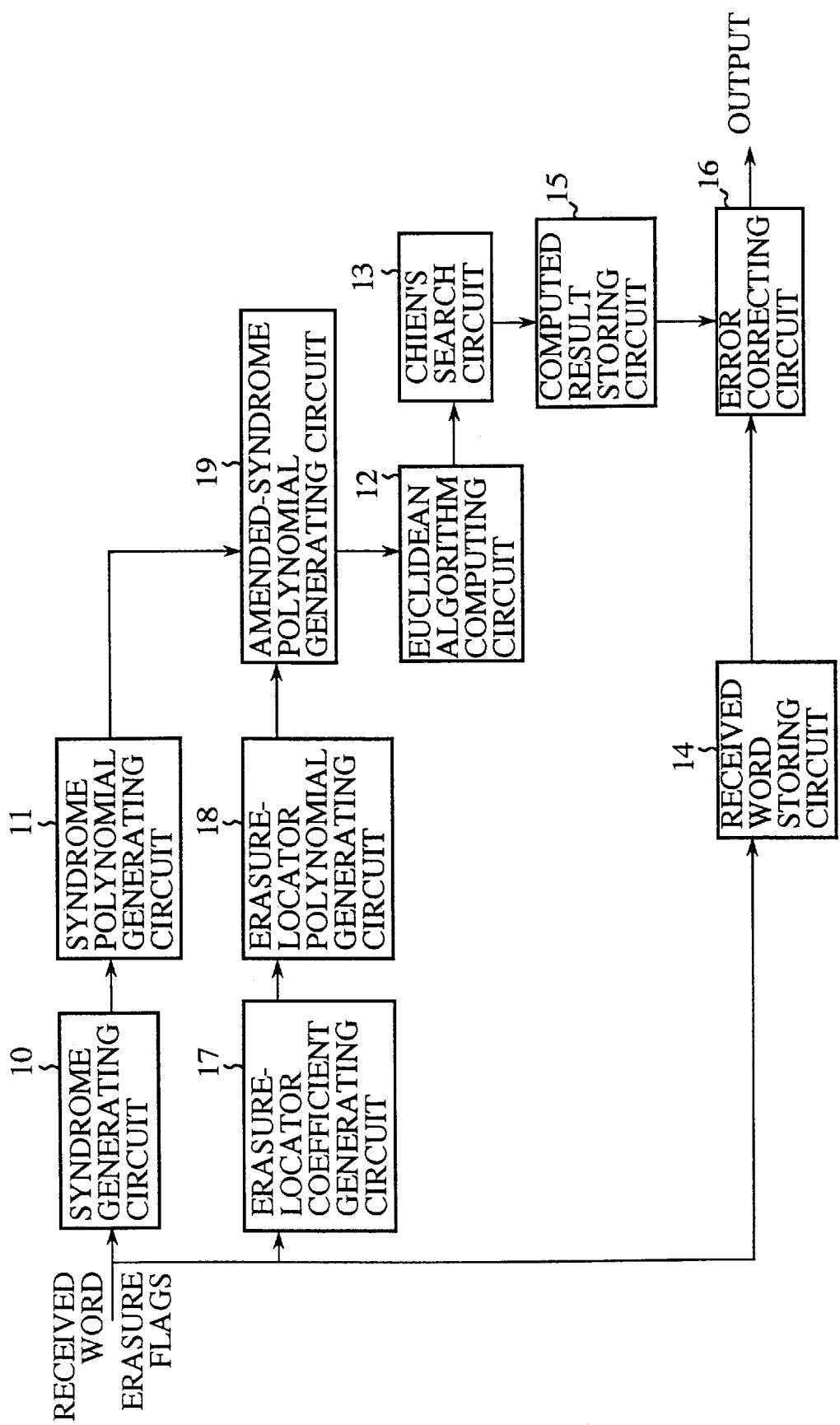
FIG. 21 is a block diagram showing an embodiment 12 of an error correcting decoding apparatus of a singly extended RS code in accordance with the present invention.

Although the foregoing embodiment 11 deals with the error correcting apparatus of the singly extended RS code for performing error correction of the singly extended RS code using the Euclidean algorithm, it is also possible to apply to the error correcting apparatus of the singly extended RS code for performing erasure and error correction of the singly extended RS code. FIG. 21 is a block diagram showing an embodiment 12 of an error correcting apparatus of the singly extended RS code in accordance with the present invention. In FIG. 21, the reference numeral 17 designates an erasure-locator coefficient generating circuit for generating the erasure-locator coefficients from the erasure flags accompanying the received word; 18 designates an erasure-locator polynomial generating circuit for generating the erasure-locator polynomial from the erasure-locator coefficients generated by the erasure-locator coefficient generating circuit 17; and 19 designates an amended-syndrome polynomial generating circuit for generating an amended-syndrome polynomial by multiplying the syndrome polynomial generated by the syndrome polynomial generating circuit 11 and the erasure-locator polynomial generated by the erasure-locator polynomial generating circuit 18.

Although the remaining portions correspond to their counterparts of the embodiment 11 designated by the same reference numerals in FIG. 20, the Euclidean algorithm computing circuit 12 and Chien's search circuit 13 differ from their counterparts of the embodiment 11 designated by the same reference numerals in FIG. 20 in that the present Euclidean algorithm computing circuit 12 computes the error-erasure-locator polynomial and error-erasure-value polynomial using the amended-syndrome polynomial generated by the amended-syndrome polynomial generating circuit 19 as the initial values, and the present Chien's search circuit 13 computes the error locations and error magnitudes from the error-erasure-locator polynomial and error-erasure-value polynomial computed by the Euclidean algorithm computing circuit 12.

Next, the operation will be described.

The following description is provided taking as an example a (128, 122) singly extended RS code on the Galois field $GF(2^7)$ whose b=1 and minimum distance is seven.

First, an incoming received word is delivered to the syndrome generating circuit 10, erasure-locator coefficient generating circuit 17 and received word storing circuit 14. Receiving the received word, the syndrome generating circuit 10 generates the syndromes $S_i$ of the received word, where i=0, 1, . . . , 5, and the received word is stored in the received word storing circuit 14 as in the embodiment 11. The syndrome polynomial generating circuit 11 generates the syndrome polynomial shown by equation (96) by setting as its constant term the syndrome $S_5$ from among the syndromes generated by the syndrome generating circuit 10, the syndrome $S_5$ being affected by the extended component.

On the other hand, the erasure-locator coefficient generating circuit 17 generates the erasure-locator coefficients from the erasure flags accompanying the received word, and delivers them to the erasure-locator polynomial generating circuit 18. The erasure-locator polynomial generating circuit 18 generates the erasure-locator polynomial from the erasure-locator coefficients generated by the erasure-locator coefficient generating circuit 17, and transfers it to the amended-syndrome polynomial generating circuit 19. The amended-syndrome polynomial generating circuit 19 generates the amended-syndrome polynomial by multiplying the syndrome polynomial generated by the syndrome polynomial generating circuit 11 and the erasure-locator polynomial generated by the erasure-locator polynomial generating circuit 18, and sends it to the Euclidean algorithm computing circuit 12.

The Euclidean algorithm computing circuit 12 computes the error-erasure-locator polynomial $\rho(x)$ and error-erasure-value polynomial $\pi(x)$ by performing the Euclidean algorithm computation using the amended-syndrome polynomial supplied from the amended-syndrome polynomial generating circuit 19. In this case, it compares the degree of the error-erasure-locator polynomial $\rho(x)$ with that of the errorerasure-value polynomial π(x), and unless degπ≦degρ holds, it outputs the received word without correction with an indication of error detection. On the other hand, if the condition holds, the Chien's search circuit 13 computes the error locations and error values from the error-erasure-locator polynomial ρ(x) and error-erasure-value polynomial π(x), and sends them to the computed result storing circuit 15 to be stored.

If the error number detected by the Chien's search circuit 13 equals the degree of the error-erasure-locator polynomial ρ(x), the error correcting circuit 16, reading the error locations and error values which have been computed by the Chien's search circuit 13 and stored in the computed result storing circuit 15, corrects the errors of the symbols of the received word stored in the received word storing circuit 14 by subtracting from the symbols at the error locations the error values corresponding to the error locations, and outputs the corrected received word. On the other hand, unless the detected error number equals the degree of the error-erasure-locator polynomial ρ(x), the received word stored in the received word storing circuit 14 is output without correction with an indication of the error detection.

Thus, the present embodiment 12 has an advantage of completing the erasure and error correction of a singly extended RS code by a single Euclidean algorithm computation, and of facilitating the decision whether an error has occurred in the extended component or not by comparing the degree of the error-erasure-locator polynomial with that of the error-erasure-value polynomial detected by the Euclidean algorithm computation. In addition it has an advantage of reducing the cost because the error correcting apparatus of the singly extended RS code in accordance with the present invention can be constructed by a minor improvement of the conventional error correcting apparatus of the RS code.

EMBODIMENT 13

Next, as an embodiment 13, an error correcting method of a doubly extended RS code will be described using the Berlekamp-Massey algorithm.

Here, the present embodiment 13 will be explained using a doubly extended RS code with a code length of n, an information symbol number of k, and a minimum distance of d=n−k+1=2t+1, where t is a positive integer.

Figure 22:
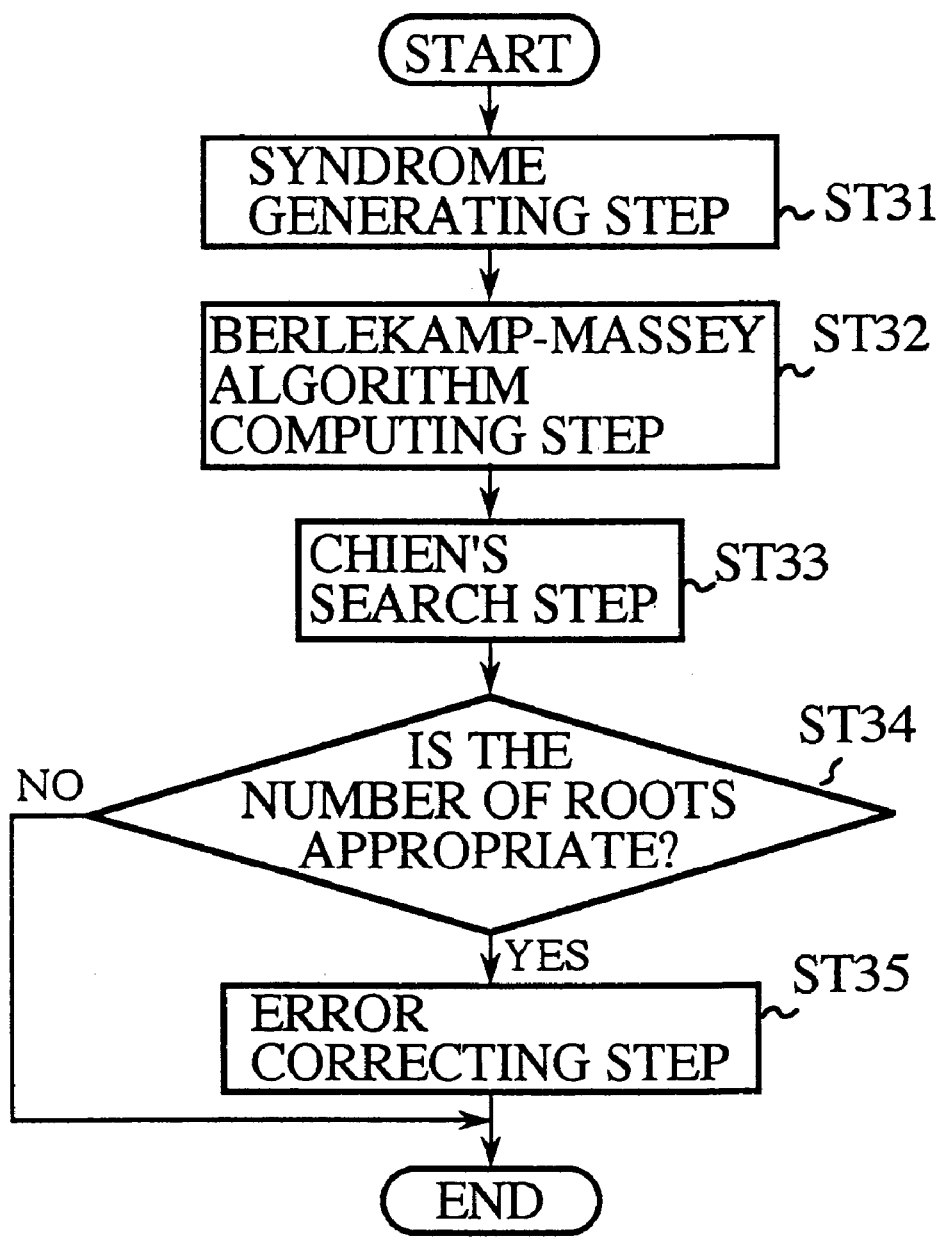
FIG. 22 is a flowchart illustrating a processing procedure of an embodiment 13 of an error correcting method of a doubly-extended RS code in accordance with the present invention.

FIG. 22 is a flowchart illustrating a processing procedure of an error correcting method of a doubly extended RS code. In FIG. 22, ST31 designates a syndrome generating step of computing from a received word its syndromes; and ST32 designates a Berlekamp-Massey algorithm computing step of sequentially computing error-locator polynomial by performing the Berlekamp-Massey algorithm using the syndromes computed in the syndrome generating step ST31, and by controlling whether or not using the syndromes including error information on the second extended component in accordance with the value of the formal shift register length L.

ST33 designates a Chien's search step of computing the roots (error locations) of the error-locator polynomial by performing Chien's search on the error-locator polynomial computed in the Berlekamp-Massey algorithm computing step ST32. ST34 designates a test step of making a decision whether the number of error locations obtained in the Chien's search step ST33 is appropriate or not; and ST35 designates an error correcting step of correcting errors of the received word by computing error values using the syndrome polynomial generated on the basis of syndromes computed in the syndrome generating step ST31, if the number of the error locations found in the Chien's search step ST33 is appropriate.

Next, the operations will be described.

In the following description, it is assumed that a received word $R=(r_{n-2}, r_{n-3}, \ldots, r_0, r_{-1})$ has been received. First, a syndrome $S=(S_0, S_1, \ldots, S_{2t-2}, S_{2t-1})$ is computed from the incoming received word using equation (25) described before, in which $H_2$ is a parity matrix given by expression (24).

Figure 23:
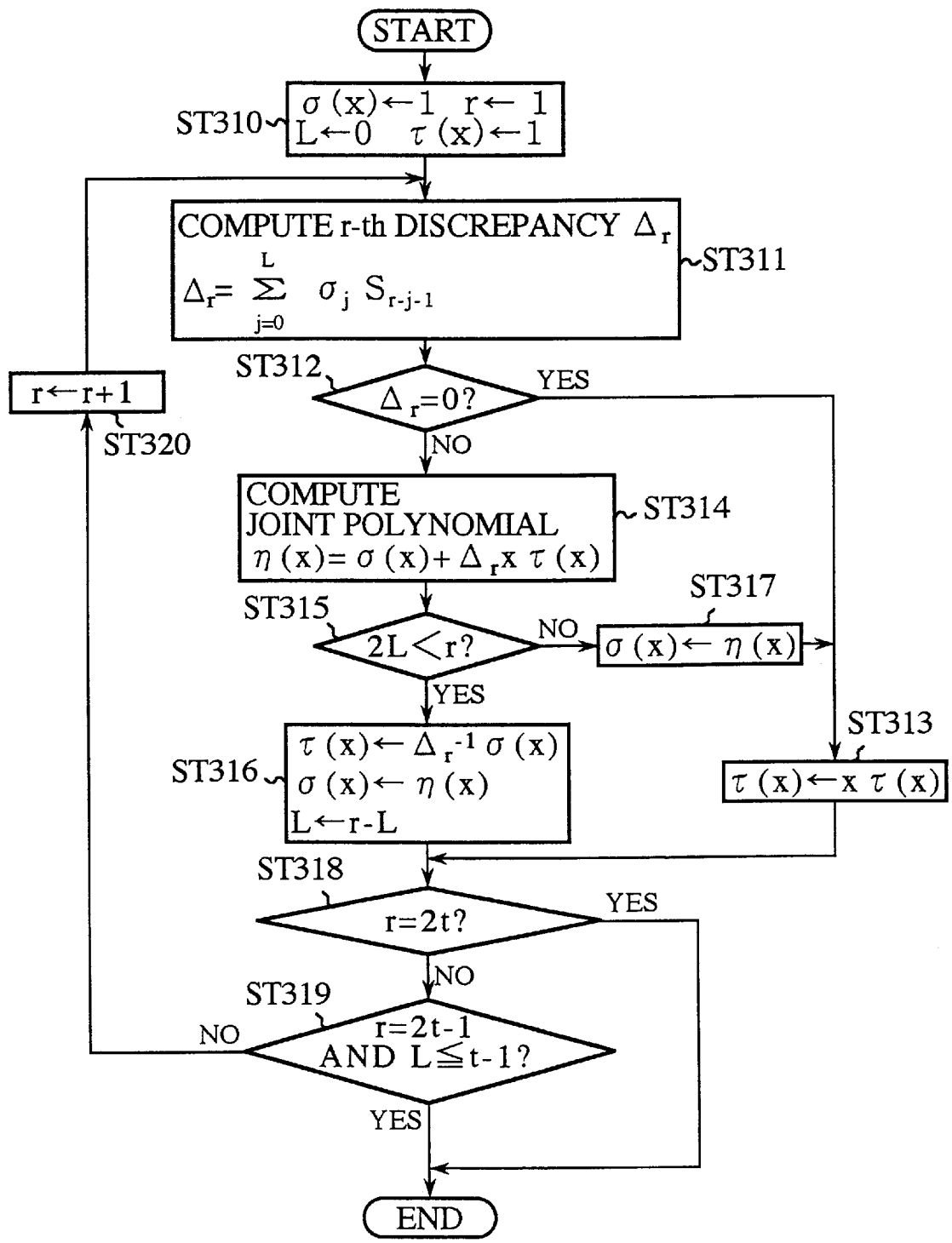
FIG. 23 is a flowchart illustrating details of a processing procedure of a Berlekamp-Massey algorithm computing step in the embodiment 13.

FIG. 23 is a flowchart illustrating concrete procedures of the Berlekamp-Massey algorithm computing step ST32. The Berlekamp-Massey algorithm will now be described with reference to FIG. 23.

As illustrated in FIG. 23, initial sets are carried out at step ST310: a variable r for counting the step number is set at one; an initial value of the error-locator polynomial $\sigma^{(0)}(x)$ is set at one; the formal shift register length L is set at zero; and a supplementary polynomial $\tau^{(0)}(x)$ for updating the error-locator polynomial is set at one.

Let us assume that the error-locator polynomials are sequentially computed, and error-locator polynomial $\sigma^{(r-1)}(x)$ and supplementary polynomial $\tau^{(r-1)}(x)$ have been obtained at the end of an (r−1)-th computing step. At an r-th computing step, a discrepancy $\Delta_r$ given by equation (35) is computed using the coefficients of $\sigma^{(r-1)}(x)$ at step ST311. At the next step ST312, a decision is made whether the discrepancy $\Delta_r$ is zero or not. If the discrepancy $\Delta_r$ is zero, the error-locator polynomial is not updated, and the $\sigma^{(r-1)}(x)$ obtained at the (r−1)-th computing step is adopted as the r-th error-locator polynomial at step ST313. If the discrepancy $\Delta_r$ is nonzero, a connection polynomial η(x) is formed by expression (27) using the supplementary polynomial $\tau^{(r-1)}(x)$ at step ST314.

Subsequently, a decision is made whether the formal shift register length L satisfies an inequality 2L<r or not at step ST315. If it satisfies, the supplementary polynomial $\tau^{(r)}(x)$, error-locator polynomial $\sigma^{(r)}(x)$ and formal shift register length L are each updated at step ST316 as shown by expressions (28)–(30). Otherwise, the formal shift register length L is not updated, the error-locator polynomial $\sigma^{(r)}(x)$ is updated as expression (31) at step ST317, and supplementary polynomial $\tau^{(r)}(x)$ is updated as expression (32) at step ST313.

Here, if the error number is equal to or less than t−1, the discrepancy $\Delta_{2t-1}$ computed at r(=2t−1)-th computing step is zero, and the formal shift register length L is equal to or less than t−1. However, if L≦t−1, then $\Delta_{2t-1}=0$ automatically. This will be proved using the proof by contradiction.

That is, a contradiction will be drawn from the assumption of $\Delta_{2t-1} \neq 0$. Assuming that the formal shift register length at computing steps 2t−2 and 2t−1 is $L_{2t-2}$ and $L_{2t-1}$ (=L), respectively. From the foregoing assumption of $\Delta_{2t-1} \neq 0$, $L_{2t-1}=\max(L_{2t-2}, 2t-1-L_{2t-2})$. Since the right-hand side is greater than t−1, a conclusion is obtained that $L=L_{2t-1}>t-1$. This contradicts to the assumption of L≦t−1. Therefore, $\Delta_{2t-1}=0$.

From the foregoing consideration, if the formal shift register length L satisfies a condition given by the following expression (119), it is considered that at most t−1 errors have occurred in the interior code and first extended component, and the Berlekamp-Massey algorithm computing step ST32 is completed by substituting $\sigma(x)=\sigma^{(2t-1)}(x)$.

$$L \leq t-1 \tag{119}$$

If the condition of expression (119) is not satisfied, it is assumed that at least t errors have occurred in the interior code and first extended component. In this case, the Berlekamp-Massey algorithm is performed one more step using $S_{2t-1}$, and the Berlekamp-Massey algorithm computing step ST32 is completed by substituting $\sigma(x)=\sigma^{(2t)}(x)$.

More specifically, a decision is made whether the variable r for counting the step number reaches 2t or not at step ST318. Unless the variable r equals 2t, a decision is made at step ST319 whether the variable r reaches 2t−1 and the formal shift register length L satisfies the condition given by the foregoing expression (119). As a result, if at least one of the two conditions is unsatisfied, the processings of step ST311 and onward are iterated with incrementing the variable r at step ST320. On the other hand, if the variable r has reached 2t−1 and the formal shift register length L satisfies the condition given by expression (119), the Berlekamp-Massey algorithm computing step ST32 is completed after substituting $\sigma(x)=\sigma^{(2t-1)}(x)$. If the variable r becomes 2t at step ST318, the Berlekamp-Massey algorithm computing step ST32 is completed after substituting $\sigma(x)=\sigma^{2t}(x)$.

The error-locator polynomial $\sigma(x)$ computed in the Berlekamp-Massey algorithm computing step ST32 satisfies the following expression (120). The equal sign holds when no error has occurred in the first extended component. If an error has occurred in the first extended component, the degree of the error-locator polynomial $\sigma(x)$ is less than the formal shift register length L.

$$deg\sigma \leq L \tag{120}$$

Afterward, the Chien's search is performed in the Chien's search step ST33 on the error-locator polynomial $\sigma(x)$ computed in the Berlekamp-Massey algorithm computing step ST32 to compute the roots (error locations) of the error-locator polynomial $\sigma(x)$. Subsequently, a decision is made in the test step ST34 whether the number of roots of the error-locator polynomial $\sigma(x)$ detected in the Chien's search step ST33 agrees with the degree of the error-locator polynomial $\sigma(x)$. As a result, if the number of the roots computed agrees with the degree of the error-locator polynomial $\sigma(x)$, the error values are computed in the error correcting step ST35, and the errors are corrected by subtracting the error values from the symbols at the error locations in the received word. Thus, the corrected received word is output. Unless the number of the roots computed agrees with the degree of the error-locator polynomial $\sigma(x)$, the uncorrected received word is output along with the error detection flag indicating that only the error detection has been performed.

In the computation of the error values in the error correcting step ST35, the error-value polynomial $\omega(x)$ is computed by the following equation (121).

$$\omega(x) \equiv \sigma(x)S(x) \bmod x^{2t-1} \tag{121}$$

Here, the terms of the error-value polynomial $\omega(x)$ with a degree of L or more are zero considering the structure of the error-locator polynomial $\sigma(x)$. Thus, it is enough to compute only terms with a degree of L−1 or less. The computation of the error-value polynomial $\omega(x)$ uses the syndrome polynomial $S(x)$ given by the following equation (122).

$$S(x)=S_0+S_1x+\ldots+S_{2t-2}x^{2t-2} \tag{122}$$

Thus, the error values $e_j$ at the error locations j corresponding to the roots $\alpha^{-j}$ of the error-locator polynomial can be obtained by the following equation (123) as in the embodiment 9.

$$e_j = \frac{\omega(\alpha^{-j})}{\sigma'(\alpha^{-j})\alpha^{-j}} \tag{123}$$

To correct the errors which have occurred in the interior code, the syndrome polynomial given by the following expression (124) may be used.

$$S(x)=S_1+S_2x+\ldots+S_{2t-2}x^{2t-3} \tag{124}$$

Then, the error-value polynomial $\omega(x)$ is given by the following equation (125).

$$\omega(x) \equiv \sigma(x)S(x) \bmod x^{2t-2} \tag{125}$$

In this case, the error values $e_j$ at the error locations j corresponding to the roots $\alpha^{-j}$ of the error-locator polynomial can be obtained by the following equation (126) as in the embodiment 9.

$$e_j = \frac{\omega(\alpha^{-j})}{\sigma'(\alpha^{-j})} \tag{126}$$

Next, the embodiment 13 will be described in more detail when it is applied to a doubly extended RS code on the Galois field GF(16), with a code length of n=17, an information symbol number of k=11 and a minimum distance of seven (t=3). It is further assumed that the primitive polynomial is given by $x^4+x+1=0$, and its roots are given by $\alpha$ which are primitive fifteenth roots. The parity matrix $H_2$ of the doubly extended RS code is given by the following expression (127).

$$H_2 = \begin{bmatrix} 0 & 1 & 1 & \ldots & 1 & 1 & 1 \\ 0 & \alpha^{14} & \alpha^{13} & \ldots & \alpha & 1 & 0 \\ 0 & \alpha^{2\times 14} & \alpha^{2\times 13} & \ldots & \alpha^2 & 1 & 0 \\ 0 & \alpha^{3\times 14} & \alpha^{3\times 13} & \ldots & \alpha^3 & 1 & 0 \\ 0 & \alpha^{4\times 14} & \alpha^{4\times 13} & \ldots & \alpha^4 & 1 & 0 \\ 1 & \alpha^{5\times 14} & \alpha^{5\times 13} & \ldots & \alpha^5 & 1 & 0 \end{bmatrix} \tag{127}$$

Let us assume here that the received word $R=(r_{15}, r_{14}, \ldots, r_0, r_{-1})$ has been received, and the errors $\alpha^{14}$, $\alpha^6$ and $\alpha^5$ have occurred in the first extended component, the third and tenth components, respectively. In this case, the syndrome $S=(S_0, S_1, S_2, S_3, S_4, S_5)$ are computed as $S_0=\alpha^4$, $S_1=\alpha^7$, $S_2=\alpha^3$, $S_3=\alpha^{10}$, $S_4=\alpha^{14}$, and $S_5=\alpha^7$ from equation (25).

As illustrated in FIG. 23, the initial value of the error-locator polynomial $\sigma^{(0)}(x)$ is set at one, the formal shift register length L is set at zero, the supplementary polynomial $\tau^{(0)}(x)$ for updating the error-locator polynomial is set at one, and the variable r for counting the step number is set at one. First, the Berlekamp-Massey algorithm computation is carried out using five syndromes $S_0$, $S_1$, $S_2$, $S_3$ and $S_4$.

At r=1, the value of the discrepancy $\Delta_1=\alpha^4$, and L=r−L=1 because of 2L=0<r=1. The error-locator polynomial $\sigma^{(1)}$ and supplementary polynomial $\tau^{(1)}$ are obtained by the following equations (128) and (129).

$$\sigma^{(1)}(x)=\alpha^4 x+1 \tag{128}$$

$$\tau^{(1)}(x)=\alpha^{11} \tag{129}$$

Then, at r=2, the value of the discrepancy $\Delta_2=\alpha^{11}$, and L=1 because of 2L=2 and r=2. The error-locator polynomial $\sigma^{(2)}$ and supplementary polynomial $\tau^{(2)}$ are obtained by the following equations (130) and (131).

$$\sigma^{(2)}(x)=\alpha^3 x+1 \tag{130}$$

$$\tau^{(2)}(x)=\alpha^{11} x \tag{131}$$

Subsequently, at r=3, the value of the discrepancy $\Delta_3=\alpha^{12}$, and L=r−L=2 because of 2L=2<r=3. The error-locator polynomial $\alpha^{(3)}$ and supplementary polynomial $\tau^{(3)}$ are obtained by the following equations (132) and (133).

$$\sigma^{(3)}(x)=\alpha^8 x^2+\alpha^3 x+1 \tag{132}$$

$$\tau^{(3)}(x)=\alpha^6 x+\alpha^3 \tag{133}$$

Then, at r=4, the value of the discrepancy $\Delta_4=\alpha^9$, and L=2 because of 2L=4 and r=4. The error-locator polynomial $\sigma^{(4)}$ and supplementary polynomial $\tau^{(4)}$ are obtained by the following equations (134) and (135).

$$\sigma^{(4)}(x)=\alpha^2 x^2+\alpha^{10} x+1 \tag{134}$$

$$\tau^{(4)}(x)=\alpha^6 x^2+\alpha^3 x \tag{135}$$

Subsequently, at r=5, the value of the discrepancy $\Delta_5=\alpha^{14}$, and L=r−L=3 because of 2L=4<r=5. The error-locator polynomial $\sigma^{(5)}$ and supplementary polynomial $\tau^{(5)}$ are obtained by the following equations (136) and (137).

$$\sigma^{(5)}(x)=\alpha^5 x^3+\alpha^{10} x+1 \tag{136}$$

$$\tau^{(5)}(x)=\alpha^3 x^2+\alpha^{11} x+\alpha \tag{137}$$

Incidentally, at r=5, since L=3>t−1=2, the Berlekamp-Massey algorithm computation is executed once more after incrementing r.

At that step of r=6, the value of the discrepancy $\Delta_6=\alpha^2$, and L=3 because of 2L=6 and r=6. The error-locator polynomial $\sigma^{(6)}$ and supplementary polynomial $\tau^{(6)}$ are obtained by the following equations (138) and (139).

$$\sigma^{(6)}(x)=\alpha^{13} x^2+\alpha^{12} x+1 \tag{138}$$

$$\tau^{(6)}(x)=\alpha^3 x^3+\alpha^{11} x^2+\alpha x \tag{139}$$

Since $\sigma^{(6)}(x)$ can be factorized into $\sigma^{(6)}(x)=(\alpha^3 x+1)(\alpha^{10} x+1)$, the roots $\alpha^{-3}$ and $\alpha^{-10}$ are obtained, which indicates that the errors have occurred in the third and tenth components. In addition, although the degree of the error-locator polynomial is two, since the formal shift register length L is three, it is found that an error has occurred in the first extended component.

Afterward, the syndrome polynomial is set as the following expression (140).

$$S(x)=S_1+S_2 x+S_2 x^2+S_2 x^3$$

$$=\alpha^7+\alpha^3 x+\alpha^{10} x^2+\alpha^{14} x^3 \tag{140}$$

Then, the error-value polynomial is computed by the following equation (141) using the syndrome polynomial S(x).

$$\omega(x) \equiv \sigma(x) S(x) \bmod x^4$$

$$=\alpha^4+\alpha^{14} x+\alpha^{12} x^2 \tag{141}$$

Thus, the error values $e_3$ and $e_{10}$ at the third and tenth components are obtained by the following equations (142) and (143).

$$e_3 = \frac{\omega(\alpha^{-3})}{\sigma'(\alpha^{-3})} = \alpha^5 \tag{142}$$

$$e_{10} = \frac{\omega(\alpha^{-10})}{\sigma'(\alpha^{-10})} = \alpha^5 \tag{143}$$

As described above, in contrast with the conventional error correcting apparatus of a doubly extended RS code using the Berlekamp-Massey algorithm in which the Berlekamp-Massey algorithm computations must be carried out twice in the worst case, which presents a problem of decoding delay, the error correcting method of the doubly extended RS code associated with the present embodiment 13 has an advantage of completing the processings by a single Berlekamp-Massey algorithm computation, and of facilitating the decision whether an error has occurred in the first extended component or not by only comparing the degree of the error-locator polynomial detected by the Berlekamp-Massey algorithm computation with the formal shift register length L.

EMBODIMENT 14

Although in the foregoing embodiment 13, the error correcting method of the doubly extended RS code is described which implements the error correction of the doubly extended RS code by the Berlekamp-Massey algorithm, it can also be applied to the error correcting method of the doubly extended RS code which implements the erasure and error correction of the doubly extended RS code. Such an embodiment 14 in accordance with the present invention will now be described beginning from the principle of the erasure and error correcting method of the doubly extended RS code. Here, the present embodiment 14 will be explained using a doubly extended RS code with a code length of n, an information symbol number of k, and a minimum distance of d=n−k+1=2t+1, where t is a positive integer, which was described in connection with the conventional technique.

Figure 24:
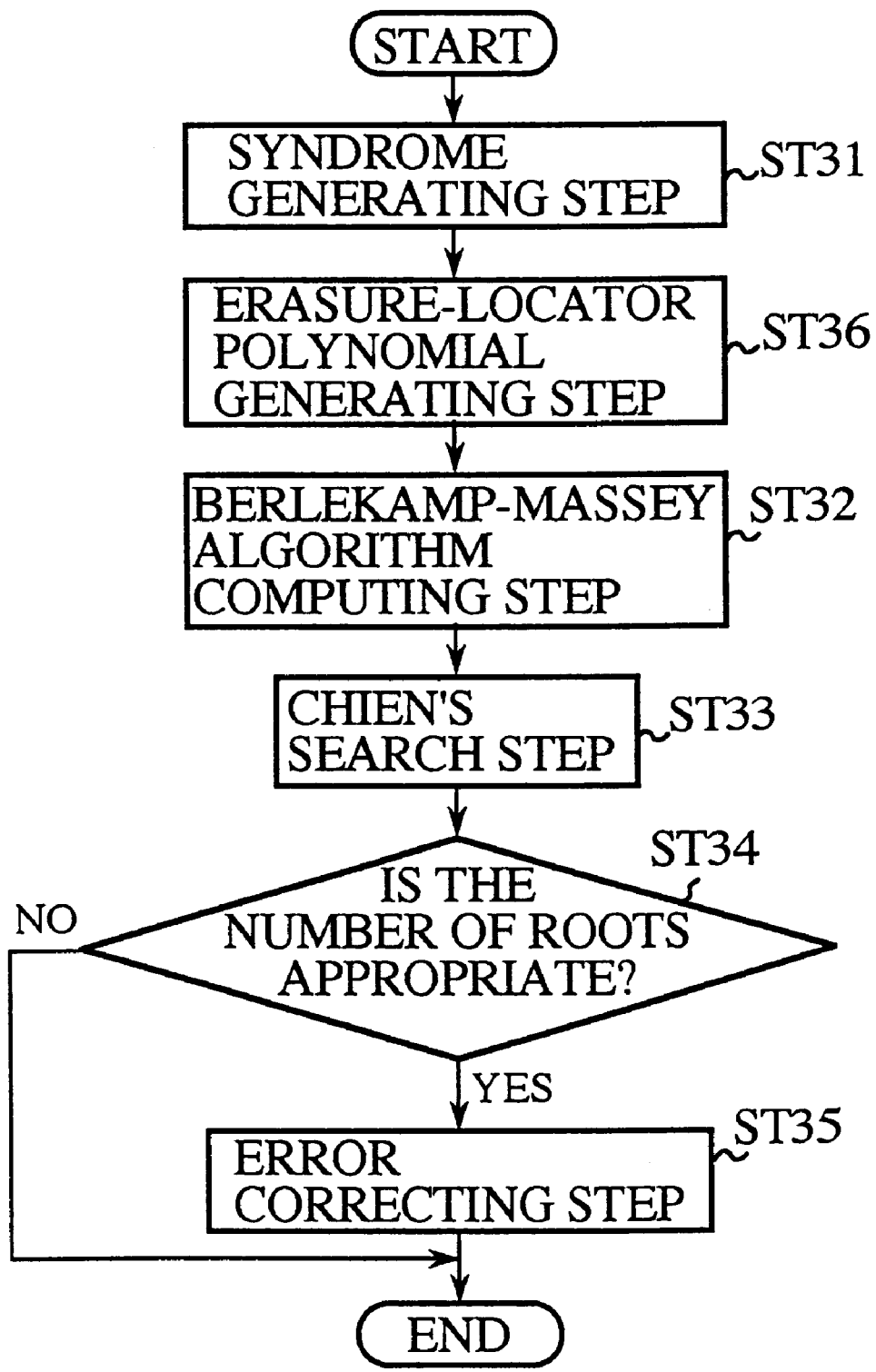
FIG. 24 is a flowchart illustrating a processing procedure of an embodiment 14 of an error correcting method of a doubly extended RS code in accordance with the present invention.

FIG. 24 is a flowchart illustrating a processing procedure of an error correcting method of a doubly extended RS code associated with the embodiment 14 in accordance with the present invention, in which like steps to those of the embodiment 13 are designated by the same reference characters as those in FIG. 22, and the description thereof is omitted here. In FIG. 24, ST36 designates an erasure-locator polynomial generating step of generating erasure-locator coefficients from the erasure flags accompanying the received word, and of computing the erasure-locator polynomial from the erasure-locator coefficients. The Berlekamp-Massey algorithm computing step ST32 of the present embodiment differs from its counterpart of the embodiment 13 designated by the same reference character in FIG. 22 in that it sequentially computes the error-locator polynomials by setting the erasure-locator polynomial computed in the erasure-locator polynomial generating step ST36 as the initial value, by carrying out the Berlekamp-Massey algorithm using the syndromes computed in the syndrome generating step ST31, and by controlling in accordance with the value of the formal shift register length whether to use the syndrome including the error information on the second extended component.

Next, the operation of the present embodiment 14 will be described.

In the following description, it is assumed that a received word R=($r_{n-2}$, $r_{n-3}$, ..., $r_0$, $r_{-1}$) has been received. First, a syndrome S=($S_0$, $S_1$, ..., $S_{2t-2}$, $S_{2t-1}$) is computed in the syndrome generating step ST31 using equation (25), in which $H_2$ is the parity matrix given by expression (24).

Here, let M be a set of interior symbols which are decided as erasures by erasure flags accompanying the received word, and the elements of the set M be m[k], where k=0, 1, ..., h−1. Furthermore, let L be a set of random errors other than the erasures, and the elements of the set L be l[k], where k=0, 1, ..., s−1. The method will now be described of correcting the erasures and random errors under the assumption of 2s+h≦2t.

More specifically, with generating erasure-locator coefficients $\alpha^{m[k]}$ from the elements m[k] of the set M of the erasure locations which have been decided from the erasure flags accompanying the received word, a polynomial given the following expression (144) which is called an erasure-locator polynomial is formed using the erasure-locator coefficients $\alpha^{m[k]}$.

$$\Lambda(x)=(1+\alpha^{m[0]}x)(1+\alpha^{m[1]}x)\ldots(1+\alpha^{m[h-1]}x) \qquad (144)$$

Figure 25:
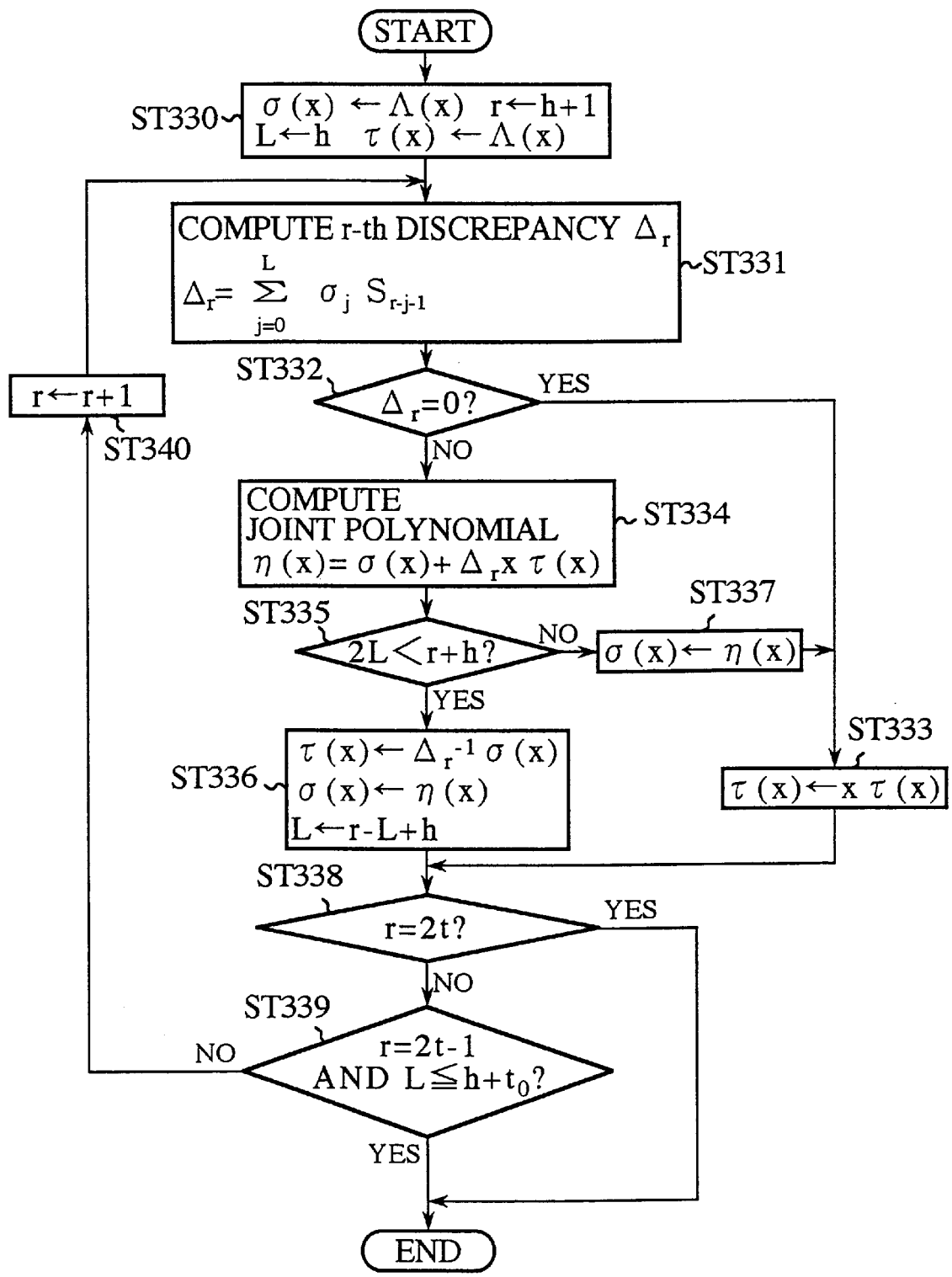
FIG. 25 is a flowchart illustrating details of a processing procedure of a Berlekamp-Massey algorithm computing step in the embodiment 14.

Subsequently, in the Berlekamp-Massey algorithm computing step ST32, after setting the erasure-locator polynomial $\Lambda(x)$ as the initial value, the Berlekamp-Massey algorithm computation is carried out using the 2t−1 syndromes $S_0$, $S_1$, ..., $S_{2t-2}$, that is, the entire syndromes with the exception of $S_{2t-1}$, among the 2t syndromes computed from the received word R. Thus using the 2t−1 syndromes makes it possible to correct h erasures and $t_0$=[(2t−h−1)/2] random errors. FIG. 25 is a flowchart illustrating concrete procedures of the Berlekamp-Massey algorithm computing step ST32.

As illustrated in FIG. 25, initial sets are carried out at step ST330: a variable r for counting the step number is set at h+1; an initial value of the error-locator polynomial $\sigma^{(h)}(x)$ is set at $\Lambda(x)$; formal shift register length L is set at h; and a supplementary polynomial $\tau^{(h)}(x)$ for updating the error-locator polynomial is set at $\Lambda(x)$.

Let us assume that the error-locator polynomials are sequentially computed, and error-locator polynomial $\sigma^{(r-1)}(x)$ and supplementary polynomial $\tau^{(r-1)}(x)$ have been obtained at the end of an (r−1)-th computing step. At an r-th computing step, a discrepancy $\Delta_r$ given by equation (145) is computed using the coefficients of $\sigma^{(r-1)}(x)$ at step ST331.

$$\Delta r = \sum_{j=0}^{L} \sigma_j^{(r-1)} S_{r-j-1} \qquad (145)$$

At the next step ST332, a decision is made whether the discrepancy $\Delta_r$ is zero or not. If the discrepancy $\Delta_r$ is zero, the error-locator polynomial $\sigma(x)$ is not updated, and the error-locator polynomial obtained at the (r−1)-th computing step is adopted as the r-th error-locator polynomial at step ST333. If the discrepancy $\Delta_r$ is nonzero, a joint polynomial $\eta(x)$ is formed by expression (27) using the supplementary polynomial $\tau^{(r-1)}(x)$ at step ST334.

Subsequently, a decision is made at step ST335 whether the formal shift register length L satisfies an inequality 2L<r+h or not. If it satisfies, the supplementary polynomial, error-locator polynomial and formal shift register length L are each updated at step ST336 as shown by expressions (146)–(148).

$$\tau^{(r)}(x) \leftarrow \Delta_r^{-1}\sigma^{(r-1)}(x) \qquad (146)$$

$$\sigma^{(r)}(x) \leftarrow \eta(x) \qquad (147)$$

$$L \leftarrow r-L+h \qquad (148)$$

If the inequality is not satisfied, the formal shift register length L is not updated, the error-locator polynomial is updated as expression (149) at step ST337, and supplementary polynomial is updated as expression (150) at step ST333.

$$\sigma^{(r)}(x) \leftarrow \eta(x) \qquad (149)$$

$$\tau^{(r)}(x) \leftarrow x\tau^{(r-1)}(x) \qquad (150)$$

Here, if the random error number is $t_0$ or less, the formal shift register length L computed after r(=2t−1)-th computing step satisfies the condition given by the following expression (151).

$$L \leq h+t_0 \qquad (151)$$

Thus, if the formal shift register length L satisfies expression (151), it is assumed that h erasures and $t_0$ or less random errors have occurred in the interior code and the first extended component, and the Berlekamp-Massey algorithm computing step ST32 is completed by substituting $\sigma(x)=\sigma^{(2t-1)}(x)$.

If the condition of the foregoing expression (151) is not satisfied, it is assumed that $t_0$+1 or more random errors have occurred in the interior code and the first extended component. In this case, the Berlekamp-Massey algorithm is performed one more step using $S_{2t-1}$, and the Berlekamp-Massey algorithm computing step ST32 is completed by substituting $\sigma(x)=\sigma^{(2t)}(x)$.

More specifically, a decision is made whether the variable r for counting the step number reaches 2t or not at step ST338. If the variable r is not 2t, a decision is made at step ST339 whether the variable r reaches 2t−1 and the formal shift register length L satisfies the condition given by the foregoing expression (151). As a result, if at least one of the two conditions is not satisfied, the processings of step ST331 and onward are iterated with incrementing the variable r at step ST340. On the other hand, if the variable r reaches 2t−1 and the formal shift register length L satisfies the condition given by the foregoing expression (151), the Berlekamp-Massey algorithm computing step ST32 is completed after substituting $\sigma(x)=\sigma^{(2t-1)}(x)$. If the variable r reaches 2t at step ST338, the Berlekamp-Massey algorithm computing step ST32 is completed after substituting $\sigma(x)=\sigma^{2t}(x)$.

The error-locator polynomial $\sigma(x)$ and the formal shift register length L computed in the Berlekamp-Massey algorithm computing step ST32 satisfy the condition given by the following expression (152). The equal sign holds when no error has occurred in the first extended component. If an error has occurred in the first extended component, the degree of the error-locator polynomial $\sigma(x)$ is smaller than the formal shift register length L.

$$deg\sigma \leq L \qquad (152)$$

Afterward, the Chien's search is performed in the Chien's search step ST33 on the error-locator polynomial σ(x) computed in the Berlekamp-Massey algorithm computing step ST32 to compute the roots (error locations) of the error-locator polynomial σ(x). Subsequently, a decision is made in the test step ST34 whether the number of roots of the error-locator polynomial σ(x) detected in the Chien's search step ST33 agrees with the degree of the error-locator polynomial σ(x). As a result, if the number of the roots computed agrees with the degree of the error-locator polynomial σ(x), the error values are computed in the error correcting step ST35, and the errors are corrected by subtracting the error values from the symbols at the error locations in the received word. Thus, the corrected received word is output. If the number of the roots computed does not agree with the degree of the error-locator polynomial σ(x), the uncorrected received word is output along with the error detection flag indicating that only the error detection has been performed.

In the computation of the error values in the error correcting step ST35, the error-value polynomial ω(x) is computed first using the syndrome polynomial. Here, the syndrome polynomial S(x) is set as follows in accordance with the value of the variable r for counting the step number. Specifically, the syndrome polynomial is set by the following equation (153) when the variable r equals 2t, and by equation (154) when the variable r is 2t−1. This is because if some error has occurred in the second extended component, the equation using $S_{2t-1}$ does not provide the true error-value polynomial, and hence its use must be avoided.

$$S(x)=S_0+S_1x+\ldots +S_{2t-1}x^{2t-1} \quad (153)$$

$$S(x)=S_0+S_1x+\ldots +S_{2t-2}x^{2t-2} \quad (154)$$

The error-value polynomial ω(x) is computed by the following equation (155) when the foregoing equation (153) is used, whereas the error-value polynomial ω(x) is computed by the following equation (156) when equation (154) is used.

$$\omega(x)=\sigma(x)S(x)\ mod\ x^{2t} \quad (155)$$

$$\omega(x)=\sigma(x)S(x)\ mod\ x^{2t-1} \quad (156)$$

Thus, the error value $e_j$ at the erasure or error location j can be obtained by the following equation (157) as in the embodiment 9.

$$e_j = \frac{\omega(\alpha^{-j})}{\sigma'(\alpha^{-j})\alpha^{-j}} \quad (157)$$

Next, the embodiment 14 will be described in more detail when it is applied to a doubly extended RS code on the Galois field GF(16), with a code length of n=17, an information symbol number of k=11 and a minimum distance of seven (t=3). In addition, it is assumed that the primitive polynomial and the parity matrix are the same as those of the foregoing embodiment 13.

Let us assume here that the received word R=($r_{15}$, $r_{14}$, ..., $r_0$, $r_{-1}$) has been received, and the errors $\alpha^8$, $\alpha^{10}$, $\alpha^7$, and $\alpha^{11}$ have occurred in the first extended component, the fifth, seventh and ninth components, respectively, with erasure flags having occurred in the fifth and seventh component. In this case, the syndrome S=($S_0$, $S_1$, $S_2$, $S_3$, $S_4$, $S_5$) are computed as $S_0=\alpha^{10}$, $S_1=\alpha^{11}$, $S_2=\alpha^4$, $S_3=\alpha^{12}$, $S_4=\alpha^4$, and $S_5=\alpha^{10}$ from equation (25).

In addition, erasure-locator coefficients $\alpha_5$ and $\alpha_7$ are formed from the erasure locations 5 and 7, and using these erasure-locator coefficients, the erasure-locator polynomial Λ(x) is formed designated by the following equation (158).

$$\Lambda(x)=(1+\alpha^5 x)(1+\alpha^5 x)$$
$$=\alpha^{12}x^2+\alpha^{13}x+1 \quad (158)$$

As illustrated in FIG. 25, the initial value of the variable r for counting the step number is set at h+1=3, the error-locator polynomial $\sigma^{(2)}(x)$ is set at Λ(x), the formal shift register length L is set at h=2, and the supplementary polynomial $\tau^{(2)}(x)$ for updating the error-locator polynomial is set at Λ(x). In addition, $t_0$ is set as $t_0=[(5-h)/2]=1$. First, the Berlekamp-Massey algorithm computation is carried out using five syndromes $S_0$, $S_1$, $S_2$, $S_3$ and $S_4$.

At r=3, the value of the discrepancy $\Delta_3=\alpha$, and L=r−L+h=3 because of 2L=4<r+h=5. The error-locator polynomial $\sigma^{(3)}$ and supplementary polynomial $\tau^{(3)}$ are given by the following equations (159) and (160).

$$\sigma^{(3)}(x)=\alpha^{13}x^3+\alpha^5 x^2+\alpha^{12}x+1 \quad (159)$$

$$\tau^{(3)}(x)=\alpha^{11}x^2+\alpha^{12}x+\alpha^{14} \quad (160)$$

Then, at r=4, the value of the discrepancy $\Delta_4=\alpha^9$, and L=3 because of 2L=6 and r+h=6. The error-locator polynomial $\sigma^{(4)}$ and supplementary polynomial $\tau^{(4)}$ are given by the following equations (161) and (162).

$$\sigma^{(4)}(x)=\alpha^7 x^3+\alpha^9 x^2+\alpha^9 x+1 \quad (161)$$

$$\tau^{(4)}(x)=\alpha^{11}x^3+\alpha^{12}x^2+\alpha^{14}x \quad (162)$$

Subsequently, at r=5, the value of the discrepancy $\Delta_5=\alpha^9$, and L=4 because of 2L=6<r+h=7. The error-locator polynomial $\sigma^{(5)}$ and supplementary polynomial $\tau^{(5)}$ are given by the following equations (163) and (164).

$$\sigma^{(5)}(x)=\alpha^5 x^4+\alpha^{10}x^3+\alpha^{12}x^2+\alpha^9 x+1 \quad (163)$$

$$\tau^{(5)}(x)=\alpha^{13}x^3+x^2+x+\alpha^6 \quad (164)$$

Incidentally, at r=5, since L=4>h+$t_0$=3, the Berlekamp-Massey algorithm computation is executed once more after incrementing r.

Then, at that step r=4, the value of the discrepancy $\Delta_6=\alpha^7$, and L=4 because of 2L=8 and r+h=8. The error-locator polynomial $\sigma^{(6)}$ and supplementary polynomial $\tau^{(6)}$ are given by the following equations (165) and (166).

$$\sigma^{(6)}(x)=\alpha^6 x^3+\alpha^2 x^2+\alpha^{10}x+1 \quad (165)$$

$$\tau^{(6)}(x)=\alpha^{13}x^4+x^3+x^2+\alpha^6 x \quad (166)$$

Since the $\sigma^{(6)}(x)$ can be factorized into $(\alpha^5 x+1)(\alpha^7 x+1)(\alpha^9 x+1)$, the roots $\alpha^{-5}$, $\alpha^{-7}$ and $\alpha^{-9}$ are obtained, which indicates that the random errors have occurred in the ninth component besides the fifth and seventh components. In addition, although the degree of the error-locator polynomial is three, since the formal shift register length L is four, it is found that an error has occurred in the first extended component.

Afterward, since the variable r for counting the step number is six, the syndrome polynomial is set as the following equation (167), and the error-value polynomial $\omega(x)$ is computed by equation (155).

$$S(x)=S_0+S_1x+S_2x^2+S_3x^3+S_4x^4+S_5x^5$$
$$=\alpha^{10}+\alpha^{11}x+\alpha^4x^2+\alpha^{12}x^3+\alpha^4x^4+\alpha^{10}x^5 \quad (167)$$

As a result, $\omega(x)=\alpha^{10}+\alpha^3x+\alpha^{14}x^3$ is obtained. Thus, the erasure values $e_5$, $e_7$ and $e_9$ at the fifth, seventh and ninth components are obtained by the following equations (168)–(170).

$$e_5 = \frac{\omega(\alpha^{-5})}{\sigma'(\alpha^{-5})\alpha^{-5}} = \alpha^{10} \quad (168)$$

$$e_7 = \frac{\omega(\alpha^{-7})}{\sigma'(\alpha^{-7})\alpha^{-7}} = \alpha^7 \quad (169)$$

$$e_9 = \frac{\omega(\alpha^{-9})}{\sigma'(\alpha^{-9})\alpha^{-9}} = \alpha^{11} \quad (170)$$

Thus, the present embodiment 14 has an advantage of completing the erasure and error correction of the doubly extended RS code by a single Berlekamp-Massey algorithm computation, and of facilitating the decision whether an error has occurred in the first extended component or not by only comparing the degree of the error-locator polynomial detected by the Berlekamp-Massey algorithm computation with the formal shift register length L.

EMBODIMENT 15

Figure 26:
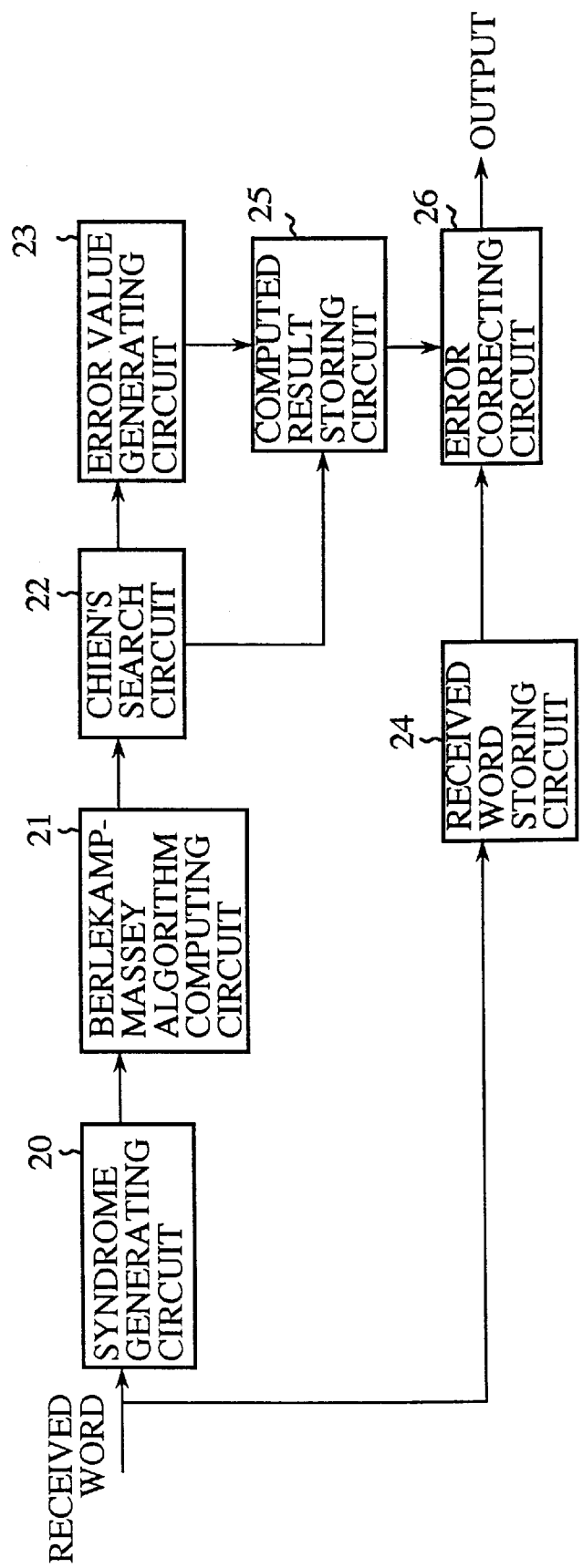
FIG. 26 is a block diagram showing an embodiment 15 of an error correcting decoding apparatus of a doubly extended RS code accordance with the present invention.

Although the foregoing embodiments 13 and 14 describe the error correcting method of the doubly extended RS code using the Berlekamp-Massey algorithm, it is possible to implement an error correcting apparatus based on the method. FIG. 26 is a block diagram showing an error correcting apparatus of the doubly extended RS code associated with an embodiment 15 in accordance with the present invention In FIG. 26, the reference numeral 20 designates a syndrome generating circuit for generating syndromes from a received word; and 21 designates a Berlekamp-Massey algorithm computing circuit for sequentially computing the error-locator polynomials by carrying out the Berlekamp-Massey algorithm using the syndromes computed by the syndrome generating circuit 20, and by controlling in accordance with the value of the formal shift register length whether to use the syndrome including the error information on the second extended component.

The reference numeral 22 designates a Chien's search circuit for computing the error locations by performing the Chien's search on the error-locator polynomial computed by the Berlekamp-Massey algorithm computing circuit 21; and 23 designates an error value generating circuit for making a decision whether the number of the error locations is appropriate or not, and for computing, if appropriate, the error values using the syndrome polynomial generated on the basis of the syndromes computed by the syndrome generating circuit 20. The reference numeral 24 designates a received word storing circuit for storing the incoming received words; and 25 designates a computed result storing circuit for storing the error locations computed by the Chien's search circuit 22 and the error values computed by the error value generating circuit 23. The reference numeral 26 designates an error correcting circuit for correcting the received words stored in the received word storing circuit 24 on the basis of the error locations and error values stored in the computed result storing circuit 25.

Next, the operation of the present embodiment 15 will be described.

The following description is provided taking as an example a doubly extended RS code with a code length of n, information symbol number of k and a minimum distance of d=n−k+1=2t+1, where t is a positive integer, under an assumption that a received word $R=(r_{n-2}, r_{n-3}, \ldots, r_0, r_{-1})$ has been received.

First, an incoming received word R is delivered to the syndrome generating circuit 20 and received word storing circuit 24. Receiving the received word R, the syndrome generating circuit 20 generates the syndrome $S=(S_0, S_1, \ldots, S_{2t-2}, S_{2t-1})$, and delivers it to the Berlekamp-Massey algorithm computing circuit 21. The received word storing circuit 24 stores the incoming received word R.

The Berlekamp-Massey algorithm computing circuit 21 performs the Berlekamp-Massey algorithm computation by 2t−1 computing steps using the syndromes $S_0, S_1, \ldots, S_{2t-2}$ with the exception of $S_{2t-1}$ among the syndrome S fed from the syndrome generating circuit 20. After completing the 2t−1 computing steps, if the formal shift register length L is t−1 or less, the Berlekamp-Massey algorithm computation is completed with outputting the error-locator polynomial at that time. If the formal shift register length L is t or more, the Berlekamp-Massey algorithm computation is iterated one more step using the syndrome $S_{2t-1}$, and the Berlekamp-Massey algorithm computation is completed with outputting the error-locator polynomial at that time.

The error-locator polynomial thus computed by the Berlekamp-Massey algorithm computing circuit 21 is fed to the Chien's search circuit 22, which computes the roots of the error-locator polynomial, that is, the error locations by carrying out the Chien's search on the error-locator polynomial. The roots of the error-locator polynomial computed by the Chien's search circuit 22 are stored in the computed result storing circuit 25 and delivered to the error value generating circuit 23, as well. If the number of roots detected by the Chien's search equals the degree of the error-locator polynomial, the error value generating circuit 23 computes the magnitudes of the errors having occurred in the error locations, and has the computed result storing circuit 25 store the results.

The error correcting circuit 26 corrects, if possible, the errors of the symbols of the received word R stored in the received word storing circuit 24 by subtracting from the symbols at the error locations the error magnitudes corresponding to the error locations on the basis of the contents stored in the computed result storing circuit 25, and outputs the corrected results. On the other hand, if it is found uncorrectable, the received word R is output without correction with an error detection flag.

Thus, the present embodiment 15 has an advantage of completing the error correction of a doubly extended RS code by a single Berlekamp-Massey algorithm computation, and of reducing the cost because the error correcting apparatus of the doubly extended RS code in accordance with the present invention can be constructed by a minor improvement of the conventional error correcting apparatus of the doubly extended RS code.

EMBODIMENT 16

Figure 27:
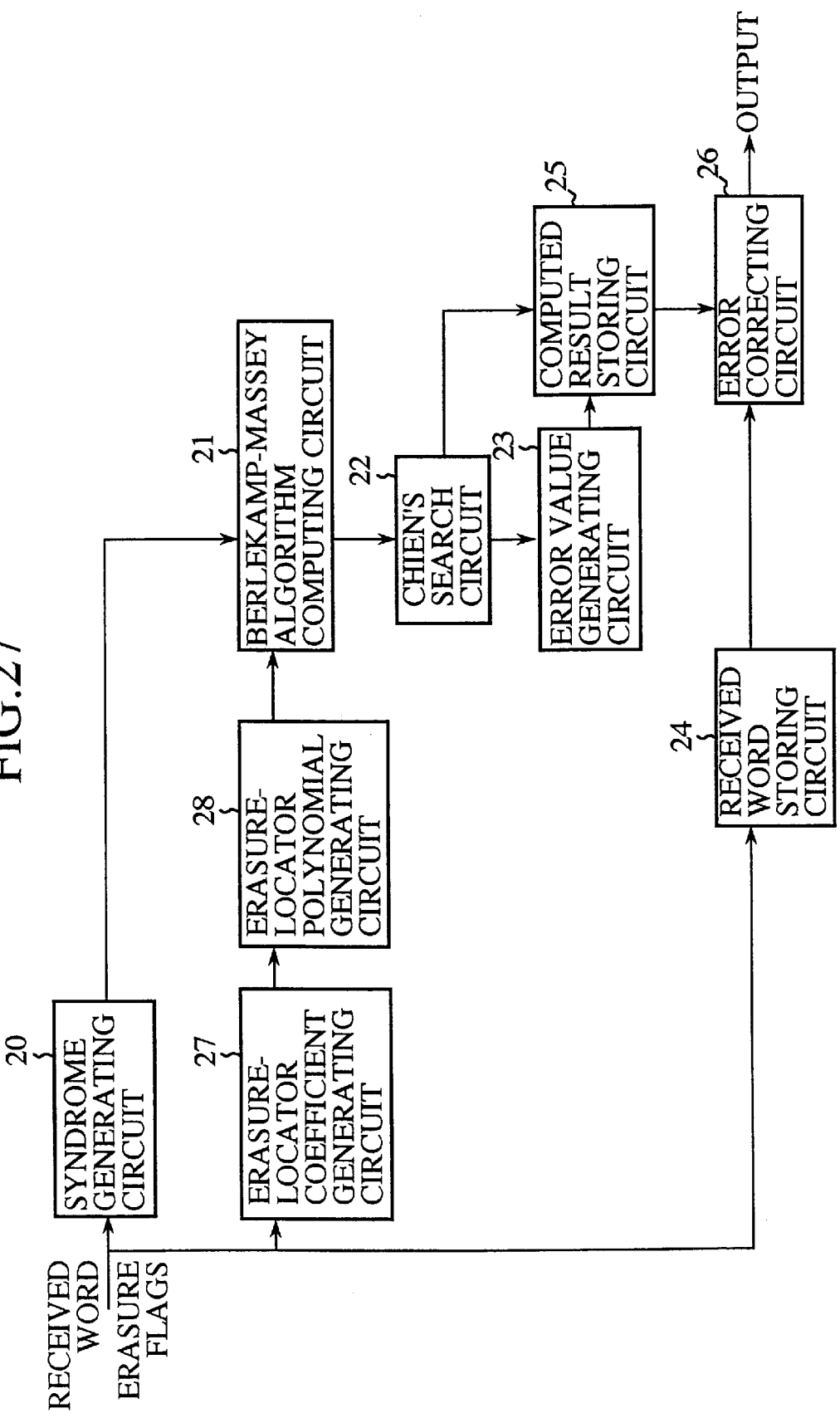
FIG. 27 is a block diagram showing an embodiment 16 of an error correcting decoding apparatus of a doubly extended RS code in accordance with the present invention.

Although the foregoing embodiment 15 deals with the error correcting apparatus of the doubly extended RS code for performing error correction of the doubly extended RS code using the Berlekamp-Massey algorithm, it is also possible to apply to the error correcting apparatus of the doubly extended RS code for performing erasure and error correction of the doubly extended RS code. FIG. 27 is a block diagram showing an error correcting apparatus of the doubly extended RS code associated with an embodiment 16 in accordance with the present invention. In FIG. 27, the reference numeral 27 designates an erasure-locator coefficient generating circuit for generating the erasure-locator coefficients from the erasure flags accompanying the incoming received word; and 28 designates an erasure-locator polynomial generating circuit for generating the erasure-locator polynomial from the erasure-locator coefficients generated by the erasure-locator coefficient generating circuit 27.

Although the remaining portions correspond to their counterparts of the embodiment 15 designated by the same reference numerals in FIG. 26, the Berlekamp-Massey algorithm computing circuit 21 differs from its counterpart of the embodiment 15 designated by the same reference numeral in FIG. 26 in that the present Berlekamp-Massey algorithm computing circuit 21 sequentially computes the error-locator polynomial by performing the Berlekamp-Massey algorithm using the error-locator polynomial computed by the erasure-locator polynomial generating circuit 28 as the initial value, and by controlling in accordance with the value of the formal shift register length whether to use the syndrome including the error information on the second extended component.

Next, the operation of the present embodiment 16 will be described.

The following description is provided taking as an example a doubly extended RS code with a code length of n, information symbol number of k and a minimum distance of $d=n-k+1=2t+1$, where t is a positive integer, with assumptions that a received word $R=(r_{n-2}, r_{n-3}, \ldots, r_0, r_{-1})$ has been received, and that h erasures have occurred in the interior code. Besides, let $t_0$ be $t_0=[(2t-h-1)/2]$.

First, an incoming received word R is delivered to the syndrome generating circuit 20, erasure-locator coefficient generating circuit 27 and received word storing circuit 24. Receiving the received word R, the syndrome generating circuit 20 generates the syndrome $S=(S_0, S_1, \ldots, S_{2t-2}, S_{2t-1})$, and delivers it to the Berlekamp-Massey algorithm computing circuit 21. The erasure-locator coefficient generating circuit 27 generates the erasure-locator coefficients from the erasure flags accompanying the received word R, and delivers them to the erasure-locator polynomial generating circuit 28. The erasure-locator polynomial generating circuit 28 generates the erasure-locator polynomial from the erasure-locator coefficients, and transfers it to the Berlekamp-Massey algorithm computing circuit 21. The received word storing circuit 24 stores the incoming received word R.

The Berlekamp-Massey algorithm computing circuit 21 performs the Berlekamp-Massey algorithm computation by $2t-1$ computing steps using the syndromes $S_0, S_1, \ldots, S_{2t-2}$ with the exception of $S_{2t-1}$ among the syndrome S fed from the syndrome generating circuit 20. After completing the $2t-1$ computing steps, if the formal shift register length L is $h+t_0$ or less, the Berlekamp-Massey algorithm computation is completed with outputting the error-locator polynomial at that time. If the formal shift register length L is $h+t_0+1$ or more, the Berlekamp-Massey algorithm computation is iterated one more step using the syndrome $S_{2t-1}$, and the Berlekamp-Massey algorithm computation is completed with outputting the error-locator polynomial at that time.

The error-locator polynomial thus computed by the Berlekamp-Massey algorithm computing circuit 21 is fed to the Chien's search circuit 22, which computes the roots of the error-locator polynomial, that is, the error locations by carrying out the Chien's search on the error-locator polynomial. The roots of the error-locator polynomial computed by the Chien's search circuit 22 are stored in the computed result storing circuit 25 and delivered to the error value generating circuit 23, as well. If the number of roots detected by the Chien's search equals the degree of the error-locator polynomial, the error value generating circuit 23 computes the magnitudes of the errors having occurred in the error locations, and has the computed result storing circuit 25 store the results.

The error correcting circuit 26 corrects, if possible, the errors of the symbols of the received word R stored in the received word storing circuit 24 by subtracting from the symbols at the error locations the error magnitudes corresponding to the error locations on the basis of the contents stored in the computed result storing circuit 25, and outputs the corrected results. On the other hand, if it is found uncorrectable, the received word R is output without correction with an error detection flag.

Thus, the present embodiment 16 has an advantage of completing the erasure and error correction of a doubly extended RS code by a single Berlekamp-Massey algorithm computation, and of reducing the cost because the error correcting apparatus of the doubly extended RS code in accordance with the present invention can be constructed by a minor improvement of the conventional error correcting apparatus of the doubly extended RS code.

EMBODIMENT 17

Although the foregoing embodiments 13–16 describe the error correction of the doubly extended RS code using the Berlekamp-Massey algorithm, the Euclidean algorithm can also be applied by preestimating the number of errors for a doubly extended RS code with a low correction capability. Such an embodiment 17 in accordance with the present invention will now be described using as an example a doubly extended RS code on the Galois field GF(16) with a code length of 17, an information symbol number of 11, and a minimum distance of seven. The primitive polynomial and the parity matrix are assumed to be the same as those of the embodiment 13. It is further assumed that the received word $R=(r_{15}, r_{14}, \ldots, r_0, r_{-1})$ has been received in the description below.

First, the syndromes $S_0, S_1, \ldots, S_4, S_5$ are computed. Then, a matrix A given by the following equation (171) is formed, and its determinant det is computed.

$$A = \begin{bmatrix} S_0 & S_1 & S_2 \\ S_1 & S_2 & S_3 \\ S_2 & S_3 & S_4 \end{bmatrix} \tag{171}$$

If three errors have occurred in the interior code and the first extended component, the determinant det is nonzero. Let us assume that errors $e_i$, $e_j$ and $e_k$ have occurred at the locations i, j and k, where $0 \leq i, j, k \leq 14$, in which case the syndromes are given by the following equation (172).

$$S_m = e_i \alpha^{im} + e_j \alpha^{jm} + e_k \alpha^{km} \quad (m=0, 1, 2, \ldots, 4, 5) \tag{172}$$

Therefore, the matrix A given by the equation (171) can be converted to the following equation (173).

$$A = \begin{bmatrix} 1 & 1 & 1 \\ \alpha^i & \alpha^j & \alpha^k \\ \alpha^{2i} & \alpha^{2j} & \alpha^{2k} \end{bmatrix} \begin{bmatrix} e_i & 0 & 0 \\ 0 & e_j & 0 \\ 0 & 0 & e_k \end{bmatrix} \begin{bmatrix} 1 & \alpha^i & \alpha^{2i} \\ 1 & \alpha^j & \alpha^{2j} \\ 1 & \alpha^k & \alpha^{2k} \end{bmatrix} \quad (173)$$

Among the matrices on the right-hand side of equation (173), the matrix in the middle is regular because it is a diagonal matrix, and the left and right matrices are also regular because they are a so-called Vandermonde matrix. Thus, the determinant det of the matrix A is nonzero.

Let us further assume that errors $e_{-1}$, $e_i$ and $e_j$ have occurred, for example, in the first extended component and the locations i and j, respectively, where $0 \leq i, j \leq 14$. In this case, the syndromes are given by the following equations (174) and (175).

$$S_0 = e_i + e_j + e_{-1} \quad (174)$$

$$S_m = e_i \alpha^{im} + e_j \alpha^{jm} \quad (m=1, 2, \ldots, 4, 5) \quad (175)$$

Therefore, the matrix A given by the equation (171) can be converted to the following equation (176).

$$A = \begin{bmatrix} 1 & 1 & 1 \\ \alpha^i & \alpha^j & 0 \\ \alpha^{2i} & \alpha^{2j} & 0 \end{bmatrix} \begin{bmatrix} e_i & 0 & 0 \\ 0 & e_j & 0 \\ 0 & 0 & e_k \end{bmatrix} \begin{bmatrix} 1 & \alpha^i & \alpha^{2i} \\ 1 & \alpha^j & \alpha^{2j} \\ 1 & 0 & 0 \end{bmatrix} \quad (176)$$

Since the entire matrices on the right-hand side of equation (176) are regular, the determinant det of the matrix A is nonzero. In contrast, if two or less error have occurred in the interior code and the first extended component, the determinant det is zero. For example, if $e_k = 0$ in equation (173), the regular matrix in the middle of equation (173) becomes zero, and hence the matrix A is non-regular.

Figure 28:
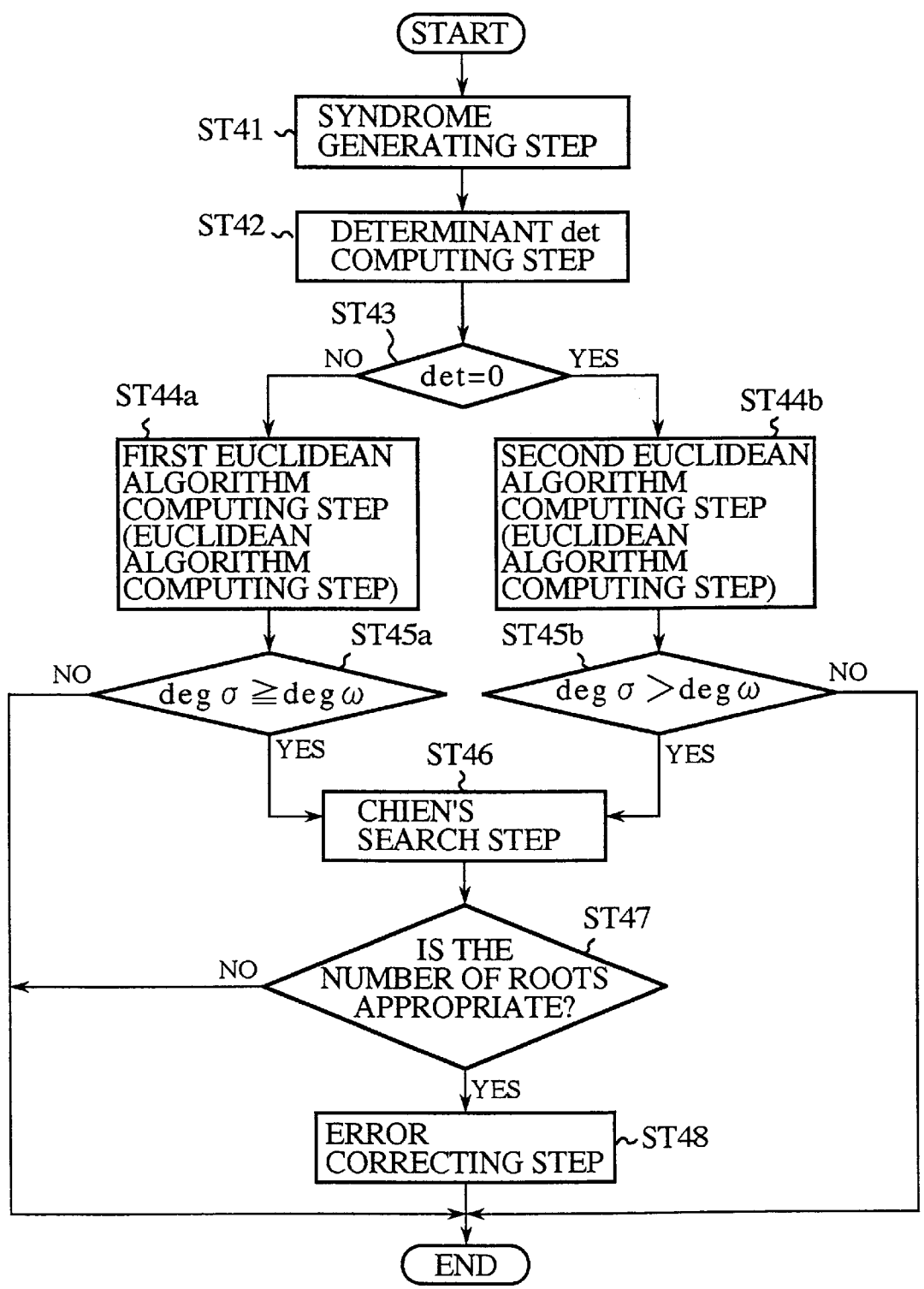
FIG. 28 is a flowchart illustrating a processing -procedure of an embodiment 17 of an error correcting method of a doubly extended RS code in accordance with the present invention.

Thus, the error number can be estimated using the determinant det of the matrix A. FIG. 28 is a flowchart illustrating the error correcting method of the doubly extended RS code associated with the embodiment 17, which carries out using the Euclidean algorithm the error correction of the doubly extended RS code by estimating the error number from the determinant. In FIG. 28, ST41 designates a syndrome generating step of computing from a received word its syndromes; and ST42 designates a determinant det computing step ST42 of computing the determinant of the matrix formed using the syndromes computed in the syndrome generating step ST41. ST43 designates a decision step of making a decision whether the determinant computed in the determinant det computing step ST42 is zero or not.

Figure 31:
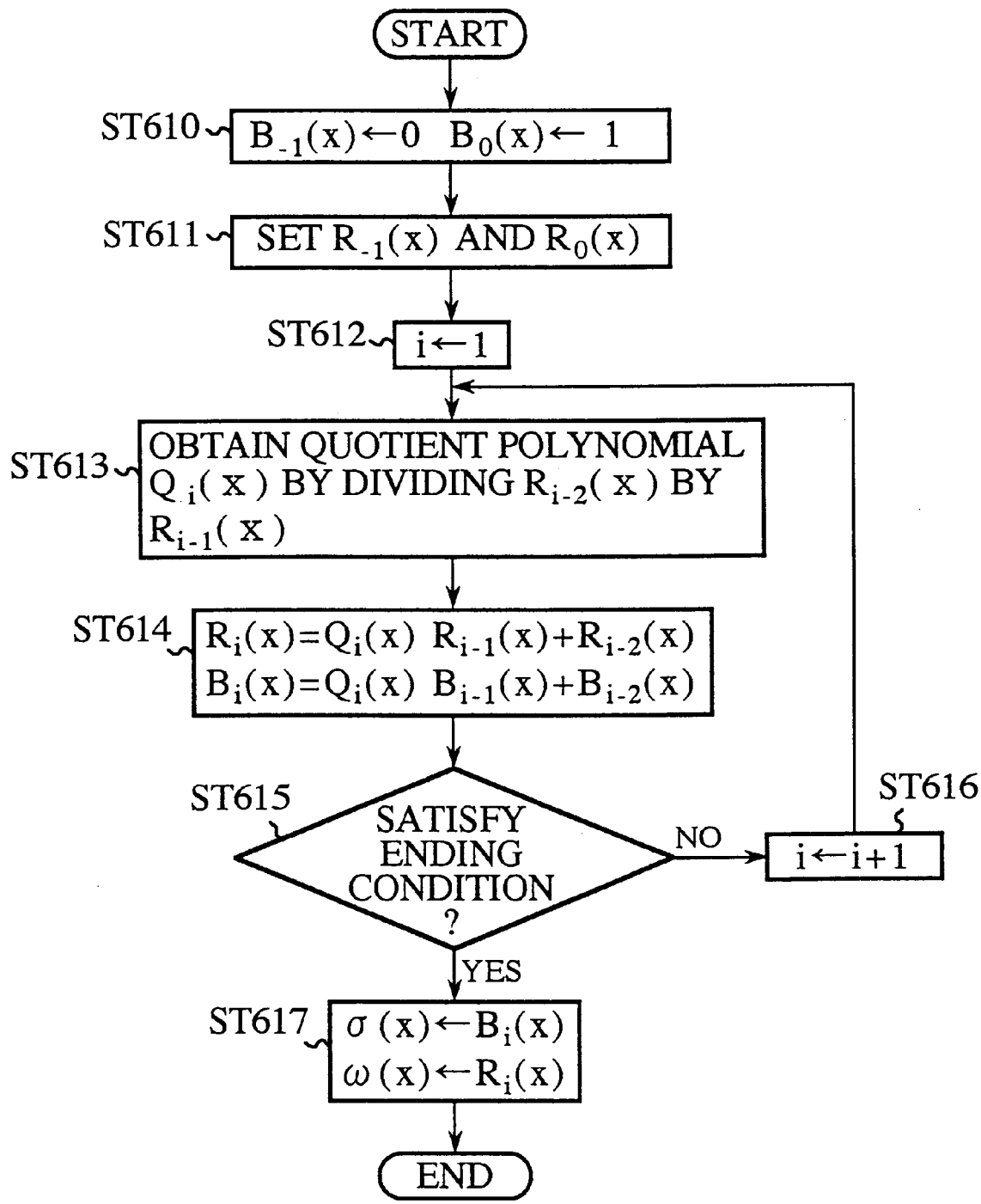
FIG. 31 is a flowchart illustrating details of a processing procedure of a Euclidean algorithm computing step in the conventional error correcting method of a singly extended RS code.
Figure 32:
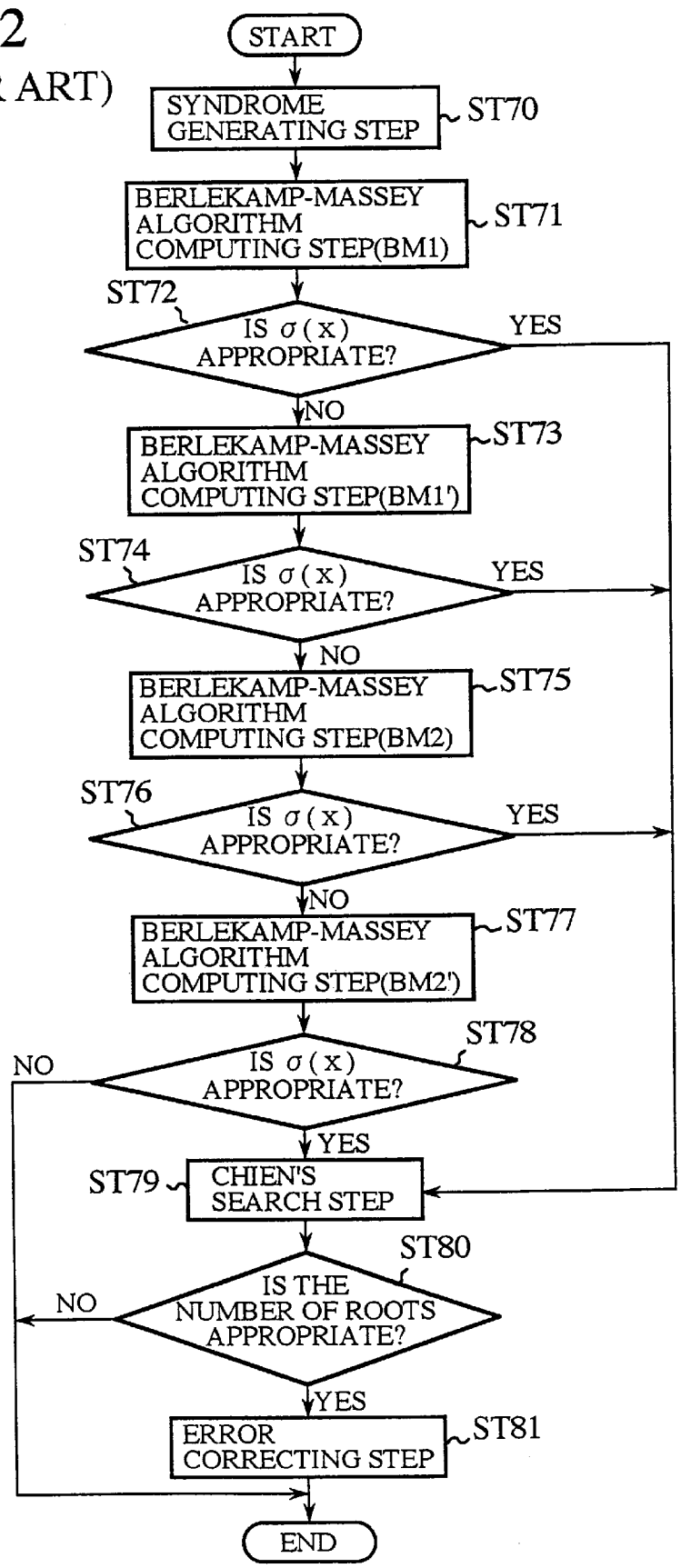
FIG. 32 is a flowchart illustrating a processing procedure of a conventional error correcting method of a doubly extended RS code.
Figure 33:
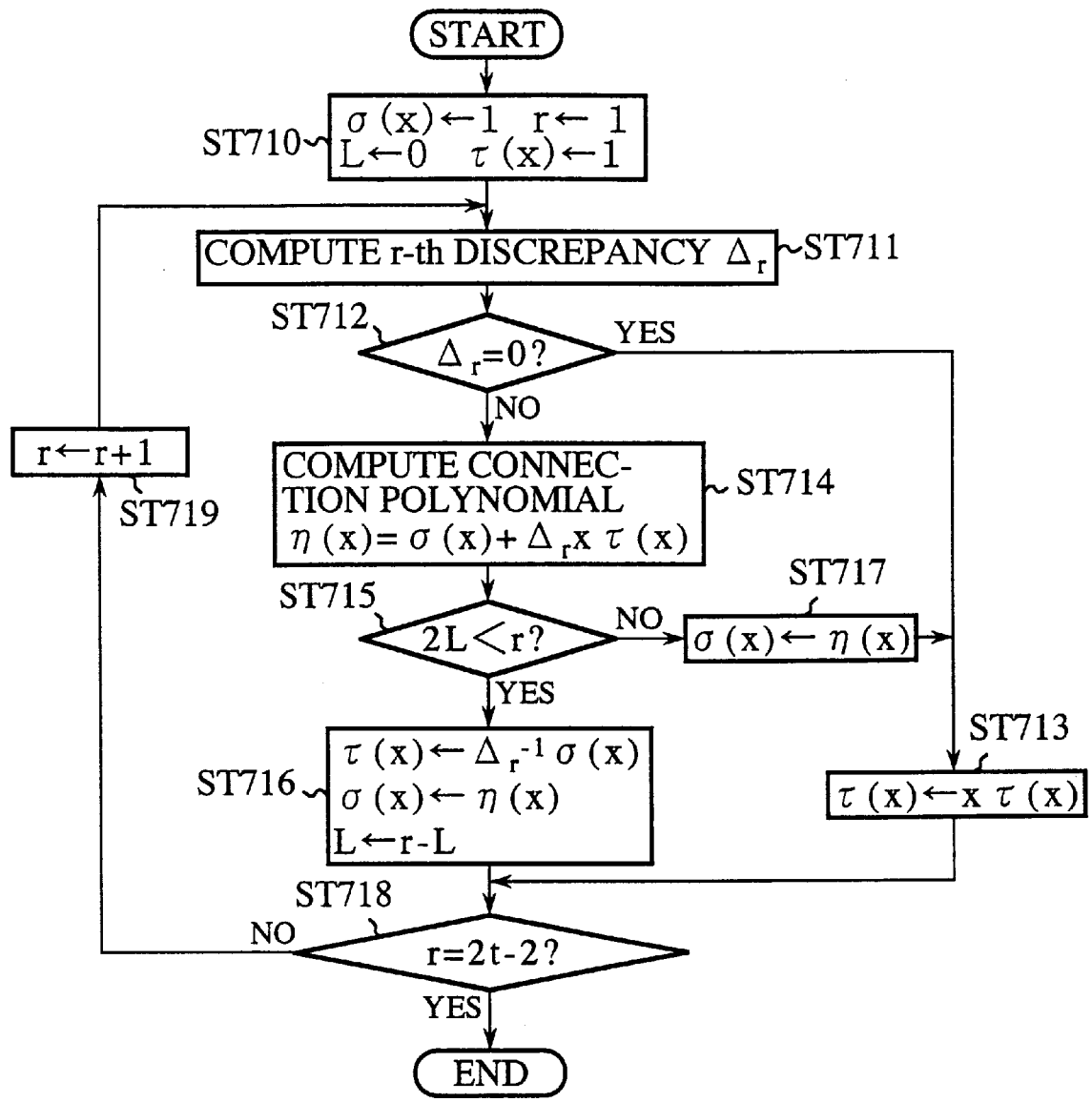
FIG. 33 is a flowchart illustrating details of a processing procedure of a Berlekamp-Massey algorithm computing step in the conventional error correcting method of a doubly extended RS code.

ST44a and ST44b each designate a Euclidean algorithm computing step of computing the error-locator polynomial and error-value polynomial by the Euclidean algorithm after setting initial values and ending condition for computing the error-locator polynomial and error-value polynomial: ST44a is performed when a decision is made in the decision step ST43 that the determinant is nonzero, whereas ST44b is performed when a decision is made in the decision step ST43 that the determinant is zero. The operation procedures of the Euclidean algorithm in the Euclidean algorithm computing steps ST44a and ST44b are analogous to the conventional one as illustrated in FIG. 31. The steps ST44a and ST44b are called from now on a first Euclidean algorithm computing step and a second Euclidean algorithm computing step, respectively, to distinguish them.

ST45a designates a first comparing step of comparing the degree of the error-locator polynomial with that of the error-value polynomial computed in the first Euclidean algorithm computing step ST44a, and ST45b designates a second comparing step of comparing the degree of the error-locator polynomial with that of the error-value polynomial computed in the second Euclidean algorithm computing step ST44b.

ST46 designates a Chien's search step of computing the roots of the error-locator polynomial (error locations) and error values by performing Chien's search on the error-locator polynomial and error-value polynomial when a decision is made in the first comparing step ST45a that the degree of the error-value polynomial is equal to or less than that of the error-locator polynomial, or in the second comparing step ST45b that the degree of the error-value polynomial is less than that of the error-locator polynomial. ST47 designates a test step of making a decision whether the number of roots of the error-locator polynomial(error locations) obtained in the Chien's search step ST46 is appropriate or not; and ST48 designates an error correcting step of correcting errors of the incoming received word R on the basis of the error locations and error values obtained in the Chien's search step ST46, if the number of the roots is found to be appropriate as a result of the decision in the test step ST47.

Next, the operation of the present embodiment 17 will be described.

First, the syndromes $S_0, S_1, \ldots, S_4, S_5$ are computed from the incoming received word R in the syndrome generating step ST41. If the entire syndromes generated in the syndrome generating step ST41 are zero, it is estimated that there is no error. If there is some syndrome of nonzero, the determinant det of the matrix A is computed.

Subsequently, a decision is made in the decision step ST43 whether the determinant det is zero or not. If the determinant det is nonzero, it is estimated that errors have occurred in three symbols in the code, and the processing proceeds to the first Euclidean algorithm computing step ST44a, in which the Euclidean algorithm is carried out using the syndromes $S_0, S_1, \ldots, S_4$, and $S_5$. Specifically, the syndrome polynomial is formed with setting as its constant term the syndrome $S_0$ including the error information on the first extended component, and the initial values of the Euclidean algorithm are set as the following equations (177) and (178).

$$R_{-1}(x) = x^6 \quad (177)$$

$$R_0(x) = S_0 + S_1 x + S_2 x^2 + S_3 x^3 + S_4 x^4 + S_5 x^5 \quad (178)$$

Then, sequentially generating $R_i$ while incrementing i as illustrated in FIG. 31, the first Euclidean algorithm computing step ST44a is completed when the $R_i$ comes to satisfy the following expression (179).

$$\deg R_i < 3 \quad (179)$$

After the first Euclidean algorithm computing step ST44a has completed, the degree of the error-locator polynomial $\sigma(x)$ is compared with that of the error-value polynomial $\omega(x)$ in the first comparing step ST45a to make a decision whether the inequality given by the following expression (180) is satisfied or not.

$$\deg \sigma \geq \deg \omega \quad (180)$$

As a result, if the condition of expression (180) is satisfied, the processing proceeds to the Chien's search step ST46. If the equal sign holds in expression (180), it is estimated that an error has occurred in the first extended component. In the Chien's search step ST46, the Chien's search is performed on the error-locator polynomial σ(x) and error-value polynomial ω(x) to compute the roots of the error-locator polynomial σ(x) (error locations) and the error values. The error values can be computed by equation (123). On the contrary, if the condition is unsatisfied, a decision is made that the errors are uncorrectable, and the processing is stopped at the error detection.

If the determinant det is found to be zero as the result of the decision in the decision step ST43, it is estimated that errors have occurred in two or less symbols in the interior code, and the processing proceeds to the second Euclidean algorithm computing step ST44b, in which the Euclidean algorithm is carried out using the syndromes $S_0, S_1, \ldots, S_4$, and $S_5$. In this case, the initial values of the Euclidean algorithm are set as the following equations (181) and (182).

$$R_{-1}(x)=x^4 \quad (181)$$

$$R_0(x)=S_1+S_2 x+S_3 x^2+S_4 x^3 \quad (182)$$

Then, sequentially generating $R_i$ while incrementing i as illustrated in FIG. 31, the second Euclidean algorithm computing step ST44b is completed when the $R_i$ comes to satisfy the following expression (183).

$$degR_i<2 \quad (183)$$

After the second Euclidean algorithm computing step ST44b has completed, the degree of the error-locator polynomial σ(x) is compared with that of the error-value polynomial ω(x) in the second comparing step ST45b to make a decision whether the inequality given by the following expression (184) is satisfied or not.

$$degσ>degω \quad (184)$$

As a result, if the condition of expression (184) is satisfied, the processing proceeds to the Chien's search step ST46. In the Chien's search step ST46, the Chien's search is performed on the error-locator polynomial σ(x) and error-value polynomial ω(x) to compute the roots of the error-locator polynomial σ(x) (error locations) and the error values. On the contrary, if the condition is unsatisfied, a decision is made that the errors are uncorrectable, and the processing is stopped at the error detection.

Once the error locations and error values have been computed in the Chien's search step ST46, a decision is made in the test step ST47 whether the number of the obtained roots is appropriate or not, that is, whether the number of the error locations equals the degree of the error-locator polynomial σ(x) or not. If they agree, the errors of the received word are corrected in the error correcting step ST48 by subtracting the error values from the symbols at the corresponding error locations, and the corrected received word is output. If the number of the error locations differs from the degree of the error-locator polynomial σ(x), the received word is output without correction together with the error detection flags, with an indication that the errors are uncorrectable.

Thus, the present embodiment 17 has advantages that it can compute the error-locator polynomial and error-value polynomial by a single Euclidean algorithm computation by preestimating the error number using the syndromes for the doubly extended RS code with low correction capability, and that no extra computation is needed for obtaining the error-locator polynomial because it is obtained as a by-product of the Euclidean algorithm computation.

EMBODIMENT 18

Figure 29:
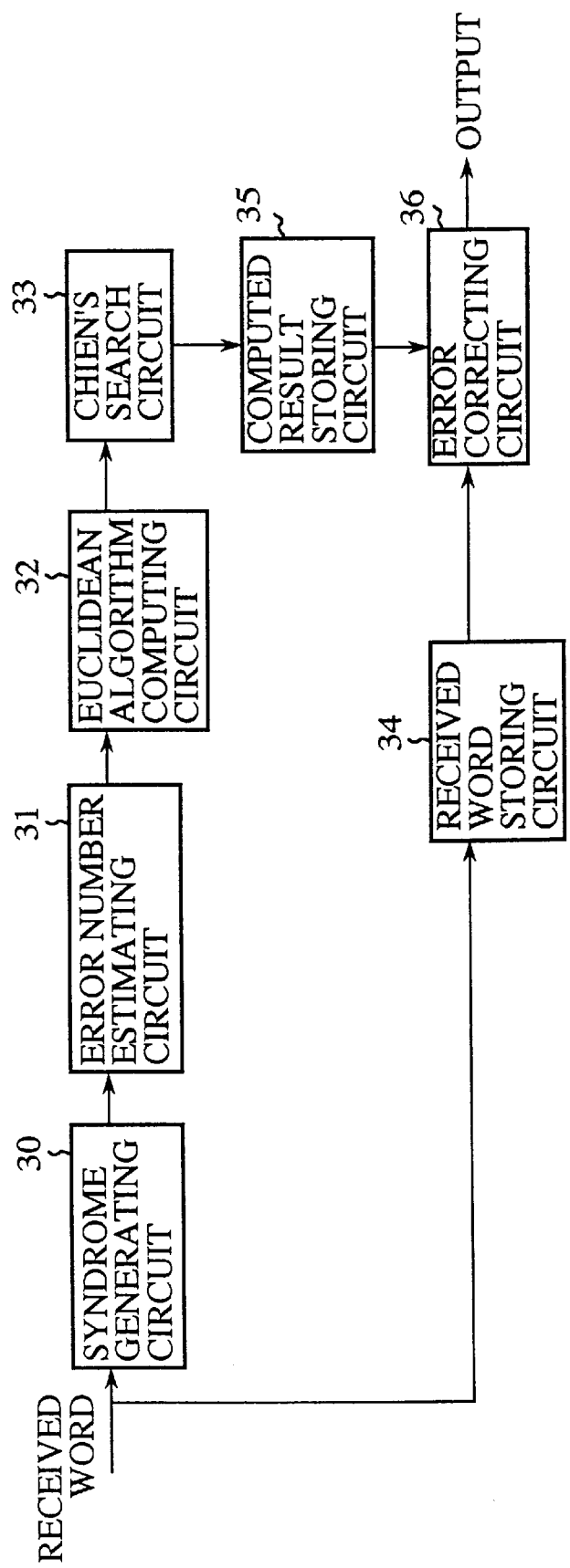
FIG. 29 is a block diagram showing an embodiment 18 of an error correcting decoding apparatus of a doubly extended RS code in accordance with the present invention.
Figure 30:
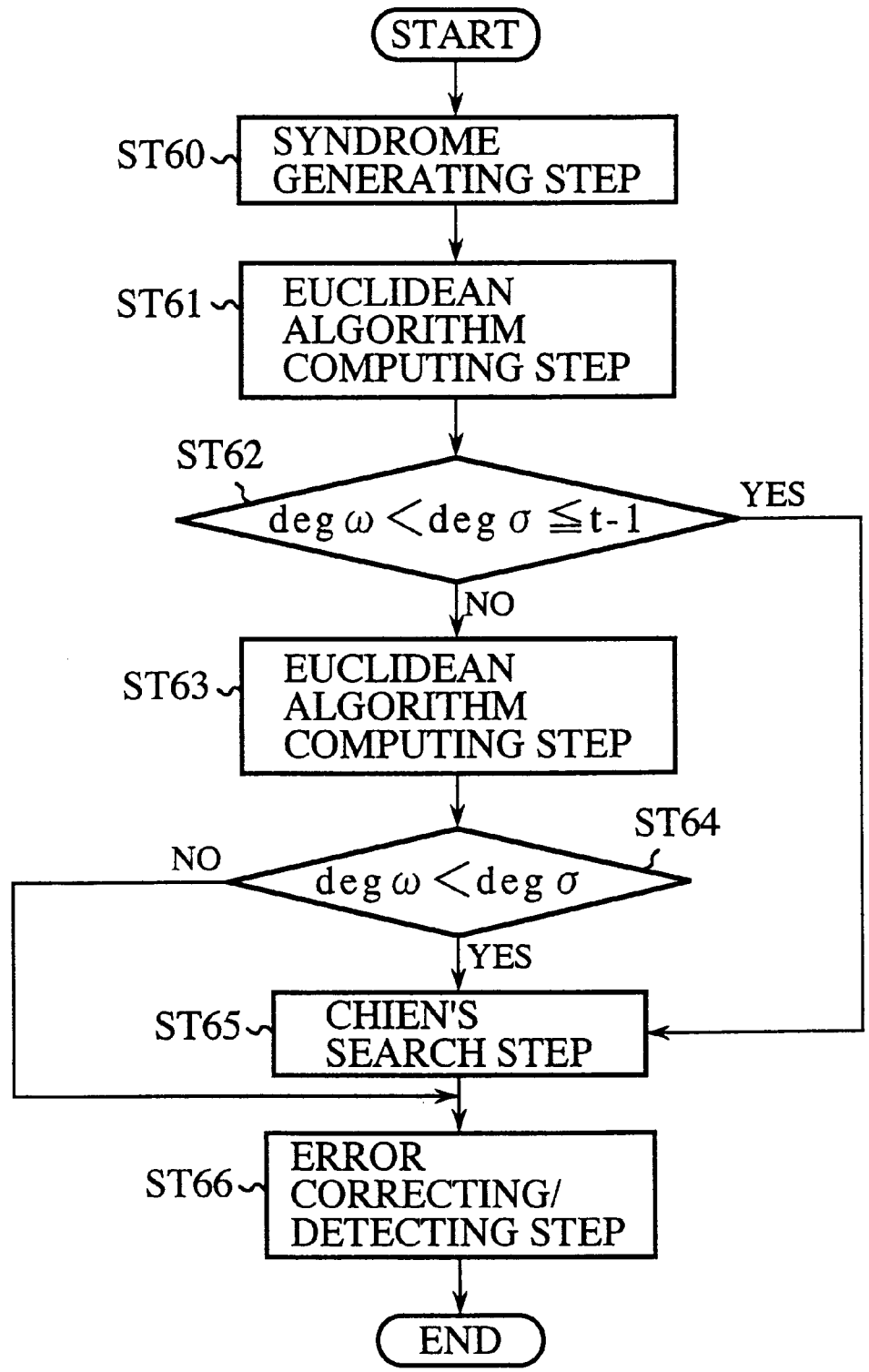
FIG. 30 is a flowchart illustrating a processing procedure of a conventional error correcting method of a singly extended RS code.

Although the foregoing embodiment 17 describes the error correcting method of the doubly extended RS code using the Euclidean algorithm, it is possible to implement an error correcting apparatus based on the method. FIG. 29 is a block diagram showing an error correcting apparatus of the doubly extended RS code associated with an embodiment 18 in accordance with the present invention. In FIG. 29, the reference numeral 30 designates a syndrome generating circuit for generating syndromes from a received word; and 31 designates an error number estimating circuit for forming the matrix of the syndromes computed by the syndrome generating circuit 30, and for estimating the error number by computing its determinant. The reference numeral 32 designates a Euclidean algorithm computing circuit for computing the error-locator polynomial and error-value polynomial using the Euclidean algorithm after setting their initial values and ending condition for computing the error-locator polynomial and error-value polynomial in accordance with the error number estimated by the error number estimating circuit 31.

The reference numeral 33 designates a Chien's search circuit for computing the error locations and error values by performing the Chien's search on the error-locator polynomial and error-value polynomial computed by the Euclidean algorithm computing circuit 32. The reference numeral 34 designates a received word storing circuit for storing the incoming received words; and 35 designates a computed result storing circuit for storing the error locations and error values computed by the Chien's search circuit 33. The reference numeral 36 designates an error correcting circuit for correcting the received words stored in the received word storing circuit 34 on the basis of the error locations and error values stored in the computed result storing circuit 35.

Next, the operation of the present embodiment 18 will be described.

The following description is provided taking as an example a doubly extended RS code on the Galois field GF(16) with a code length of 17, an information symbol number of 11, and a minimum distance of seven. The primitive polynomial and the parity matrix are assumed to be the same as those of the embodiment 17.

An incoming received word is delivered to the syndrome generating circuit 30 and received word storing circuit 34. Accepting the received word, the syndrome generating circuit 30 computes the syndromes $S=(S_0, S_1, \ldots, S_4, S_5)$ and delivers it to the error number estimating circuit 31. The received word storing circuit 34 stores the incoming received word.

The error number estimating circuit 31 computes the determinant det of the matrix A defined by equation (171) using all the syndromes except for the syndrome $S_5$ in the syndrome S fed from the syndrome generating circuit 30, the syndrome $S_5$ having an effect on the second extended component. The error number estimating circuit 31 makes an estimate that errors have occurred in two or less symbols if the det is zero, and that errors have occurred in three symbols if it is nonzero.

If an estimation is made that errors have occurred in three symbols, the Euclidean algorithm computing circuit 32 computes the error-locator polynomial σ(x) and error-value polynomial ω(x) by the Euclidean algorithm computation after setting the initial values by equations (177) and (178) and the ending condition by expression (179). Then, the degree of the error-locator polynomial σ(x) is compared with that of the error-value polynomial ω(x), and if the condition given, by expression (180) does not hold, the received word is output without correction with an indication of error detection. On the contrary, if the condition given by expression (180) holds, the Chien's search circuit 33 carries out the Chien's search on the error-locator polynomial σ(x) and error-value polynomial ω(x), computes the error locations and error values, and has the computed result storing circuit 35 store them.

If an estimation is made that errors have occurred in two or less symbols, the Euclidean algorithm computing circuit 32 computes the error-locator polynomial σ(x) and error-value polynomial ω(x) by the Euclidean algorithm computation after setting the initial values by equations (181) and (182) and the ending condition by expression (183). Then, the degree of the error-locator polynomial σ(x) is compared with that of the error-value polynomial ω(x), and if the condition given by expression (184) does not hold, the received word is output without correction with an indication of error detection. On the contrary, if the condition given by expression (184) holds, the Chien's search circuit 33 carries out the Chien's search on the error-locator polynomial σ(x) and error-value polynomial ω(x), computes the error locations and error values, and has the computed result storing circuit 35 store them.

If the error number equals the degree of the error-locator polynomial detected by the Chien's search circuit 33, the error correcting circuit 36 corrects the errors of the symbols at the error locations by subtracting from the symbols the corresponding error values, and outputs the corrected received word. On the other hand, if the error number disagree with the degree of the error-locator polynomial, the received word is output without correction with an indication of the error detection.

Thus, the present embodiment 18 has advantages that it can compute the error-locator polynomial and error-value polynomial by a single Euclidean algorithm computation by pre-estimating the error number using the syndromes for the doubly extended RS code with low correction capability, and that no extra computation is needed for obtaining the error-locator polynomial because it is obtained as a by-product of the Euclidean algorithm computation.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. An error correcting decoding apparatus of an extended Reed-Solomon code comprising:

syndrome generating means for computing from an incoming received word its syndrome;

received word memory means for storing said received word;

error number estimating means for estimating a number of errors having occurred in said received word from the syndrome computed by the syndrome generating means;

Euclidean algorithm computing means for computing an error-locator polynomial and an error-value polynomial by Euclidean algorithm after setting initial values and an ending condition for computing the error-locator polynomial and the error-value polynomial in accordance with the number of errors estimated by said error number estimating means;

Chien's search means for computing error locations and error values based on the error-locator polynomial and the error-value polynomial computed by said Euclidean algorithm computing means; and error correcting means for correcting errors of said received word stored in said received word memory means in response to a result computed by said Chien's search means, wherein said error number estimating means comprises a memory, multipliers and adders on a Galois field, and makes a decision, about an extended Reed-Solomon code with a minimum distance of d, from values of the syndrome of said received word, which is computed by said syndrome generating means, whether any error is present or not, and if any error is present, whether a number of the errors is less than $((d-1)/2)$ or equal to $((d-1)/2)$, and wherein said Euclidean algorithm computing means computes the error-locator polynomial and the error-value polynomial by Euclidean algorithm after setting the initial values and the ending condition for computing the error-locator polynomial and the error-value polynomial depending on the number of errors whether it is less than $((d-1)/2)$ or equal to $((d-1)/2)$, when said error number estimating means makes a decision that the error is present.

2. The error correcting decoding apparatus of an extended Reed-Solomon code as claimed in claim 1, wherein said error correcting decoding apparatus comprises a computer including multipliers and adders on a Galois field, and wherein said Chien's search means comprises syndrome amending means for computing an error value in an extended component by amending values of the syndrome of said received word in accordance with the error locations and error values computed from the error-locator polynomial and the error-value polynomial which are computed by said Euclidean algorithm computing means.

3. An error correcting decoding apparatus of an extended Reed-Solomon code comprising:

syndrome generating means for computing from an incoming received word its syndrome;

received word memory means for storing said received word;

error number estimating means for estimating a number of errors having occurred in said received word from the syndrome computed by the syndrome generating means;

Euclidean algorithm computing means for computing an error-locator polynomial and an error-value polynomial by Euclidean algorithm after setting initial values and an ending condition for computing the error-locator polynomial and the error-value polynomial in accordance with the number of errors estimated by said error number estimating means;

Chien's search means for computing error locations and error values based on the error-locator polynomial and the error-value polynomial computed by said Euclidean algorithm computing means; and error correcting means for correcting errors of said received word stored in said received word memory means in response to a result computed by said Chien's search means, wherein said error number estimating means makes a decision, about an extended Reed-Solomon code with a minimum distance of d, from values of the syndrome of said received word, which is computed by said syndrome generating means, whether any error is present or not, and if any error is present, whether a number of the errors is less than $((d-1)/2)$, equal to $((d-1)/2)$, or greater than $((d-1)/2)$, wherein said Euclidean algorithm computing means skips, if said error number estimating means makes a decision that the number of errors is greater than $((d-1)/2)$, the computing of the error-locator polynomial and the error-value polynomial by the Euclidean algorithm, wherein said Chien's search means skips, if said error number estimating means makes a decision that the number of errors is greater than $((d-1)/2)$, the computing of the error locations and error values the Chien's search, and wherein said error correcting means outputs said received word stored in said received word memory means without correction, if said error number estimating means makes a decision that the number of errors is greater than $((d-1)/2)$.

4. An error correcting apparatus of a doubly extended Reed-Solomon code comprising:

syndrome generating means for computing from an incoming received word its syndromes;

received word memory means for storing said received word;

Berlekamp-Massey algorithm computing means for sequentially computing an error-locator polynomial by performing Berlekamp-Massey algorithm using the syndromes generated by said syndrome generating means while controlling whether to use a syndrome having error information about a doubly extended component in accordance with a length of a formal shift register;

Chien's search means for computing error locations by performing Chien's search on the error-locator polynomial computed by said Berlekamp-Massey algorithm computing means;

error value generating means for computing, if a number of error locations computed by said Chien's search means is appropriate, error values using the syndrome polynomial generated from the syndromes computed by said syndrome generating means; and error correcting means for correcting errors of said received word stored in said received word memory means in response to the error locations computed by said Chien's search means and the error values computed by said error value generating means.

5. The error correcting apparatus of a doubly extended Reed-Solomon code as claimed in claim 4, further comprising:

an erasure-locator coefficient generating means for generating erasure-locator coefficients from an erasure flag associated with said received word; and an erasure-locator polynomial generating means for generating an erasure-locator polynomial from the erasure-locator coefficients generated by said erasure-locator coefficient generating means, wherein said Berlekamp-Massey algorithm computing means sequentially computes the error-locator polynomial by performing Berlekamp-Massey algorithm using as its initial values the erasure-locator polynomial computed by said erasure-locator polynomial generating means.

* * * * *